(12) United States Patent
Seo et al.

(10) Patent No.: US 10,706,911 B1
(45) Date of Patent: Jul. 7, 2020

(54) SENSE AMPLIFIER FOR SENSING MULTI-LEVEL CELL AND MEMORY DEVICE INCLUDING THE SENSE AMPLIFIER

(71) Applicant: Samsung Electronics Co., Ltd., Suwon-si, Gyeonggi-do (KR)

(72) Inventors: Young-Hun Seo, Hwaseong-si (KR); Kyung-Ryun Kim, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/156,052

(22) Filed: Oct. 10, 2018

(51) Int. Cl.
*G11C 7/00* (2006.01)
*G11C 11/4091* (2006.01)
*G11C 11/56* (2006.01)

(52) U.S. Cl.
CPC ........ *G11C 11/4091* (2013.01); *G11C 11/565* (2013.01)

(58) Field of Classification Search
CPC .................. G11C 11/4091; G11C 11/565
USPC ................................... 365/205, 207
See application file for complete search history.

(56) References Cited

U.S. PATENT DOCUMENTS

| | | |
|---|---|---|
| 5,283,761 A | 2/1994 | Gillingham |
| 5,293,563 A | 3/1994 | Ohta |
| 5,532,955 A | 7/1996 | Gillingham |
| 5,612,912 A | 3/1997 | Gillingham |
| 5,684,736 A | 11/1997 | Chan |
| 5,859,794 A | 1/1999 | Chan |
| 5,917,748 A * | 6/1999 | Chi ........ G11C 11/565 365/149 |
| 5,978,255 A | 11/1999 | Naritake |
| 5,995,403 A | 11/1999 | Naritake |
| 6,005,799 A * | 12/1999 | Rao ........ G11C 11/565 365/149 |
| 6,034,885 A | 3/2000 | Chan |
| 6,097,620 A | 8/2000 | Naritake |
| 6,137,739 A | 10/2000 | Kim |
| 6,151,237 A | 11/2000 | Naritake |
| 6,151,260 A | 11/2000 | Birk |
| RE37,072 E | 2/2001 | Gillingham |
| 6,310,845 B1 | 10/2001 | Kanenaga et al. |
| 6,373,765 B1 | 4/2002 | Birk |
| 6,373,766 B1 | 4/2002 | Birk |
| 6,556,469 B2 | 4/2003 | Birk et al. |
| 6,625,075 B2 | 9/2003 | Birk |
| 6,917,551 B2 * | 7/2005 | Jeong ........ G11C 11/4091 365/149 |
| 7,106,626 B2 | 9/2006 | Goldman et al. |
| 7,567,452 B2 | 7/2009 | Song et al. |

(Continued)

*Primary Examiner* — Viet Q Nguyen

(74) *Attorney, Agent, or Firm* — Myers Bigel, P.A.

(57) ABSTRACT

A sense amplifier includes a first sense amplification circuit electrically connected between a bit line, to which a multi-bit memory cell is also connected, and a complementary bit line. The first sense amplification circuit is configured to sense a least significant bit (LSB) of 2-bit data in the memory cell and latch the LSB in a first sensing bit line pair. A second sense amplification circuit is provided, which is configured to sense a most significant bit (MSB) of the 2-bit data and latch the MSB in a second sensing bit line pair. A switching circuit is provided, which is configured to selectively connect between bit lines of the first sensing bit line pair and bit lines of the second sensing bit line pair.

20 Claims, 35 Drawing Sheets

(56) References Cited

U.S. PATENT DOCUMENTS

| | | | | |
|---|---|---|---|---|
| 7,623,376 B2* | 11/2009 | Lee | ............... | G11C 11/5628 |
| | | | | 365/185.03 |
| 7,773,419 B2* | 8/2010 | Nam | ............... | G11C 16/26 |
| | | | | 365/185.03 |
| 8,773,925 B2 | 7/2014 | Koya et al. | | |
| 9,478,277 B1 | 10/2016 | Liu | | |
| 9,502,137 B2* | 11/2016 | Yoon | ............... | G06F 11/1068 |
| 9,666,292 B2* | 5/2017 | Kim | ............... | G11C 16/26 |
| 2002/0053007 A1* | 5/2002 | Birk | ............... | G11C 11/565 |
| | | | | 711/149 |
| 2004/0032785 A1 | 2/2004 | Birk | | |
| 2005/0179269 A1* | 8/2005 | Weiland | ............... | B60J 5/105 |
| | | | | 293/149 |
| 2007/0195619 A1* | 8/2007 | Rhie | ............... | G11C 7/18 |
| | | | | 365/200 |
| 2012/0314484 A1* | 12/2012 | Koya | ............... | G11C 7/16 |
| | | | | 365/149 |
| 2015/0357047 A1* | 12/2015 | Tiwari | ............... | G06F 9/30029 |
| | | | | 714/719 |
| 2017/0365308 A1* | 12/2017 | Cha | ............... | G11C 7/062 |
| 2019/0102359 A1* | 4/2019 | Knag | ............... | G11C 11/56 |
| 2019/0189192 A1* | 6/2019 | Kim | ............... | G11C 7/106 |

* cited by examiner

Pre-Charging Operation

Offset Canceling Operation

US 10,706,911 B1

SENSE AMPLIFIER FOR SENSING MULTI-LEVEL CELL AND MEMORY DEVICE INCLUDING THE SENSE AMPLIFIER

BACKGROUND

The inventive concept relates to a semiconductor memory device, and more particularly, to a sense amplifier for sensing a cell voltage stored in a memory cell as multi-bit data, and a memory device including the sense amplifier.

A dynamic random access memory (DRAM) operates by writing and reading data via charges stored in a cell capacitor of a memory cell. According to the increased demand for higher capacity of DRAMs, development of multi-level cells storing two or more bits of data, that is, multi-bit data, in a single DRAM cell, is required. Implementation of a multi-level cell of a DRAM requires a sense amplifier capable of sensing a charge stored in a cell capacitor as multi-bit data.

SUMMARY

The inventive concept provides a sense amplifier sensing a cell voltage of a memory cell as multi-bit data and a sensing method thereof, and a memory device including the sense amplifier.

According to an aspect of the inventive concept, there is provided a sense amplifier sensing a charge stored in a memory cell as multi-bit data in a 2-bit combination. The sense amplifier includes a first sense amplification circuit connected between a bit line, to which the memory cell is connected, and a complementary bit line. The first sense amplification circuit is configured to sense least significant bit (LSB) data in the 2-bit combination to latch the LSB data in a first sensing bit line pair. A second sense amplification circuit is also provided, which is configured to sense most significant bit (MSB) data in the 2-bit combination to latch the MSB data in a second sensing bit line pair. A switching circuit is provided, which is configured to selectively connect between bit lines of the first sensing bit line pair and bit lines of the second sensing bit line pair.

According to another aspect of the inventive concept, there is provided a method of sensing a charge stored in a memory cell as multi-bit data in a 2-bit combination. This method includes: (i) sensing most significant bit (MSB) data in the 2-bit combination to latch the MSB data in a first sensing bit line pair, and (ii) sensing least significant bit (LSB) data in the 2-bit combination to latch the LSB data in a second sensing bit line pair. The MSB data is sensed through a first charge sharing operation occurring between a charge stored in the memory cell and a charge stored in the bit line, whereas the LSB data is sensed through a second charge sharing operation including charge sharing between a charge stored in the bit line and a charge stored in the first complementary sensing bit line and charge sharing between a charge stored in a complementary bit line and a charge stored in a first sensing bit line.

According to another aspect of the inventive concept, there is provided a memory device including a memory cell storing a cell voltage represented as multi-bit data in a 2-bit combination, and a sense amplifier connected between a bit line, to which the memory cell is connected, and a complementary bit line. The sense amplifier, which is configured to sense the cell voltage as most significant bit (MSB) data and least significant bit (LSB) data in the 2-bit combination, includes: (i) a first sense amplification circuit, which is configured to sense the LSB data to latch the LSB data in a first sensing bit line pair, and (ii) a second sense amplification circuit configured to sense MSB data in the 2-bit combination to latch the MSB data in a second sensing bit line pair. A switching circuit is also provided, which is configured to selectively connect between bit lines of the first sensing bit line pair and between bit lines of the second sensing bit line pair.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Figure 1:
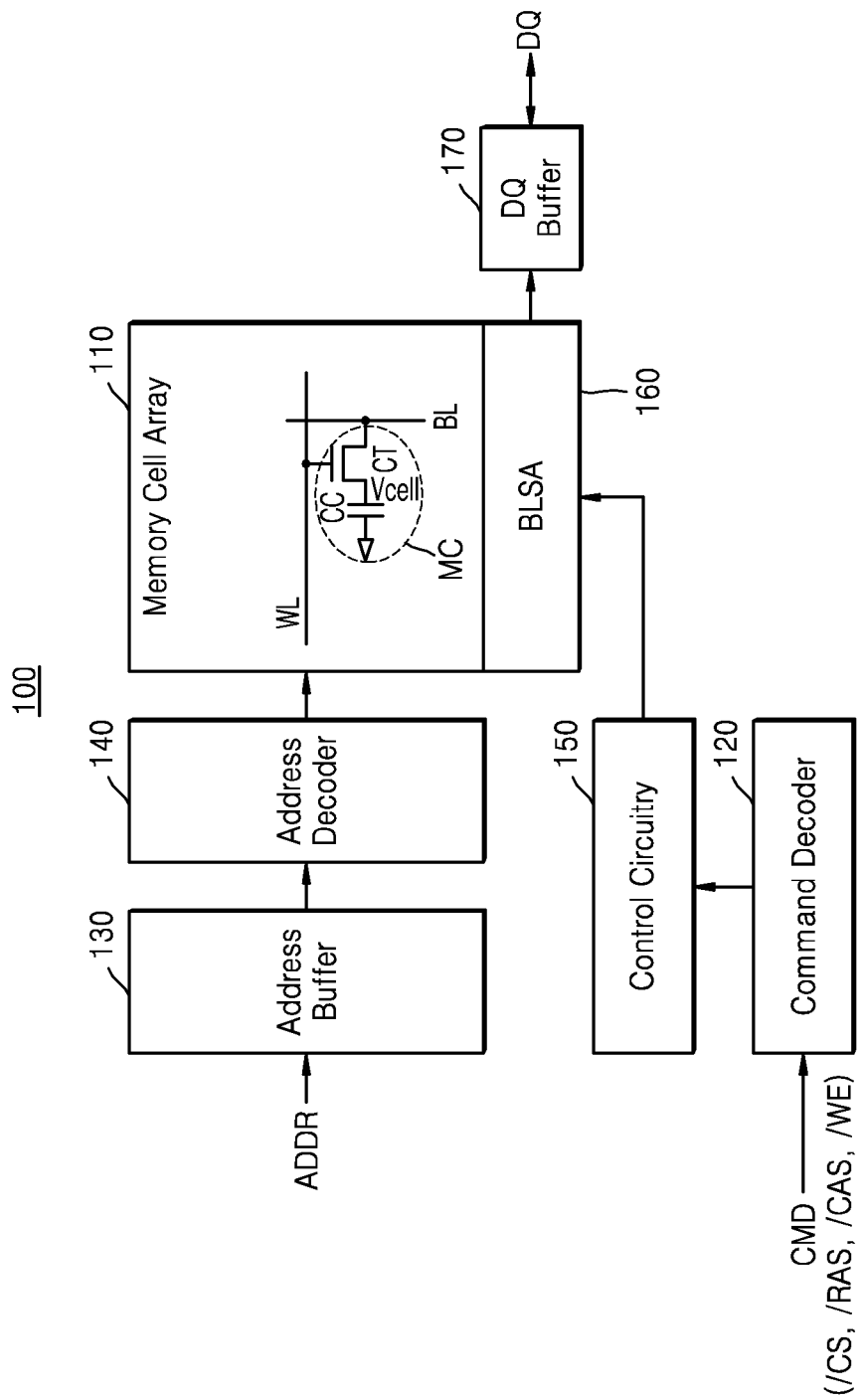
FIG. 1 is a diagram illustrating a memory device according to an embodiment of the inventive concept.

The present invention now will be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the scope of the invention to those skilled in the art. Like reference numerals refer to like elements throughout.

It will be understood that, although the terms first, second, third, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the present invention. As used herein, the singular forms "a," "an" and "the" are intended to include the plural forms as well, unless the context clearly indicates otherwise. It will be further understood that the terms "comprising", "including", "having" and variants thereof, when used in this specification, specify the presence of stated features, steps, operations, elements, and/or components, but do not preclude the presence or addition of one or more other features, steps, operations, elements, components, and/or groups thereof. In contrast, the term "consisting of" when used in this specification, specifies the stated features, steps, operations, elements, and/or components, and precludes additional features, steps, operations, elements and/or components.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a diagram illustrating a memory device 100 according to an embodiment of the inventive concept. Referring to FIG. 1, the memory device 100 may be implemented using a dynamic random access memory (DRAM) that senses a cell voltage Vcell stored in a memory cell MC, as multi-bit data. The memory device 100 may be referred to as a multi-level DRAM. A multi-level DRAM may be applied to a memory device such as a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3 SDRAM, or a DDR4 SDRAM.

The memory device 100 may input or output data DQ in response to a command CMD and an address ADDR received from a central processing unit (CPU) or a memory controller. The memory device 100 may include a memory cell array 110, a command decoder 120, an address buffer 130, an address decoder 140, a control circuit unit 150, a sense amplifier 160, and a data input/output buffer 170, as illustrated.

The memory cell array 110 includes a plurality of memory cells MCs provided as a two-dimensional matrix/array, which can be arranged in rows and columns. The memory cell array 110 includes a plurality of word lines WLs and a plurality of bit lines BLs connected to the memory cells MCs. Each of the memory cells MCs includes a cell transistor CT and a cell capacitor CC. A gate of the cell transistor CT is connected to one of the word lines WLs arranged in a row direction of the memory cell array 110. A first end of the cell transistor CT is connected to one of the bit lines BLs arranged in a column direction of the memory cell array 110. A second end of the cell transistor CT is connected to the cell capacitor CC. The cell capacitor CC may store charges of various capacities corresponding to multi-bit data. In addition, the cell capacitor CC may be refreshed to a charge amount corresponding to a capacity of each piece of multi-bit data, that is, a cell voltage Vcell.

The memory cell MC may store a cell voltage Vcell having a magnitude that specifies 2-bit data in the cell capacitor CC. A cell voltage Vcell may be represented by a 2-bit combination including the most significant bit (MSB) and the least significant bit (LSB). According to an embodiment, the memory cell MC may store multi-bit data of n or more bits (n is greater than 2).

The command decoder 120 determines an input command CMD with reference to a chip select signal /CS, a row address strobe signal /RAS, a column address strobe signal /CAS, a write enable signal /WE, applied from an external device. The command decoder 120 may generate control signals corresponding to the command CMD. The command CMD may include an active command, a read command, a write command, a precharge command or the like.

The address buffer 130 receives an address ADDR applied from an external device. The address ADDR includes a row address addressing a row of the memory cell array 110 and a column address addressing a column of the memory cell array 110. The address buffer 130 may transmit each of the row address and the column address to the address decoder 140.

The address decoder 140 may include a row decoder and a column decoder that select a word line WL and a bit line BL of a memory cell MC to be accessed in response to an input address ADDR. The row decoder may select a word line WL of a memory cell MC corresponding to a row address by decoding the row address. The column decoder may select a bit line BL of a memory cell MC corresponding to a column address by decoding the column address.

The control circuit unit 150 controls the sense amplifier 160 according to the control of the command decoder 120. When the sense amplifier 160 senses a cell voltage Vcell of a memory cell MC, the control circuit unit 150 may control an operation of the sense amplifier 160. The control circuit unit 150 may control the sense amplifier 160 such that the sense amplifier 160 sequentially performs a precharge operation, an offset cancelling operation, an MSB sensing and latching operation, an LSB sensing and latching operation, and a restoring operation. The control circuit unit 150 may selectively turn on or off elements of the sense amplifier 160 illustrated in FIG. 4, that is, first and second sense amplification circuits 410 and 420 and first through eighth switches SW1 through SW8 based on operation of the sense amplifier 160.

The sense amplifier 160 senses charges stored in a memory cell MC as multi-bit data in a 2-bit combination. The sense amplifier 160 senses least significant bit (LSB) data in a 2-bit combination and latches the LSB data in a first sensing bit line pair, and senses most significant bit (MSB) data in a 2-bit combination and latches the MSB data in a second sensing bit line pair, and rewrites a bit line voltage generated according to the sensed MSB and LSB data to a memory cell as a cell voltage. And, the data input/output buffer 170 may temporarily output write data input from the outside or output multi-bit data sensed by using the sense amplifier 160.

Figure 2:
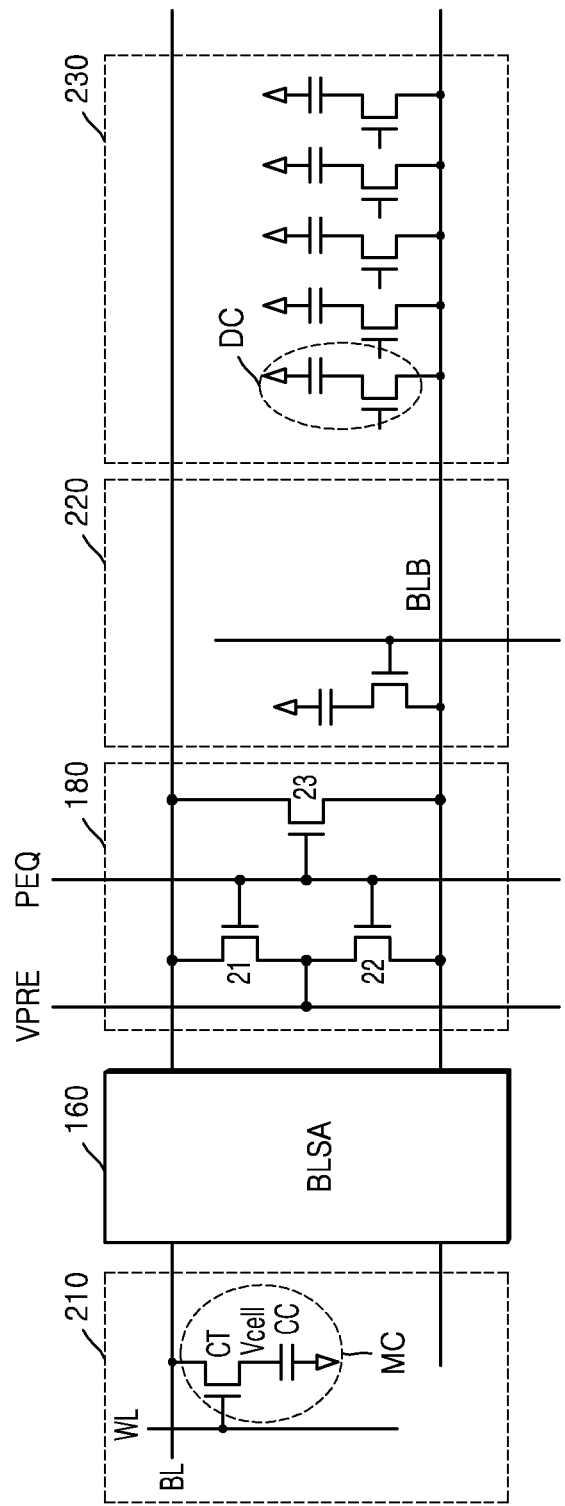
FIG. 2 is a diagram illustrating a memory cell and a sense amplifier having an open bit line structure of FIG. 1.

Hereinafter, a structure and operation of the sense amplifier 160 will be described in detail with reference to various embodiments. FIG. 2 is a diagram illustrating the memory cell MC and the sense amplifier 160 having an open bit line structure of FIG. 1. Referring to FIG. 2, the sense amplifier 160 is connected to the memory cell MC and an equalizing circuit 180 via a bit line pair (BL, BLB). The equalizing circuit 180 includes first through third equalizing transistors 21 through 23. The first through third equalizing transistors 21 through 23 equalize a bit line BL and a complementary bit line BLB to a precharge voltage VPRE in response to an equalizing signal PEQ. The equalizing signal PEQ may be provided by the control circuit unit 150 according to a precharge command. The precharge voltage VPRE may be set to a level corresponding to a half of a level of a power voltage VINTA driving the sense amplifier 160. For example, when a power voltage VINTA is 1.0 V, the precharge voltage VPRE may be set to about 0.5 V.

The sense amplifier 160 is connected to the memory cell MC in an open bit line structure. In an open bit line structure, each of bit lines of the bit line pair (BL, BLB) is located in different, adjacent main cell blocks 210 and 220. When a word line WL of a selected memory cell MC is enabled, data of the memory cell MC may be read or written via a selected bit line BL. While data of the memory cell MC is being accessed by the selected bit line BL, since the selected memory cell MC does not exist in a complementary bit line BLB, the complementary bit line BLB maintains a level of the precharge voltage VPRE as a reference voltage level. Accordingly, the sense amplifier 160 may sense a cell voltage Vcell of the memory cell MC by using a charge that is charge-shared via the bit line BL.

The bit line sense amplifier 160 (BLSA) senses the cell voltage Vcell stored in the memory cell MC as MSB and LSB data of a 2-bit combination and may restore the cell voltage Vcell corresponding to the sensed MSB and LSB data in the memory cell MC. The sense amplifier 160 may be connected to a dummy cell block 230 connected to the complementary bit line BLB to perform a restoring operation to the memory cell MC of the selected bit line BL.

The dummy cell block 230 may include a plurality of dummy cells DCs connected to the complementary bit line BLB, as shown by FIG. 2. Each of the dummy cells DCs may be configured identically to the memory cell MC. The dummy cells DCs connected to the complementary bit line BLB increase bit line capacitance of the complementary bit line BLB. For example, the dummy cell block 230 may include five dummy cells DCs. In this case, bit line capacitance of the complementary bit line BLB may be increased by five cell capacitances 5Cs.

According to the present embodiment, for the brevity of illustration, a dummy cell block 230 is illustrated to be adjacent to the main cell block 220 to which the complementary bit line BLB is connected. However, the dummy cell block 230 may also be arranged adjacent to the main cell block 210 to which the bit line BL is connected.

The sense amplifier 160 may sense a cell voltage Vcell of a memory cell MC selected from the main cell blocks 210 and 220 as MSB and LSB data in a 2-bit combination. The sense amplifier 160 may perform first through third charge sharing operations by using cell capacitance Cs of the memory cell MC, bit line capacitance Cb of each bit line of the bit line pair (BL and BLB), bit line capacitance Csa of each bit line of a first sensing bit line pair (SBL1 and SBLB1, FIG. 4) of the sense amplifier 160, and a variation in the capacitances. The sense amplifier 160 may sense MSB and LSB data by performing first through third charge sharing operations.

In the sense amplifier 160, the first charge sharing operation may be generated between a charge stored in a cell capacitor CC having cell capacitance Cs and a charge stored in a bit line BL having bit line capacitance Cb. The sense amplifier 160 may sense MSB data of a memory cell MC by performing the first charge sharing operation.

In the sense amplifier 160, the second charge sharing operation may include charge sharing between a charge stored in a bit line BL and a charge stored in a first complementary sensing bit line SBLB1 and charge sharing between a charge stored in the complementary bit line BLB and a charge stored in a first sensing bit line SBL1. The sense amplifier 160 may sense LSB data of the memory cell MC by performing the second charge sharing operation.

In the sense amplifier 160, the third charge sharing operation may be generated among a charge stored in the bit line BL storing LSB data of the memory cell MC, a charge stored in a second complementary sensing bit line SBLB2 storing MSB data of the memory cell MC, a charge stored in the first complementary sensing bit line SBLB1, a charge stored in the complementary bit line BLB, and a charge stored in the first sensing bit line SBL1. The sense amplifier 160 may restore a cell voltage Vcell corresponding to the sensed MSB and LSB data in the memory cell MC by performing the third charge sharing operation.

Accordingly, the sense amplifier 160 may sense and restore the cell voltage Vcell of the memory cell MC as MSB and LSB data in a 2-bit combination by using the cell capacitance Cs of the memory cell MC, the bit line capacitance Cb of each bit line of the bit line pair (BL, BLB), the bit line capacitance Csa of each bit line of the first sensing bit line pair (SBL1, SBLB1) of the sense amplifier 160, and a variation in the capacitances.

Figure 3:
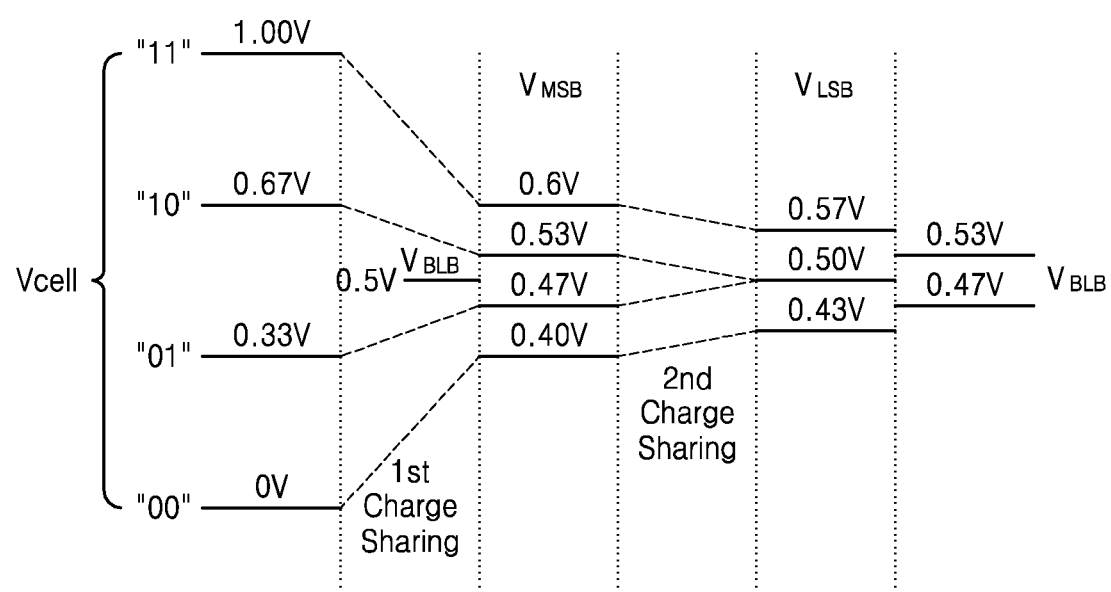
FIG. 3 is a diagram illustrating multi-bit data of a memory cell sensed by using the sense amplifier of FIG. 2.

FIG. 3 is a diagram illustrating multi-bit data of a memory cell sensed by using the sense amplifier 160 of FIG. 2. Referring to FIG. 3, the cell voltage Vcell of the memory cell MC may be represented as a 2-bit combination. The cell voltage Vcell may be represented as bit combinations of "00", "01", "10", and "11". For example, when a power voltage VINTA is 1 V, a voltage difference of about 330 mV to about 340 mV may be set between the respective bit combinations. That is, a cell voltage Vcell of 0 V may indicate a bit combination "00"; a cell voltage Vcell of 0.33 V may indicate a bit combination "01"; a cell voltage Vcell of 0.67 V may indicate a bit combination "10"; a cell voltage Vcell of 1.0 V may indicate a bit combination "11".

In the sense amplifier 160 sensing MSB data of the memory cell MC, when a first charge sharing operation is performed between a charge stored in the cell capacitor CC and a charge stored in a selected bit line BL, the selected bit line BL is captured at a predetermined MSB voltage VMSB. The selected bit line BL may be shifted to the MSB voltage VMSB at a precharge voltage VPRE, that is, at 0.5 V.

For example, a voltage level of a bit line BL may be captured at an MSB voltage VMSB of about 0.4 V by a first charge sharing operation on a cell voltage Vcell of 0 V of a bit combination "00". A voltage level of a bit line BL may be captured at an MSB voltage VMSB of about 0.47 V by a first charge sharing operation on a cell voltage Vcell of 0.33 V of a bit combination "01". A voltage level of a bit line BL may be captured at an MSB voltage VMSB of about 0.53 V by a first charge sharing operation on a cell voltage Vcell of 0.67 V of a bit combination "10". For example, a voltage level of a bit line BL may be captured at an MSB voltage VMSB of about 0.60 V by a first charge sharing operation on a cell voltage Vcell of 0.67 V of a bit combination "11".

A voltage level of a bit line BL of each of the bit combinations "00", "01", "10", and "11" according to a first charge sharing operation is captured at a MSB voltage VMSB of about 0.4 V, 0.47 V, 0.53 V, and 0.60 V, respectively. Here, the complementary bit line BLB is maintained at a level of the precharge voltage VPRE of 0.5 V. The MSB voltage VMSB of the bit lines BL respectively corresponding to the bit combinations "00", "01", "10", and "11" may be regarded as occurring due to a predetermined voltage difference with respect to a complementary bit line VBLB of 0.5 V. This may indicate that the MSB voltage VMSB respectively corresponding to the bit combinations "00", "01", "10", and "11" do not require an additional reference voltage for sensing the MSB voltage VMSB and that the MSB voltage VMSB functions as a self-reference.

In the sense amplifier 160 sensing LSB data of the memory cell MC, when a second charge sharing operation including charge sharing between a charge stored in the bit line BL and a charge stored in the first complementary sensing bit line SBLB1 and charge sharing between a charge stored in the charge sharing BLB and a charge stored in the first sensing bit line SBL1 is performed, the selected bit line BL is captured at a predetermined LSB voltage VLSB. The selected bit line BL may be shifted to the LSB voltage VLSB at an MSB voltage VMSB.

For example, a voltage level of a bit line BL having an MSB voltage of 0.4 V of a bit combination "00" may be captured at an LSB voltage VLSB of about 0.43 V through a second charge sharing operation. A voltage level of the complementary bit line BLB may be captured at a complementary bit line voltage VBLB of about 0.47 V. A voltage level of a bit line BL having an MSB voltage VMSB of 0.47 V of a bit combination "01" may be captured at an LSB voltage VLSB of about 0.50 V through a second charge sharing operation, and a voltage level of a complementary bit line VBLB may be captured at 0.47 V through a second charge sharing operation. A voltage level of a bit line BL having an MSB voltage VMSB of 0.53 V of a bit combination "10" may be captured at an LSB voltage VLSB of about 0.50 V through a second charge sharing operation, and a voltage level of a complementary bit line VBLB may be captured at 0.53 V through a second charge sharing operation. A voltage level of a bit line BL having an MSB voltage VMSB of 0.60 V of a bit combination "11" may be captured at an LSB voltage VLSB of about 0.57 V through a second charge sharing operation, and a voltage level of a complementary bit line VBLB may be captured at 0.53 V through a second charge sharing operation.

A voltage level of a bit line BL of each of the four possible bit combinations "00", "01", "10", and "11" according to the second charge sharing operation may be respectively captured at an LSB voltage VLSB of about 0.43 V, 0.50 V, 0.50 V, and 0.57 V, and a level of the complementary bit line voltage VBLB is captured at 0.47 V, 0.47 V, 0.53 V, and 0.53 V, respectively. The LSB voltages VLSB of the bit lines BL respectively corresponding to the bit combinations "00", "01", "10", and "11" may be regarded as being generated due to a predetermined voltage difference with respect to the complementary bit line BLB. This indicates that the LSB voltages VLSB respectively corresponding to the bit combinations "00", "01", "10", and "11" act as a self-reference which does not require an additional reference voltage for sensing the LSB voltages VLSB.

When sensing a cell voltage Vcell of a memory cell MC as MSB and LSB data in a 2-bit combination, a voltage level of a bit line having an MSB or LSB voltage level acts as a self-reference having a predetermined voltage difference with respect to a voltage level of a complementary bit line. Accordingly, as the sense amplifier 160 does not require an additional reference voltage for sensing MSB or LSB data, signal line connection of the sense amplifier 160 may be simplified.

Figure 4:
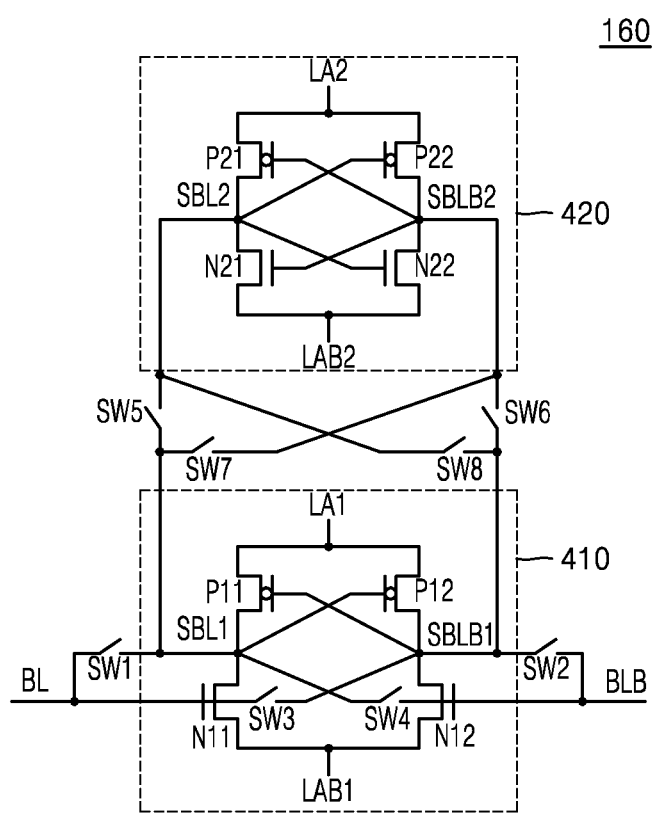
FIG. 4 is a circuit diagram illustrating a sense amplifier according to an embodiment of the inventive concept.

FIG. 4 is a circuit diagram illustrating a sense amplifier 160 according to an embodiment of the inventive concept. The sense amplifier 160 of FIG. 4 corresponds to the sense amplifier 160 of FIG. 2. Referring to FIG. 4, the sense amplifier 160 includes a first sense amplification circuit 410, a second sense amplification circuit 420, and a switching circuit including first through eighth switches SW1 through SW8.

The first sense amplification circuit 410, which is connected to a first sensing driving signal LA1 and a second sensing driving signal LAB1, includes first and second PMOS transistors P11 and P12 and first and second NMOS transistors N11 and N12. According to an operation of the first sense amplification circuit 410, a power voltage VINTA, a ground voltage VSS or a precharge voltage VPRE may be applied to each of the first and second sensing driving signal LA1 and LAB1.

A first end of the first PMOS transistor P11 is connected to a line of the first sensing driving signal LA1, and a second end of the first PMOS transistor P11 is connected to a first sensing bit line SBL1, and a gate of the first PMOS transistor P11 is connected to a first complementary sensing bit line SBLB1. A first end of the second PMOS transistor P12 is connected to the line of the first sensing driving signal LA1, and a second end of the second PMOS transistor P12 is connected to the first complementary sensing bit line SBLB1, and a gate of the second PMOS transistor P12 is connected to the first sensing bit line SBL1.

A first end of the first NMOS transistor N11 is connected to a line of the second sensing driving signal LAB1, and a second end of the first NMOS transistor N11 is connected to the first sensing bit line SBL1, and a gate of the first NMOS transistor N11 is connected to the bit line BL. A first end of the second NMOS transistor N12 is connected to the line of the second sensing driving signal LAB1, and a second end of the second NMOS transistor N12 is connected to the first complementary sensing bit line SBLB1, and a gate of the second NMOs transistor N12 is connected to the complementary bit line BLB.

The first switch SW1 is connected between the bit line BL and the first sensing bit line SBL1, and is turned on or off according to the control of the control circuit unit 150. The second switch SW2 is connected between the complementary bit line BLB and the first complementary sensing bit line SBLB1, and is turned on or off according to the control of the control circuit unit 150. The third switch SW3 is connected between the bit line BL and the first complementary sensing bit line SBLB1, and is turned on or off according to the control of the control circuit unit 150. The fourth switch SW4 is connected between the complementary bit line BLB and the first sensing bit line SBL1, and is turned on or off according to the control of the control circuit unit 150.

The second sense amplification circuit 420, which is connected between a third sensing driving signal LA2 and a fourth sensing driving signal LAB2, includes third and fourth PMOS transistors P21 and P22 and third and fourth NMOS transistors N21 and N22. A first end of the third PMOS transistor P21 is connected to a line of the third sensing driving signal LA2, and a second end of the third PMOS transistor P21 is connected to a second sensing bit line SBL2, and a gate of the third PMOS transistor P21 is connected to a second complementary sensing bit line SBLB2. A first end of the fourth PMOS transistor P22 is connected to the line of the third sensing driving signal LA2, and a second end of the fourth PMOS transistor P22 is connected to the second complementary sensing bit line SBLB2, and a gate of the fourth PMOS transistor P22 is connected to the second sensing bit line SBL2.

A first end of the third NMOS transistor N21 is connected to a line of the fourth sensing driving signal LAB2, and a second end of the third NMOS transistor N21 is connected to the second sensing bit line SBL2, and a gate of the third NMOS transistor N21 is connected to the second complementary sensing bit line SBLB2. A first end of the fourth NMOS transistor N22 is connected to the line of the fourth sensing driving signal LAB2, and a second end of the fourth NMOS transistor N22 is connected to the second complementary sensing bit line SBLB2, and a gate of the fourth NMOS transistor N22 is connected to the second sensing bit line SBL2.

The fifth switch SW5 is connected between the first sensing bit line SBL1 and the second sensing bit line SBL2, and is turned on or off according to the control of the control circuit unit 150. The sixth switch SW6 is connected between the first complementary sensing bit line SBLB1 and the second complementary sensing bit line SBLB2, and is turned on or off according to the control of the control circuit unit 150. The seventh switch SW7 is connected between the first sensing bit line SBL1 and the second complementary sensing bit line SBLB2, and is turned on or off according to the control of the control circuit unit 150. The eighth switch SW8 is connected between the first complementary sensing bit line SBLB1 and the second sensing bit line SBL2, and is turned on or off according to the control of the control circuit unit 150.

Figure 5:
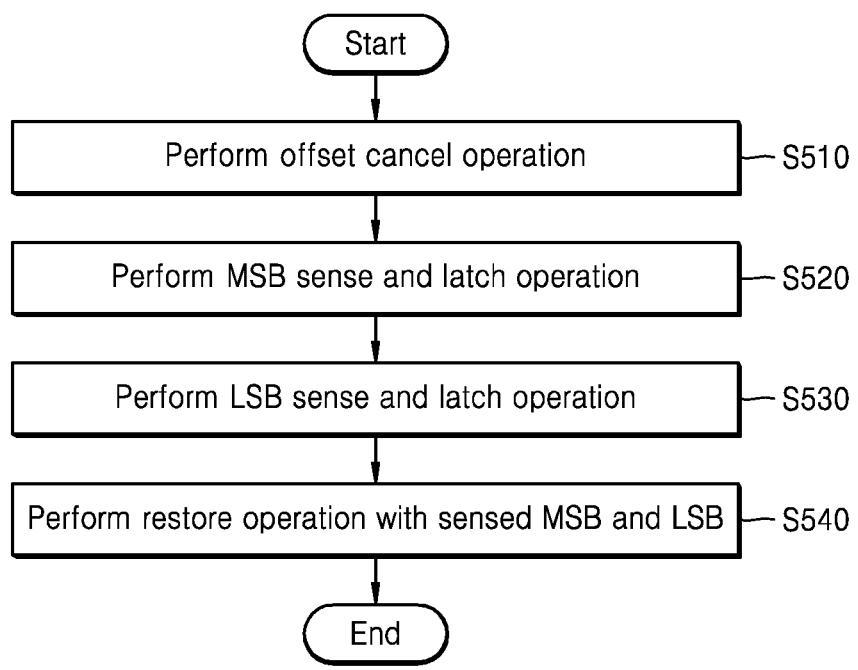
FIG. 5 is a conceptual flowchart of an operation of the sense amplifier illustrated in FIG. 4.

FIG. 5 is a conceptual flowchart of an operation of the sense amplifier 160 illustrated in FIG. 4. Referring to FIG. 5, in operation S510, the sense amplifier 160 performs an offset cancelling operation. In the sense amplifier 160 having an open bit line structure described with reference to FIG. 2, noise such as process variation, temperature or a threshold voltage difference (i.e., PVT variations) between transistors may be different among bit lines of a bit line pair (BL, BLB). The noises differing in the bit line pair (BL, BLB) may act as offset noise in a sensing operation of the sense amplifier 160 and reduce an effective sensing margin of the sense amplifier 160. Thus, the sense amplifier 160 performs an offset cancelling operation before a sensing operation to advantageously increase an effective sensing margin.

In operation S520, the sense amplifier 160 senses and latches a most significant bit (MSB) of a 2-bit combination representing a cell voltage Vcell stored in a memory cell MC. An MSB sensing operation may include a first charge sharing operation generated between a charge stored in the memory cell MC and a charge stored in the bit line BL.

For example, cell capacitance Cs of the memory cell MC may be designed to be about 8 fF, and bit line capacitance Cb of each bit line of the bit line pair (BL, BLB) may be designed to be about 32 fF, and bit line capacitance Csa of each bit line of the first sensing bit line pair (SBL1, SBLB1) may be designed to be about 2.4 fF.

The first charge sharing operation is generated between a charge stored in a cell capacitor having cell capacitance Cs and a charge stored in a bit line BL having bit line capacitance Cb. A voltage level of the bit line BL may be exhibited as MSB voltages VMSB (FIG. 3) respectively corresponding to the bit combinations "00", "01", "10", and "11". The MSB voltages VMSB may act as a self-reference generated due to a predetermined voltage difference with respect to the complementary bit line VBLB (FIG. 3). The sense amplifier 160 may sense and amplify a voltage difference between the MSB voltage VMSB and the complementary bit line voltage VBLB of the complementary bit line BLB to latch MSB data of logic "1" or logic "0" having a level of a power voltage VINTA or a ground voltage VSS.

In operation S530, the sense amplifier 160 may sense and latch a least significant bit (LSB) of a 2-bit combination representing a cell voltage Vcell stored in memory cell MC. An LSB sensing operation may include a second charge sharing operation. The second charge sharing operation may include charge sharing that is generated between a charge stored in a bit line BL having a sum of cell capacitance Cs and bit line capacitance Cb and a charge stored in the first complementary sensing bit line SBLB1 having bit line capacitance Csa and charge sharing generated between a charge stored in the complementary bit line BLB having bit line capacitance Cb and a charge stored in the first sensing bit line SBL1 having bit line capacitance Csa.

For optimal sensing of LSB data of the memory cell MC, as illustrated in FIGS. 15A through 15D, bit line capacitance Csa of each bit line of the first sensing bit line pair (SBL1, SBLB1) of the sense amplifier 160 may be designed to have predetermined capacitance such that a voltage difference between the bit line BL and the complementary bit line BLB is constant. For example, a double of the bit line capacitance (2×Csa) may be designed to be about 5 fF.

According to the second charge sharing operation, a voltage level of the bit line BL may be exhibited as LSB voltages VLSB (FIG. 3) respectively corresponding to the bit combinations "00", "01", "10", and "11". The LSB voltages VLSB may act as a self-reference generated due to a predetermined voltage difference with respect to the complementary bit line voltage VBLB (FIG. 3). The sense amplifier 160 may sense and amplify a voltage difference between the LSB voltage VLSB and the complementary bit line voltage VBLB of the bit line BL to latch LSB data of logic "1" or logic "0" having a level of a power voltage VINTA or a ground voltage VSS.

In operation S540, the sense amplifier 160 performs a restoring operation of rewriting the cell voltage Vcell corresponding to the sensed MSB and LSB data, in the memory cell MC. The restoring operation may include a third charge sharing operation. According to the sensing and latching operations of the MSB and LSB data (S520 and S540), LSB data of a corresponding logic level is stored in the bit line BL, and MSB data of a corresponding logic level is stored in the first sensing bit line SBL1, the complementary bit line BLB, and the first complementary sensing bit line SBLB1.

Dummy cells DCs of the dummy cell block 230 may be connected to the complementary bit line BLB for optimal restoration to the memory cell MC. Accordingly, the sense amplifier 160 may write or store the sensed MSB data to or in the complementary bit line BLB by using a sum of the bit line capacitance Csa of the second complementary sensing bit line SBLB2, the bit line capacitance Csa of the first complementary sensing bit line SBLB1, the bit line capacitance Cb of the complementary bit line BLB, and the cell capacitance 5Cs of the dummy cells DCs, that is, the capacitance 2Csa+Cb+5Cs.

The third charge sharing operation is generated among a charge stored in the bit line BL, a charge stored in the first sensing bit line SBL1, a charge stored in the complementary bit line BLB, and a charge stored in the first complementary sensing bit line SBLB1. Accordingly, in the memory cell MC of the selected bit line BL, a voltage level of the bit line BL according to the third charge sharing operation may be restored as the cell voltage Vcell.

Figure 6:
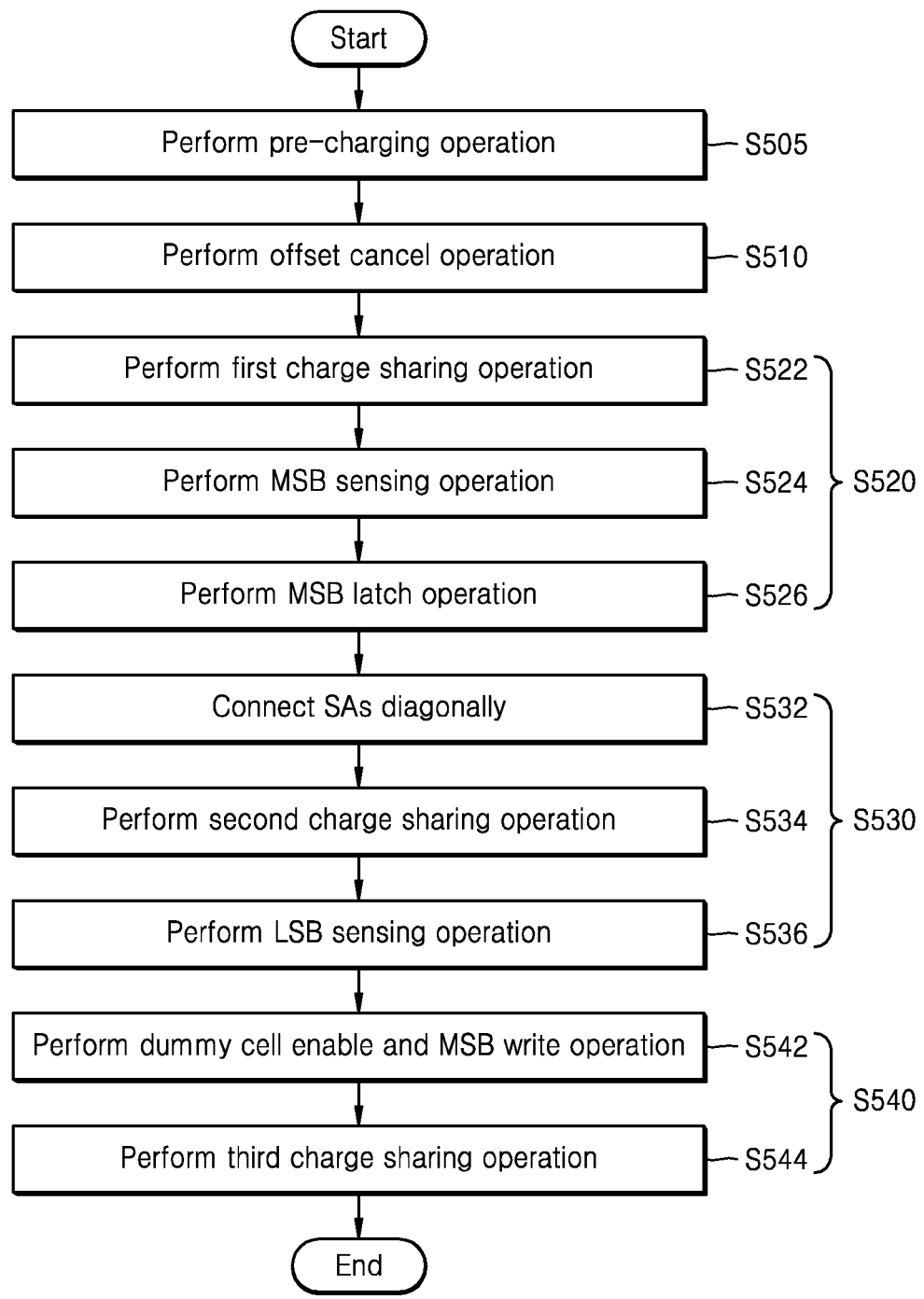
FIG. 6 is a detailed flowchart of an operation of the sense amplifier illustrated in FIG. 4.

FIG. 6 is a detailed flowchart of an operation of the sense amplifier 160 illustrated in FIG. 4. FIGS. 7A through 7J are equivalent circuit diagrams illustrating an operation of the sense amplifier 160 illustrated in FIG. 6. For the convenience of description, each operation of FIG. 6 will be described with reference to FIGS. 7A through 7J. For brevity of illustration, switches that are turned on in FIGS. 7A through 7J are illustrated as short circuits, and switches being turned off are illustrated as being open. FIGS. 7A through 7J illustrate, in detail, an operation of the sense amplifier 160 that senses a cell voltage Vcell of 0 V stored in the memory cell MC, that is, a bit combination "00".

Precharging Operations

Figure 7A:
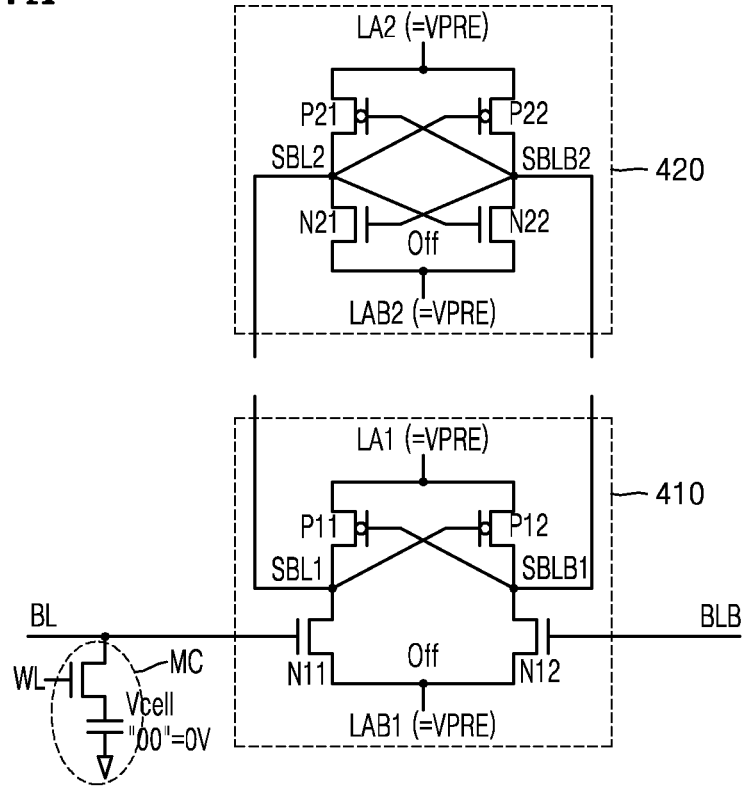
FIGS. 7A through 7J are equivalent circuit diagrams illustrating an operation of the sense amplifier illustrated in FIG. 6.

FIGS. 6 and 7A illustrate how, in operation 505, the sense amplifier 160 precharges the bit line BL, the complementary bit line BLB, the first sensing bit line SBL1, the first complementary sensing bit line SBLB1, the second sensing bit line SBL2, the second complementary sensing bit line SBLB2, the first and second sensing driving signals LA1 and LAB1, and the third and fourth sensing driving signals LA2 and LAB2 to a precharge voltage VPRE.

The precharge voltage VPRE may be set to a voltage level corresponding to a half of a level of a power voltage VINTA. For example, when the power voltage VINTA is 1.0 V, the precharge voltage VPRE may be set to 0.5 V. For example, the bit line BL and the complementary bit line BLB may be charged to the precharge voltage VPRE via the equalizing circuit 180 of FIG. 2. According to an embodiment, the sense amplifier 160 further includes a precharge circuit, and the first sensing bit line SBL1, the first complementary sensing bit line SBLB1, the second sensing bit line SBL2, the second complementary sensing bit line SBLB2, the first and second sensing driving signals LA1 and LAB1, and the third and fourth sensing driving signals LA2 and LAB2 may be charged to the precharge voltage VPRE.

In the precharging operation, the first sense amplification circuit 410 and the second sense amplification circuit 420 are in an off state, and the first to eighth switches SW1 to SW8 are also in a turned-off state. Hereinafter, when the first sense amplification circuit 410 is in an off state, the precharge voltage VPRE is applied to the first and second sensing driving signals LA1 and LAB1, and when the second sensing amplification circuit 420 is in an off state, the precharge voltage VPRE is applied to the third and fourth sensing driving signals LA2 and LAB2.

Offset Cancelling Operation

Figure 7B:
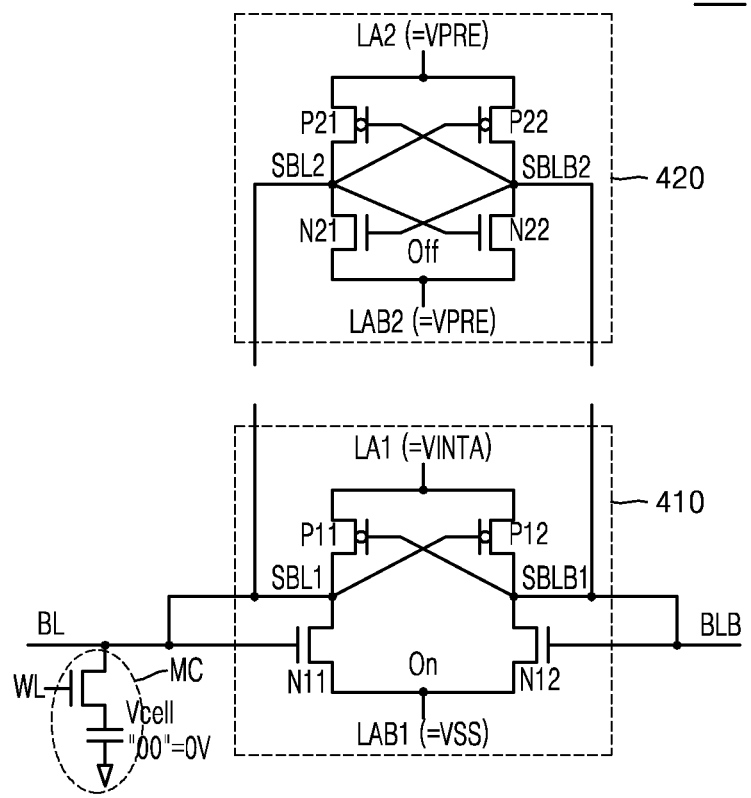

FIGS. 6 and 7B illustrate, in operation S510, how the sense amplifier 160 performs an offset cancelling operation. The sense amplifier 160 has an open bit line structure connected to the pair of the bit lines (BL, BLB) which are separately located in different adjacent main cell blocks 210 and 220 as shown in FIG. 2. In the open bit line structure, regarding noise of each bit line of the bit line pair (BL, BLB), offset noise may be maximized during a sensing operation of the sense amplifier 160, and accordingly, an effective sensing margin of the sense amplifier 160 may be reduced.

In order to improve the effective sensing margin of the sense amplifier 160, the sense amplifier 160 turns on the first sense amplification circuit 410 and turns on the first and second switches SW1 and SW2 to perform an offset cancelling operation. A power voltage VINTA is applied to the first sensing driving signal LA1 of the first sensing amplification circuit 410, and a ground voltage VSS is applied to the second sensing driving signal LAB1 of the first sense amplification circuit 410. The second sense amplification circuit 420 is in an off state, and the third to eighth switches SW3 to SW8 are also turned off.

In the first sense amplification circuit 410, due to the offset noise of the bit line pair (BL, BLB), the complementary bit line is increased or lowered to a predetermined level compared to the bit line BL, thereby generating a predetermined voltage difference between the bit line BL and the complementary bit line BLB. The voltage difference may be interpreted as an offset voltage according to the offset noise. This means that the offset noise of the sense amplifier 160 is cancelled by setting the bit line BL and the complementary bit line BLB to differ by an offset voltage. That is, the sense amplifier 160 may compensate for the offset through the offset cancelling operation.

First Charge Sharing Operation

Figure 7C:
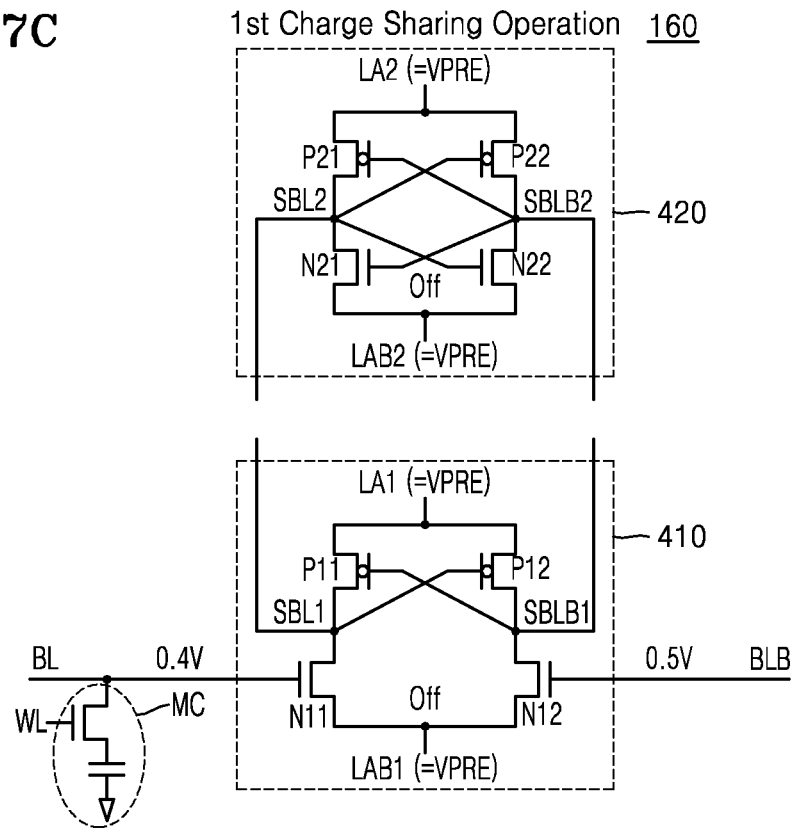

Referring to FIGS. 6 and 7C, in operation S522, the sense amplifier 160 performs a first charge sharing operation between the memory cell MC and the bit line BL. The sense amplifier 160 turns off the first and second sense amplification circuits 410 and 420, and also turns off the first through eighth switches SW1 through SW8. Here, a word line WL connected to the memory cell MC is enabled, and charge sharing is generated between a charge stored in a capacitor of the memory cell MC and a charge stored in the bit line BL.

When a cell voltage Vcell of 0 V is stored in the memory cell MC, in a charge sharing operation, a voltage level of the bit line BL may be reduced by a predetermined level from the precharge voltage VPRE. That is, the voltage level of the bit line BL is reduced from 0.5 V to about 0.4 V. Here, the complementary bit line BLB is maintained at a level of the precharge voltage VPRE, that is, at 0.5 V.

Most Significant Bit (MSB) Sensing Operation

Figure 7D:
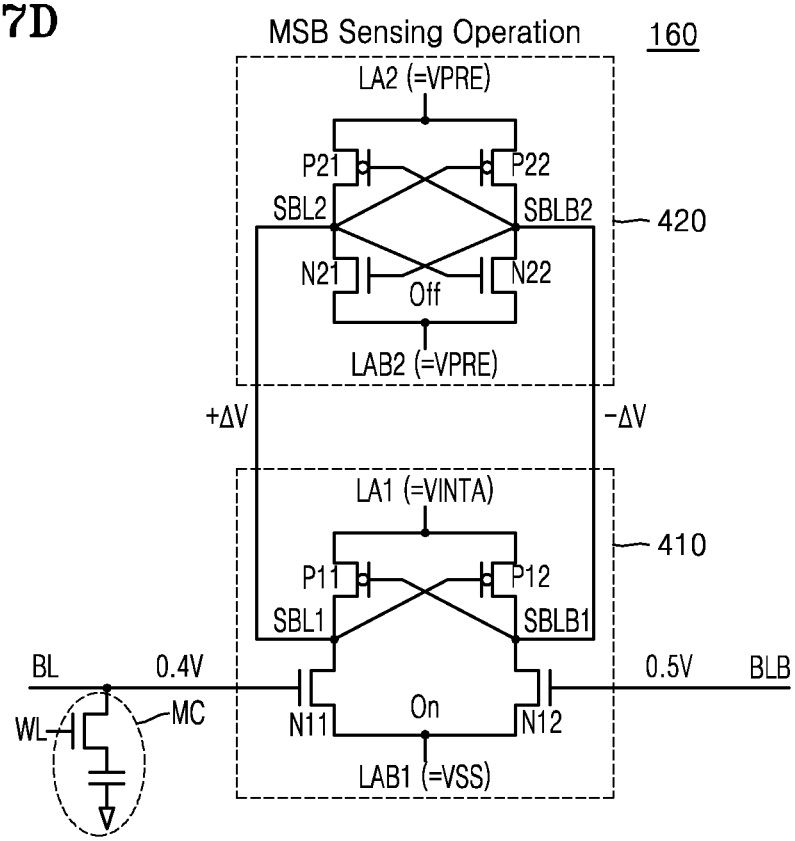

Referring to FIGS. 6 and 7D, in operation S524, the sense amplifier 160 performs an MSB sensing operation of sensing a most significant bit (MSB) in a 2-bit combination representing a cell voltage Vcell stored in the memory cell MC. The sense amplifier 160 performs the MSB sensing operation by turning on the first sense amplification circuit 410 and turning on the fifth and sixth switches SW5 and SW6. A power voltage VINTA is applied to the first sensing driving signal LA1 of the first sensing amplification circuit 410, and a ground voltage VSS is applied to the second sensing driving signal LAB1 of the first sense amplification circuit 410. Via the fifth switch SW5, the first sensing bit line SBL1 and the second sensing bit line SBL2 are connected, and via the sixth switch SW6, the first complementary sensing bit line SBLB1 and the second complementary sensing bit line SBLB2 are connected. The second sense amplification circuit 420 is in an off state, and the first through fourth switches SW1 through SW4 and the seventh and eighth switches SW7 and SW8 are also turned off.

The first sense amplification circuit 410 may sense a voltage difference between a voltage of the bit line BL of 0.4 V and a voltage of the complementary bit line BLB of 0.5 V respectively applied to gates of the first and second NMOS transistors N11 and N12 to increase a voltage of the first sensing bit line SBL1 to a predetermined level (+Δ) and reduce a voltage of the first complementary sensing bit line SBLB1 to a predetermined level (−Δ). A voltage of the second sensing bit line SBL2 connected to the first sensing bit line SBL1 may be raised to a predetermined level (+Δ), and a voltage of the second complementary sensing bit line SBLB2 connected to the first complementary sensing bit line SBLB1 may be reduced to a predetermined level (−Δ). That is, the first sense amplification circuit 410 generates a voltage difference between the first sensing bit line SBL1 and the first complementary sensing bit line SBLB1, and generates a voltage difference between the second sensing bit line SBL2 and the second complementary sensing bit SBLB2.

Most Significant Bit (MSB) Latching Operation

Figure 7E:
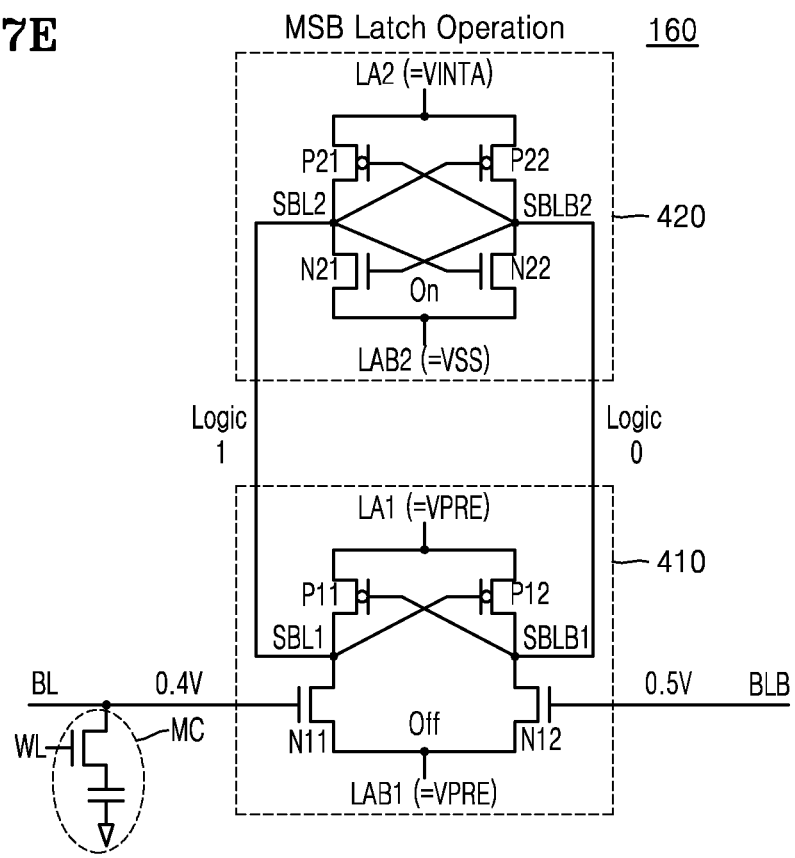

Referring to FIGS. 6 and 7E, in operation S526, the sense amplifier 160 performs an MSB latching operation of latching a most significant bit (MSB) in a 2-bit combination representing a cell voltage Vcell stored in the memory cell MC. The sense amplifier 160 performs an MSB latching operation by turning on the second sense amplification circuit 420 and turning on the fifth and sixth switches SW5 and SW6. A power voltage VINTA is applied to the third sensing driving signal LA2 of the second sensing amplification circuit 420, and a ground voltage VSS is applied to the fourth sensing driving signal LAB2 of the second sense amplification circuit 420. Via the fifth switch SW5, the first sensing bit line SBL1 and the second sensing bit line SBL2 are connected, and via the sixth switch SW6, the first complementary sensing bit line SBLB1 and the second complementary sensing bit line SBLB2 are connected. The first sense amplification circuit 410 is in an off state, and the first through fourth switches SW1 through SW4 and the seventh and eighth switches SW7 and SW8 are also turned off.

The second sense amplification circuit 420 senses a voltage difference between the second sensing bit line SBL2 and the second complementary sensing bit line SBLB2 to charge each voltage of the second sensing bit line SBL2 and the second complementary sensing bit line SBLB2 to the power voltage VINTA or discharge the voltages to the ground voltage VSS. Accordingly, based on these operations, the first sensing bit line SBL1 connected to the second sensing bit line SBL2 may be raised to the power voltage VINTA, and the first complementary sensing bit line SBLB1 connected to the second complementary sensing bit line SBLB2 may be reduced to the ground voltage VSS.

In the second sense amplification circuit 420, the ground voltage VSS of the second complementary sensing bit line SBLB2 is latched to logic 0 as the MSB data of the memory cell MC.

Symmetrical Connection Operation

Figure 7F:
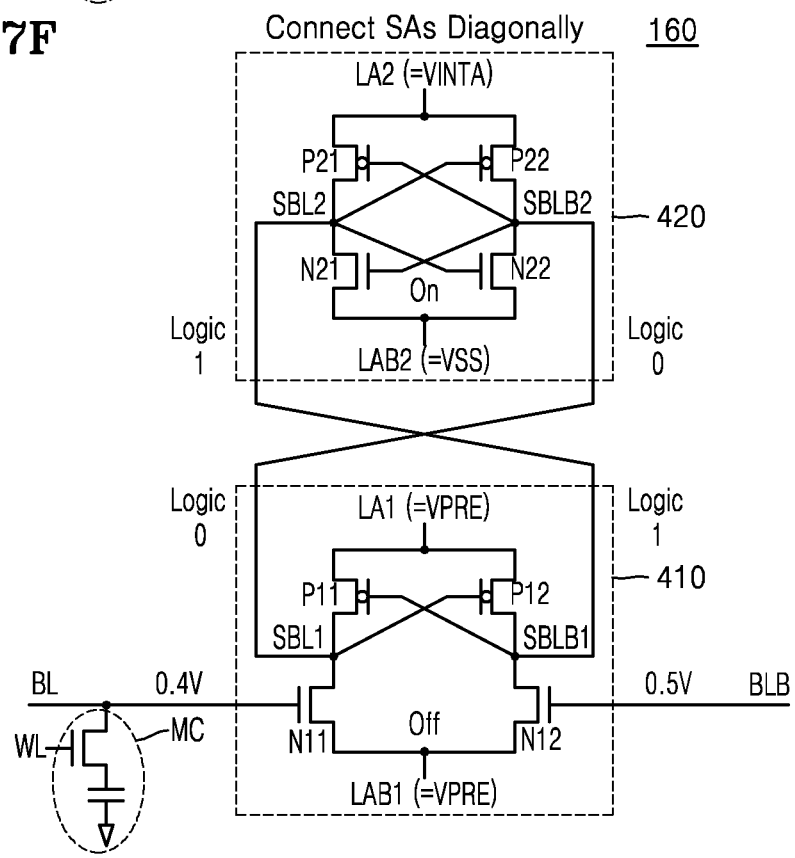

Referring to FIGS. 6 and 7F, in operation S532, the sense amplifier 160 symmetrically connects the first and second sense amplification circuits 410 and 420. The sense amplifier 160 turns on the second sense amplification circuit 420 and turns on the seventh and eighth switches SW7 and SW8 to symmetrically connect the first sensing bit line pair (SBL1, SBLB1) and the second sensing bit line pair (SBL2, SBLB2). A power voltage VINTA is applied to the third sensing driving signal LA2 of the second sensing amplification circuit 420, and a ground voltage VSS is applied to the fourth sensing driving signal LAB2 of the second sense amplification circuit 420. Via the seventh switch SW7, the first sensing bit line SBL1 and the second complementary sensing bit line SBLB2 are connected, and via the eighth switch SW8, the first complementary sensing bit line SBLB1 and the second sensing bit line SBL2 are connected. The first sense amplification circuit 410 is in an off state, and the first through sixth switches SW1 through SW6 are also turned off.

The second sense amplification circuit 420 senses a voltage difference between the second sensing bit line SBL2 and the second complementary sensing bit line SBLB2 to charge voltages of the second sensing bit line SBL2 and the second complementary sensing bit line SBLB2 to the power voltage VINTA or discharges the voltages to the ground voltage VSS. Accordingly, the first complementary sensing bit line SBLB1 connected to the second sensing bit line SBL2 may be raised to the power voltage VINTA, and the first sensing bit line SBL1 connected to the second complementary sensing bit line SBLB2 may be reduced to the ground voltage VSS.

The MSB data of logic 0 latched in the second complementary sensing bit line SBLB2 of the second sense amplification circuit 420 is transferred to the first sensing bit line SBL1.

Second Charge Sharing Operation

Figure 7G:
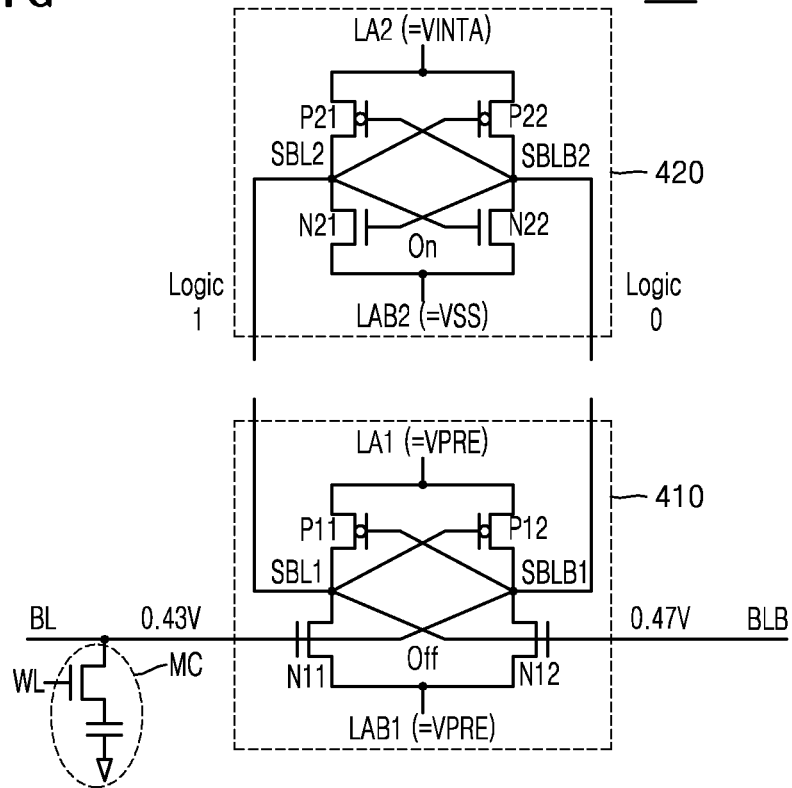

Referring to FIGS. 6 and 7G, in operation S534, the sense amplifier 160 performs a second charge sharing operation between the first sensing bit line pair (SBL1, SBLB1) and the bit line pair (BL, BLB). The sense amplifier 160 turns on the second sense amplification circuit 420, and turns on the third and fourth switches SW3 and SW4. Here, the first sense amplification circuit 410 is in an off state, and the first and second switches SW1 and SW2 and the fifth through eighth switches SW5 through SW8 are also turned off.

A power voltage VINTA is applied to the third sensing driving signal LA2 of the second sensing amplification circuit 420, and a ground voltage VSS is applied to the fourth sensing driving signal LAB2 of the second sense amplification circuit 420. The second sense amplification circuit 420 senses a voltage difference between the second sensing bit line SBL2 and the second complementary sensing bit line SBLB2 to charge voltages of the second sensing bit line SBL2 and the second complementary sensing bit line SBLB2 to the power voltage VINTA or discharges the voltages to the ground voltage VSS.

The bit line BL and the first complementary sensing bit line SBLB1 are connected via the third switch SW3, and the complementary bit line BLB and the first sensing bit line SBL1 are connected via the fourth switch SW4. Charge sharing occurs between a charge stored in the bit line BL and a charge stored in the first complementary sensing bit line SBLB1, and charge sharing occurs between a charge stored in the complementary bit line BLB and a charge stored in the first sensing bit line SBL1.

For example, it may be assumed that cell capacitance Cs of the memory cell MC is about 8 fF, and bit line capacitance Cb of each bit line of the bit line pair (BL, BLB) is about 32 fF, and bit line capacitance Csa of each bit line of the first sensing bit line pair (SBL1, SBLB1) is about 2.4 fF. In this case, in a second charge sharing operation, voltage levels of the bit line BL and the first complementary sensing bit line SBLB1 are captured at about 0.43 V, and voltage levels of the complementary bit line BLB and the first sensing bit line SBL1 are captured at about 0.47 V.

Least Significant Bit (LSB) Sensing Operation

Figure 7H:
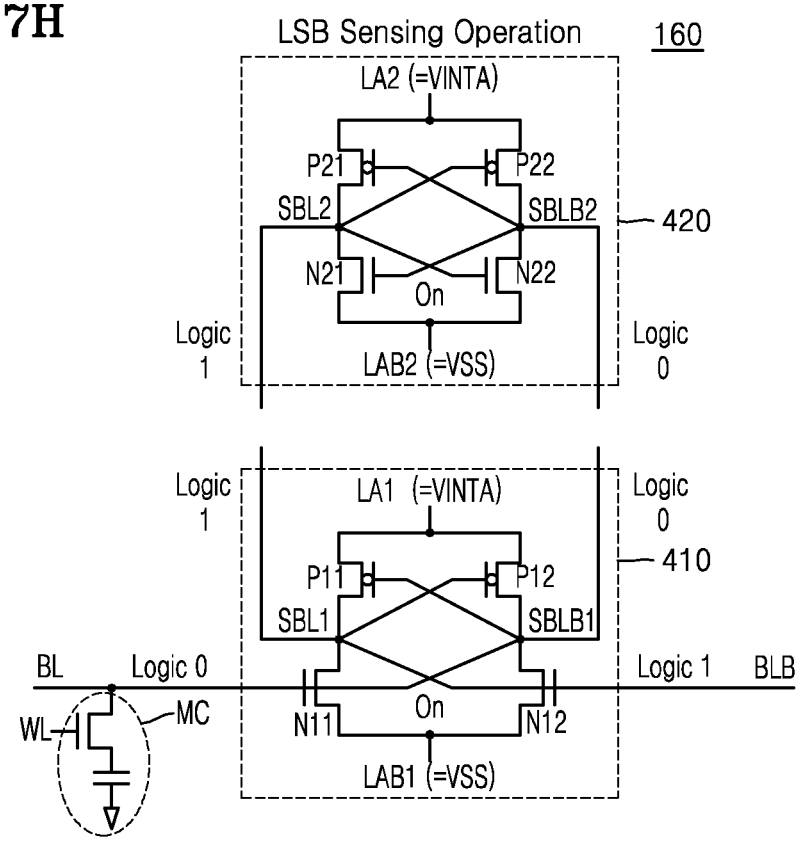

Referring to FIGS. 6 and 7H, in operation S536, the sense amplifier 160 performs an LSB sensing operation of sensing a least significant bit (LSB) in a 2-bit combination representing a cell voltage Vcell stored in the memory cell MC. The sense amplifier 160 turns on the first and second sense amplification circuits 410 and 420 and turns on the third and fourth switches SW3 and SW4 to perform an LSB sensing operation.

A power voltage VINTA is applied to the first sensing driving signal LA1 of the first sensing amplification circuit 410, and a ground voltage VSS is applied to the second sensing driving signal LAB1 of the first sense amplification circuit 410. A power voltage VINTA is applied to the third sensing driving signal LA2 of the second sensing amplification circuit 420, and a ground voltage VSS is applied to the fourth sensing driving signal LAB2 of the second sense amplification circuit 420. The bit line BL and the first complementary sensing bit line SBLB1 are connected via the third switch SW3, and the complementary bit line BLB and the first sensing bit line SBL1 are connected via the fourth switch SW4. The first and second switches SW1 and SW2 and the fifth to eighth switches SW5 to SW8 are turned off.

The second sense amplification circuit 420 senses a voltage difference between the second sensing bit line SBL2 and the second complementary sensing bit line SBLB2 to charge voltages of the second sensing bit line SBL2 and the second complementary sensing bit line SBLB2 to the power voltage VINTA or discharges the voltages to the ground voltage VSS.

The first sense amplification circuit 410 senses a voltage difference between a voltage of a bit line BL of 0.43V applied to gates of the first PMOS and NMOS transistors P11 and N11 and a voltage of a complementary bit line BLB of 0.47 V applied to gates of the second PMOS and NMOS transistors P12 and N12, thereby charging the voltage of the first sensing bit line SBL1 to the power supply voltage VINTA and discharging the voltage of the first complementary sensing bit line SBLB1 to the ground voltage VSS. Accordingly, the complementary bit line BLB connected to the first sensing bit line SBL1 may rise to the power supply voltage VINTA, and the bit line BL connected to the first complementary sensing bit line SBLB1 may be reduced to the ground voltage VSS.

In the first sense amplification circuit 410, the ground voltage VSS of the first complementary sensing bit line SBLB1 is sensed as logic 0 as LSB data of the memory cell MC, and the LSB data of logic 0 is stored in capacitance Cs+Cb of the bit line BL. That is, the sense amplifier 160 stores the LSB data of the logic 0 of the memory cell MC and the data of the level of the ground voltage VSS in the bit line BL by using the capacitance of the bit line BL. The sense amplifier 160 senses the cell voltage Vcell stored in the memory cell MC as the MSB and the LSB of a 2-bit combination of, and then restores the cell voltage Vcell to the memory cell MC based on the sensed MSB and LSB.

Dummy Cell Enable and Most Significant Bit (MSB) Write Operations

Figure 7I:
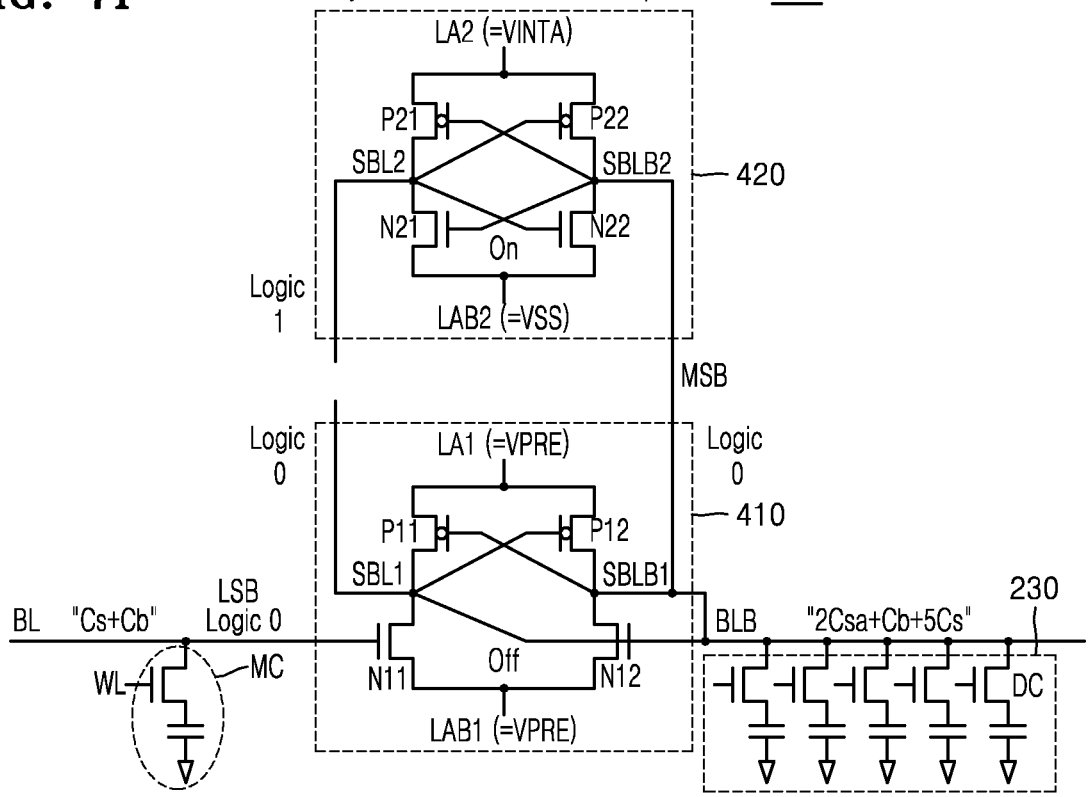

Referring to FIGS. 6 and 7I, in operation S542, the sense amplifier 160 connects the dummy cells DCs of the dummy cell block 230 to the complementary bit line BLB, turns on the second sense amplification circuit 420, and turns on the second, fourth, and sixth switches SW2, SW4, and SW6 to restore the sensed MSB data of the memory cell MC to the memory cell MC.

A power voltage VINTA is applied to the third sensing driving signal LA2 of the second sensing amplification circuit 420, and a ground voltage VSS is applied to the fourth sensing driving signal LAB2 of the second sense amplification circuit 420. The complementary bit line BLB and the first complementary sensing bit line SBLB1 are connected via the second switch SW2, and the complementary bit line BLB and the first sensing bit line SBL1 are connected via the fourth switch SW4, and the first complementary sensing bit line SBLB1 and the second complementary sensing bit line SBLB2 are connected via the sixth switch SW6. The first sense amplification circuit 410 is in an off state, and the first, third, fifth, seventh, and eighth switches SW1, SW3, SW5, SW7, and SW8 are turned off.

As a voltage difference between the second sensing bit line SBL2 and the second complementary sensing bit line SBLB2 is sensed in the second sense amplification circuit 420, the second complementary sensing bit line SBLB2 may be discharged to the ground voltage VSS, thereby latching the MSB data of logic 0.

The second complementary sensing bit line SBLB2 in which the MSB data of logic 0 is latched is connected to the first sense bit line pair (SBL1, SBLB1), the complementary bit line BLB, and the dummy cells DCs of the dummy cell block 230. Accordingly, the MSB data of logic 0 of the memory cell MC may be stored in the complementary bit line BLB. Here, the capacitance of the complementary bit line BLB may be varied relatively greatly to about 2Csa+Cb+5Cs.

The sense amplifier 160 stores the MSB data of logic 0 of the memory cell MC and data of a level of the ground voltage VSS in the complementary bit line BLB by using the varied capacitance of the complementary bit line BLB.

Third Charge Sharing Operation

Figure 7J:
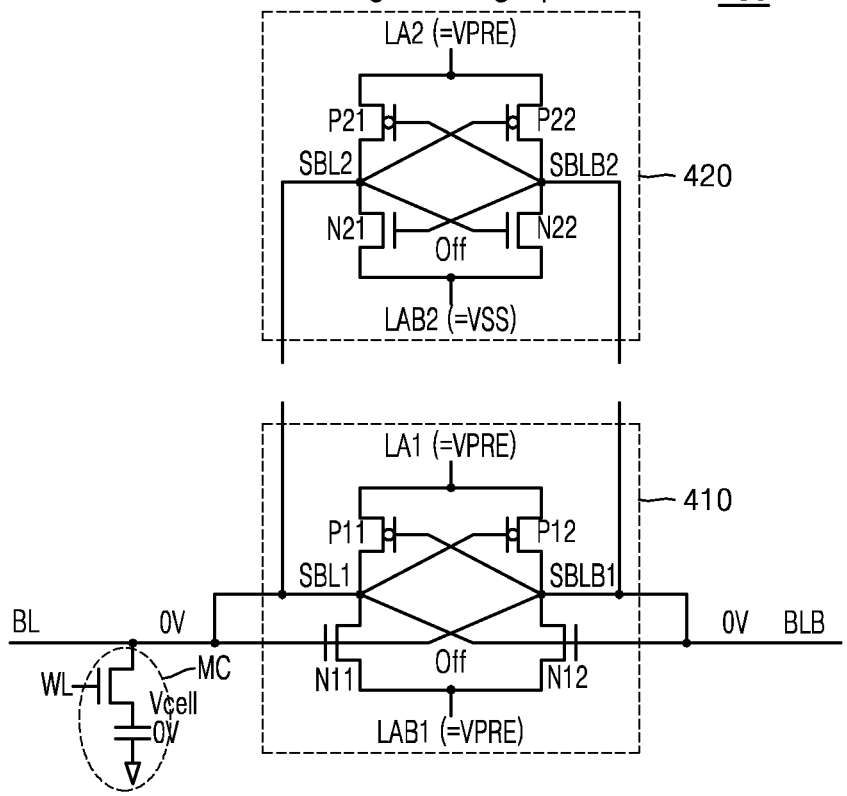

Referring to FIGS. 6 and 7J, in operation S544, the sense amplifier 160 performs a third charge sharing operation between the first sensing bit line pair (SBL1, SBLB1) and the bit line pair (BL, BLB). The sense amplifier 160 turns on the first through fourth switches SW1 through SW4. Here, the first and second sense amplification circuits 410 and 420 are in an off state, and the fifth through eighth switches SW5 through SW8 are also turned off.

The bit line BL and the first sensing bit line SBL1 are connected via the first switch SW1, and the complementary bit line BLB and the first complementary sensing bit line SBLB1 are connected via the second switch SW2, and the bit line BL and the first complementary sensing bit line SBLB1 are connected via the third switch SW3, and the complementary bit line BLB and the first sensing bit line SBL1 are connected via the fourth switch SW4. Charge sharing is generated among a charge stored in the bit line BL, a charge stored in the first complementary sensing bit line SBLB1, a charge stored in the complementary bit line BLB, and a charge stored in the first sensing bit line SBL1.

The bit line BL stores LSB data of a level of the ground voltage VSS, and the first sensing bit line SBL1, the complementary bit line BLB and the first complementary sensing bit line SBLB1 store MSB data of levels of the ground voltage VSS. According to the third charge sharing operation of the sense amplifier 160, the bit line BL, the first sensing bit line SBL1, the complementary bit line BLB, and the first complementary sensing bit line SBLB1 become the level of the ground voltage VSS. A voltage of the bit line BL at the level of the ground voltage VSS is restored in the memory cell MC as a cell voltage Vcell of 0 V.

The sense amplifier 160 described above senses the cell voltage Vcell of 0 V stored in the memory cell MC as MSB and LSB bits "00", and restores the voltage of the bit line BL of 0 V corresponding to the sensed MSB and LSB bits "00" to the memory cell MC as the cell voltage Vcell.

Figure 8:
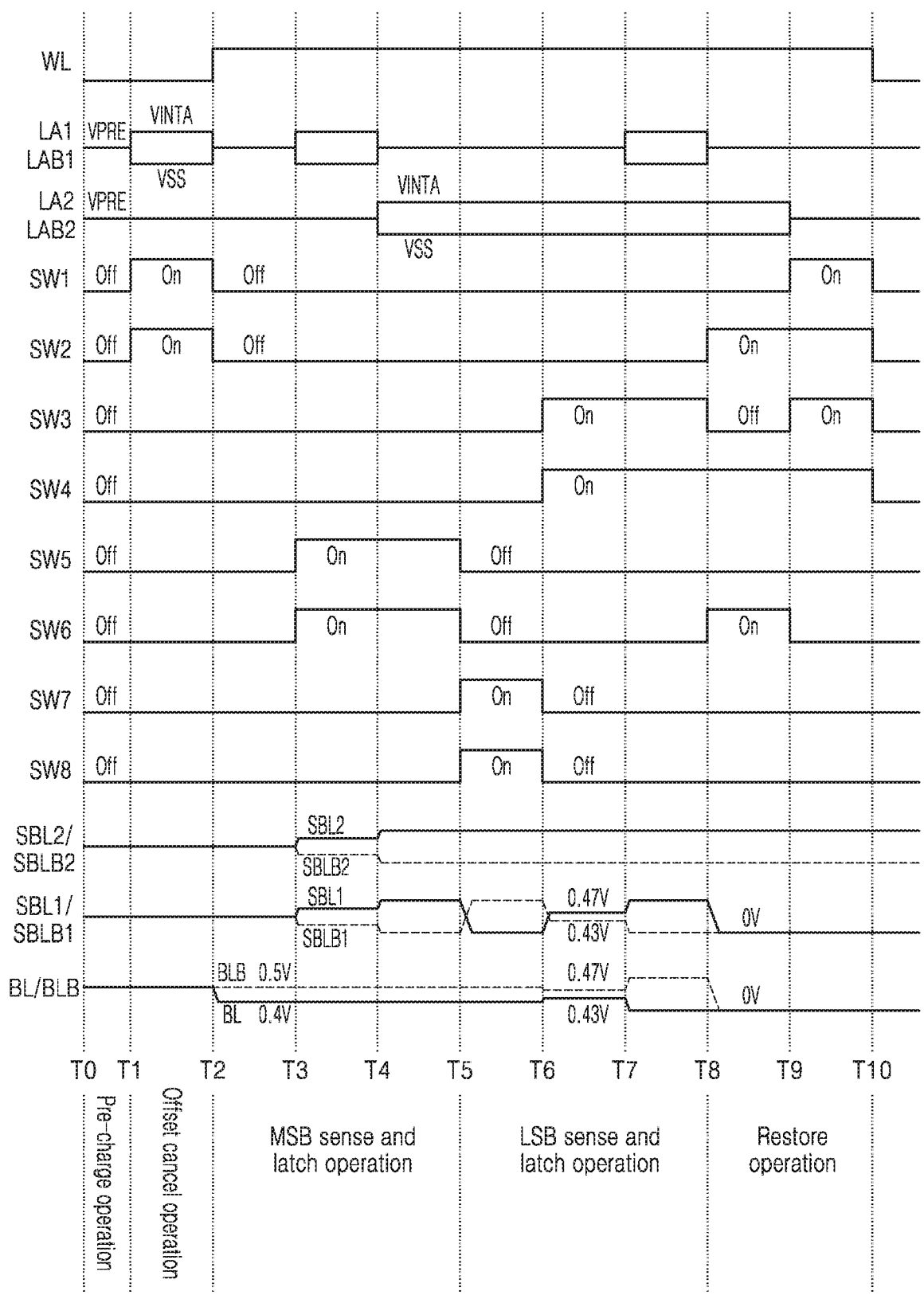
FIG. 8 is a timing diagram illustrating an operation of a sense amplifier sensing a bit combination "00" corresponding to a cell voltage of 0 V stored in a memory cell described with reference to FIGS. 7A through 7J.

FIG. 8 is a timing diagram illustrating an operation of the sense amplifier 160 sensing a bit combination "00" corresponding to a cell voltage Vcell of 0 V described with reference to FIGS. 7A through 7J. An X-axis in FIG. 8 indicates time, and a Y-axis indicates a signal level or whether a switch is turned on or off. Referring now to FIG. 8, the sense amplifier 160 sequentially performs a precharge operation, an offset cancelling operation, an MSB sensing and latching operation, an LSB sensing and latching operation, and a restoring operation.

In a section from T0 to T1, the sense amplifier 160 performs the precharge operation of FIG. 7A. Here, the first sense amplification circuit 410 and the second sense amplification circuit 420 are in an off state, and the first through eighth switches SW1 through SW8 are turned off. A precharge voltage VPRE is applied to the first and second sensing driving signals LA1 and LAB1, and a precharge voltage VPRE is applied to the third and fourth sensing driving signals LA2 and LAB2. The bit line BL, the complementary bit line BLB, the first sensing bit line SBL1, the first complementary sensing bit line SBLB1, the second sensing bit line SBL2, and the second complementary sensing bit line SBLB2 are charged to a precharge voltage VPRE of 0.5 V.

In a section from T1 to T2, the sense amplifier 160 performs the offset cancelling operation of FIG. 7B. Here, the first sense amplification circuit 410 is turned on, the first and second switches SW1 and SW2 are turned on, the second sense amplification circuit 420 is in an off state, and the third through eighth switches SW3 through SW8 are turned off. According to the offset cancelling operation of the sense amplifier 160, the complementary bit line BLB is raised or lowered to a predetermined level compared to the bit line BL such that the bit line BL and the complementary bit line BLB have a difference corresponding to an offset voltage. In the present embodiment, it is assumed that the offset voltage is 0 V in order to focus on a sensing operation of MSB and LSB data to be described later.

In a section between T2 and T5, the sense amplifier 160 performs the MSB sensing and latching operations described in FIGS. 7C through 7E. In a section between T2 and T3, the first charge sharing operation of FIG. 7C is performed. Here, the word line WL connected to the memory cell MC is enabled, the first and second sense amplification circuits 410 and 420 are turned off, and the first through eighth switches SW1 through SW8 are turned off. Accordingly, the voltage level of the bit line BL is reduced from 0.5 V to about 0.4 V, and the complementary bit line BLB is maintained at a level of the precharge voltage VPRE, that is, 0.5 V.

In a section between T3 and T4, the MSB sensing operation of FIG. 7D is performed. Here, the first sense amplification circuit 410 is turned on, the fifth and sixth switches SW5 and SW6 are turned on, the second sense amplification circuit 420 is in an off state, the first through fourth switches SW1 through SW4 and the seventh and eighth switches SW7 and SW8 are turned off. Accordingly, the voltages of the first sensing bit line SBL1 and the second sensing bit line SBL2 are raised to a predetermined level (+Δ), and the voltages of the first complementary sensing bit line SBLB1 and the second complementary sensing bit line SBLB2 are lowered to a predetermined level (−Δ). That is, a voltage difference between the first sensing bit line SBL1 and the first complementary sensing bit line SBLB1 is generated, and a voltage difference between the second sensing bit line SBL2 and the second complementary sensing bit line SBLB2 is generated.

In a section between T4 and T5, the MSB latching operation of FIG. 7E is performed. Here, the second sense amplification circuit 420 is turned on, the fifth and sixth switches SW5 and SW6 are turned on, the first sense amplification circuit 410 is in an off state, the first through fourth switches SW1 through SW4 and the seventh and eighth switches SW7 and SW8 are turned off. Accordingly, the first sensing bit line SBL1 connected to the second sensing bit line SBL2 is raised to the power voltage VINTA, and the first complementary sensing bit line SBLB1 connected to the second complementary sensing bit line SBLB2 is lowered to the ground voltage VSS. The ground voltage VSS of the second complementary sensing bit line SBLB2 is latched as logic 0 as MSB data of the memory cell MC.

In a section between T5 and T8, the sense amplifier 160 performs the LSB sensing and latching operations described in FIGS. 7F through 7H. In a section between T5 and T6, the symmetrical connection operation of symmetrically connecting the first and second sense amplification circuits 410 and 420 described with reference to FIG. 7F is performed. Here, the second sense amplification circuit 420 is turned on, the seventh and eighth switches SW7 and SW8 are turned on, the first sense amplification circuit 410 is in an off state, and the first through sixth switches SW1 through SW6 are turned off. Accordingly, the bit lines of the first sensing bit line pair (SBL1, SBLB1) and the bit lines of the second sensing bit line pair (SBL2, SBLB2) are respectively symmetrically connected. In addition, the second sensing bit line SBL2 and the first complementary sensing bit line SBLB1 are raised to the power voltage VINTA, and the second complementary sensing bit line SBLB2 and the first sensing bit line SBL1 are lowered to the ground voltage VSS. The MSB data of logic 0 latched in the second complementary sensing bit line SBLB2 is transferred to the first sensing bit line SBL1.

In a section from T6 to T7, the second charge sharing operation of FIG. 7G is performed. Here, the second sense amplification circuit 420 is turned on, the third and fourth switches SW3 and SW4 are turned on, the first sense amplification circuit 410 is in an off state, the first and second switches SW1 and SW2 and the fifth through eighth switches SW7 through SW8 are turned off. Accordingly, charge sharing is generated between a charge stored in the bit line BL and a charge stored in the first complementary sensing bit line SBLB1, and charge sharing is generated between a charge stored in the complementary bit line BLB and a charge stored in the first sensing bit line SBL1. Voltage levels of the bit line BL and the first complementary sensing bit line SBLB1 are captured at about 0.43 V, and voltage levels of the complementary bit line BLB and the first sensing bit line SBL1 are captured at about 0.47 V.

In a section between T7 and T8, the LSB sensing operation of FIG. 7H is performed. Here, the first and second sense amplification circuits 410 and 420 are turned on, the third and fourth switches SW3 and SW4 are turned on, and the first and second switches SW1 and SW2 and the fifth to eighth switches SW5 to SW8 are turned off. Accordingly, the first sensing bit line SBL1 and the complementary bit line BLB are raised to the power voltage VINTA, and the first complementary sensing bit line SBLB1 and the bit line BL are reduced to the ground voltage VSS. The level of the ground voltage VSS of the first complementary sensing bit line SBLB1 is sensed as logic 0 as the LSB data of the memory cell MC, and the LSB data of logic 0 is stored in the bit line BL at the level of the ground voltage VSS.

In a section from T8 to T10, the sense amplifier 160 performs a restoring operation described with reference to FIGS. 7I and 7J. In a section between T8 and T9, the dummy cell enable and MSB write operations described with reference to FIG. 7I are performed. At this time, the dummy cells DCs of the dummy cell block 230 are connected to the complementary bit line BLB, the second sense amplification circuit 420 is turned on, and the second, fourth and sixth switches SW2 SW4 and SW6 are turned on, and the first sense amplification circuit 410 is turned off, and the first, third, fifth, seventh and eighth switches SW1, SW3, SW5, SW7 and SW8 are turned off. Accordingly, the MSB data of logic 0 latched in the second complementary sensing bit line SBLB2 is stored in the complementary bit line BLB as data of a level of the ground voltage VSS according to capacitance of the complementary bit line BLB.

In a section from T9 to T10, the third charge sharing operation of FIG. 7J is performed. Here, the first through fourth switches SW1 through SW4 are turned on, the first and second sense amplification circuits 410 and 420 are in an off state, and the fifth through eighth switches SW5 through SW8 are turned off. Accordingly, charge sharing is generated between a charge stored in the bit line BL storing LSB data of a level of the ground voltage VSS and a charge stored in the first complementary sensing bit line SBLB1, the complementary bit line BLB, and the first sensing bit line SBL1 storing MSB data of a level of the ground voltage VSS. The bit line BL, the first sensing bit line SBL1, the complementary bit line BLB, and the first complementary sensing bit line SBLB1 reach the level of the ground voltage VSS. The level of the ground voltage VSS of the bit line BL is restored in the memory cell MC as a cell voltage Vcell of 0 V.

FIGS. 9A through 9J and FIG. 10 are respectively circuit diagrams and a timing diagram illustrating an operation of the sense amplifier 160 sensing a bit combination "01" corresponding to a cell voltage Vcell of 0.33 V stored in the memory cell MC. Hereinafter, description will focus on differences from the embodiment of FIGS. 7A through 7J and FIG. 8.

Figure 9A:
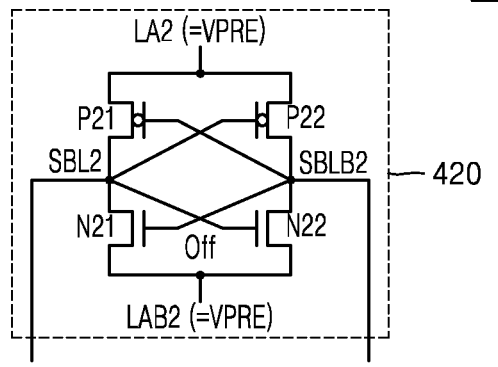
FIGS. 9A through 9J and FIG. 10 are respectively circuit diagrams and a timing diagram illustrating an operation of a sense amplifier sensing a bit combination "01" corresponding to a cell voltage of 0.33 V stored in a memory cell.
Figure 9A:
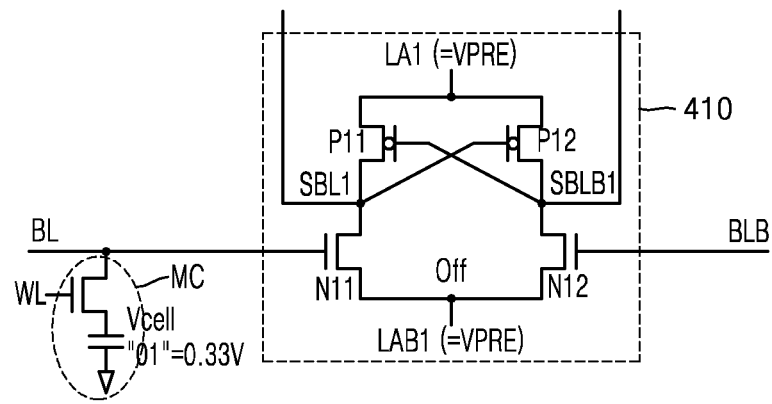

Referring to FIG. 9A, in a section from T0 to T1, when the first sense amplification circuit 410 and the second sense amplification circuit 420 are in an off state, and the first through eighth switches SW1 through SW8 are turned off, the sense amplifier 160 precharges the bit line BL, the complementary bit line BLB, the first sensing bit line SBL1, the first complementary sensing bit line SBLB1, the second sensing bit line SBL2, the second complementary sensing bit line SBLB2, the first and second sensing driving signals LA1 and LAB1, and the third and fourth sensing driving signals LA2 and LAB2 to a precharge voltage VPRE.

Figure 9B:
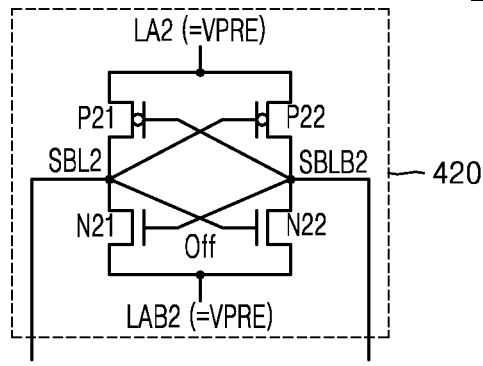
Figure 9B:
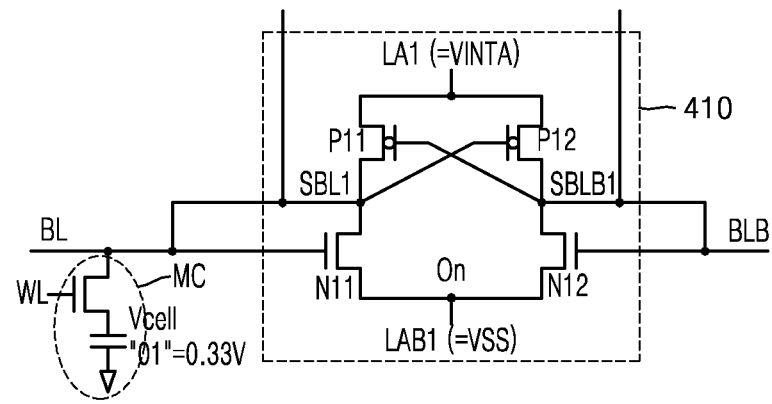
Figure 10:
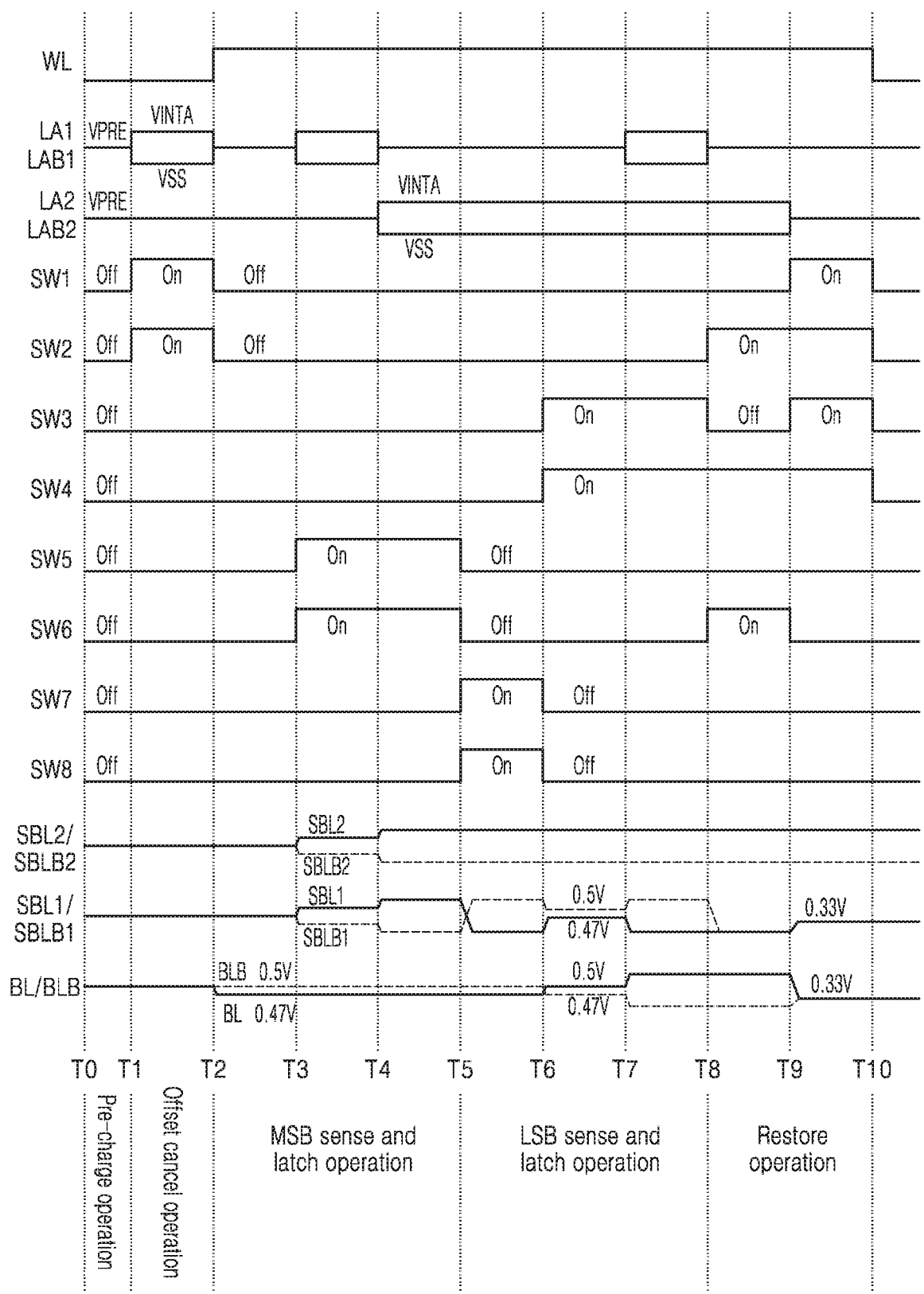

Referring to FIG. 9B, in a section from T1 to T2 of FIG. 10, when the first sense amplification circuit 410 is turned on, the first and second switches SW1 and SW2 are turned on, and the second sense amplification circuit 420 is in an off state, and the third through eighth switches SW3 through SW8 are turned off, the sense amplifier 160 performs an offset cancelling operation.

Figure 9C:
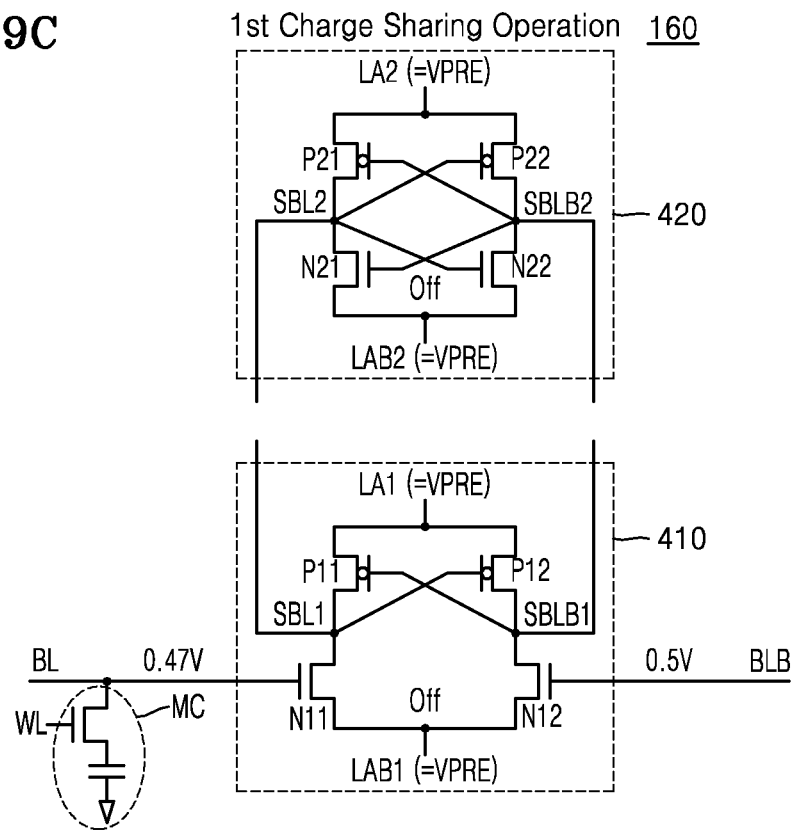

Referring to FIG. 9C, in a section from T2 to T3 of FIG. 10, when the word line WL connected to the memory cell MC is enabled, and the first and second sense amplification circuits 410 and 420 are turned off, and the first through eighth switches SW1 through SW8 are turned off, the sense amplifier 160 performs a first charge sharing operation. According to the first charge sharing operation, a voltage level of the bit line BL is reduced from 0.5 V to about 0.47 V, and the complementary bit line BLB maintains a level of the precharge voltage VPRE, that is, 0.5 V.

Figure 9D:
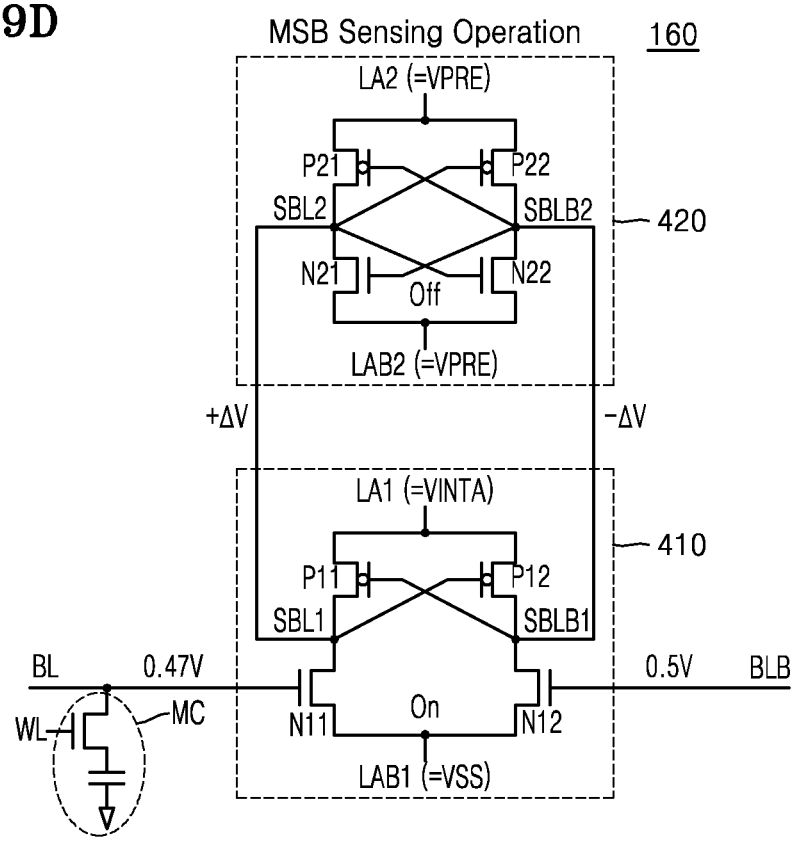

Referring to FIG. 9D, in a section from T3 to T4 of FIG. 10, when the first sense amplification circuit 410 is turned on, the fifth and sixth switches SW5 and SW6 are turned on, the second sense amplification circuit 420 is turned off, and the first through fourth switches SW1 through SW4 and the seventh and eighth switches SW7 and SW8 are turned off, the sense amplifier 160 performs an MSB sensing operation. The first sense amplification circuit 410 senses a voltage difference between a voltage of the bit line BL of 0.47 V and a voltage of the complementary bit line BLB of 0.5 V that are respectively applied to gates of the first and second NMOS transistors N11 and N12 to raise voltages of the first sensing bit line SBL1 and the second sensing bit line SBL2 to a predetermined level (+Δ) and reduce voltages of the first complementary sensing bit line SBLB1 and the second complementary sensing bit line SBLB2 to a predetermined level (-Δ).

Figure 9E:
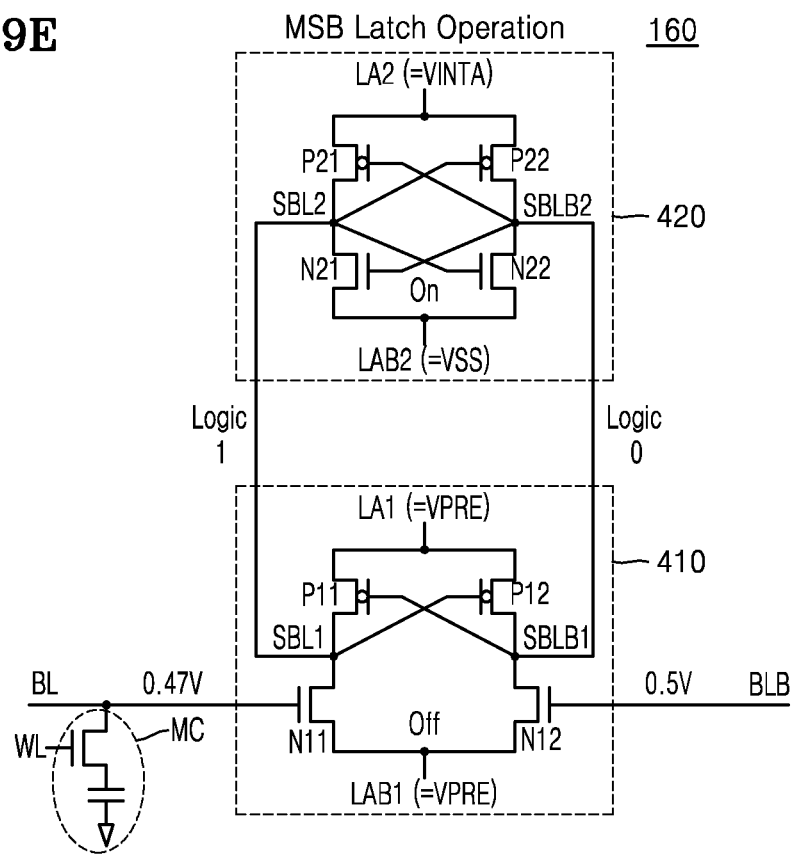

Referring to FIG. 9E, in a section from T4 to T5, when the second sense amplification circuit 420 is turned on, and the fifth and sixth switches SW5 and SW6 are turned on, the first sense amplification circuit 410 is in an off state, and the first through fourth switches SW1 through SW4 and the seventh and eighth switches SW7 and SW8 are turned off, the sense amplifier 160 performs an MSB latching operation. Via the second sense amplification circuit 420, the second sensing bit line SBL2 and the first sensing bit line SBL1 are raised to the power voltage VINTA, and the second complementary sensing bit line SBLB2 and the first complementary sensing bit line SBLB1 are reduced to the ground voltage VSS. The ground voltage VSS of the second complementary sensing bit line SBLB2 is latched to logic 0 as MSB data of the memory cell MC.

Figure 9F:
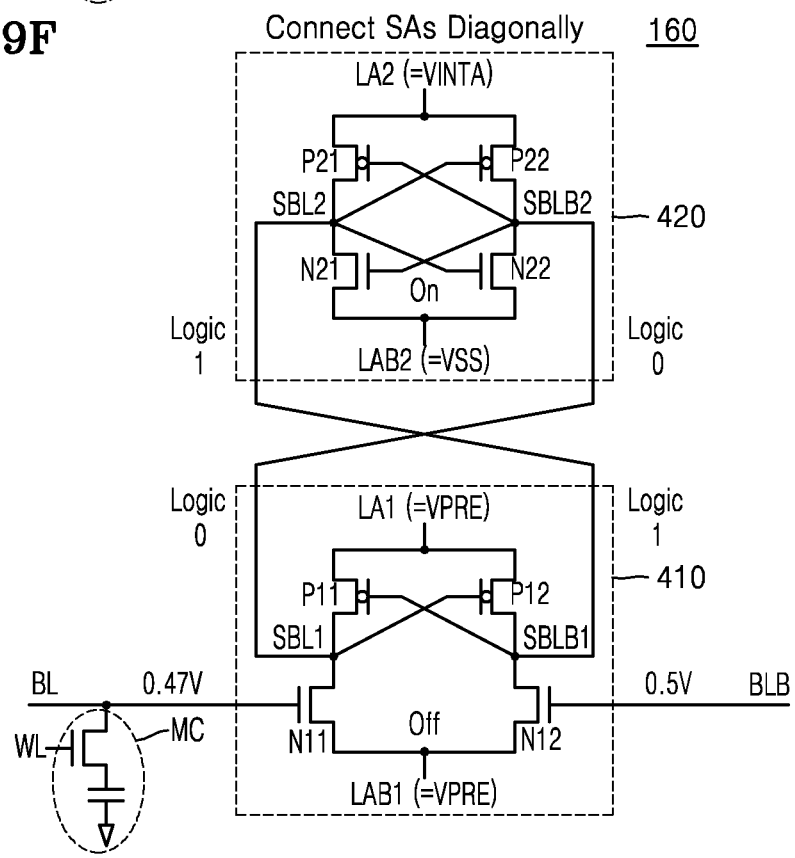

Referring to FIG. 9F, in a section from T5 to T6 of FIG. 10, when the second sense amplification circuit 420 is turned on, the seventh and eighth switches SW7 and SW8 are turned on, the first sense amplification circuit 410 is turned off, and the first through sixth switches SW1 through SW6 are turned off, the sense amplifier 160 performs a symmetrical connection operation of symmetrically connecting the first and second sense amplification circuits 410 and 420. The bit lines of the first sensing bit line pair (SBL1, SBLB1) and the bit lines of the second sensing bit line pair (SBL2, SBLB2) are respectively symmetrically connected. Via the second sense amplification circuit 420, the second sensing bit line SBL2 and the first complementary sensing bit line SBLB1 are raised to the power voltage VINTA, and the second complementary sensing bit line SBLB2 and the first sensing bit line SBL1 are reduced to the ground voltage VSS.

Figure 9G:
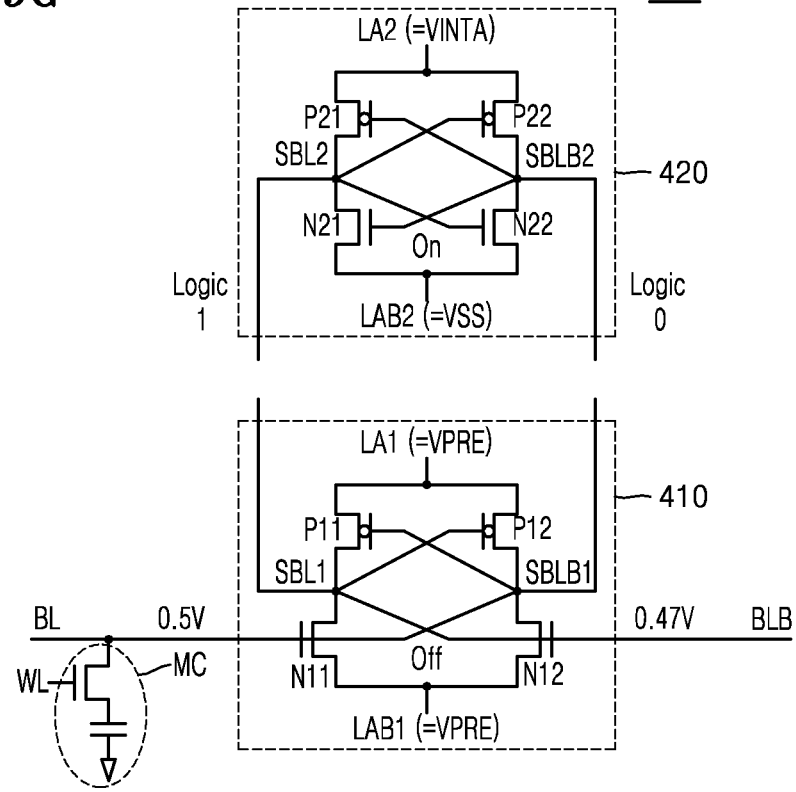

Referring to FIG. 9G, in a section from T6 to T7 of FIG. 10, when the second sense amplification circuit 420 is turned on, the third and fourth switches SW3 and SW4 are turned on, the first sense amplification circuit 410 is turned off, and the first and second switches SW1 and SW2 and the fifth through eighth switches SW5 through SW8 are turned off, the sense amplifier 160 performs a second charge sharing operation. According to the second charge sharing operation, voltage levels of the bit line BL and the first complementary sensing bit line SBLB1 are captured at about 0.5 V, and voltage levels of the complementary bit line BLB and the first sensing bit line SBL1 are captured at about 0.47 V.

Figure 9H:
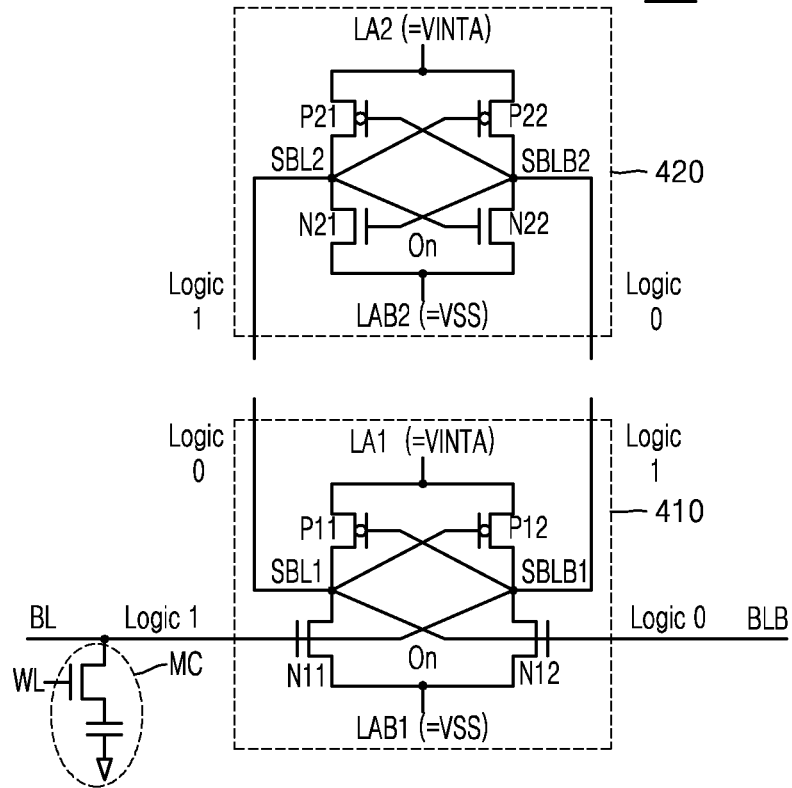

Referring to FIG. 9H, in a section T7 to T8 of FIG. 10, when the first and second sense amplification circuits 410 and 420 are turned on, the third and fourth switches SW3 and SW4 are turned on, and the first and second switches SW1 and SW2 and the fifth through eighth switches SW5 through SW8 are turned off, the sense amplifier 160 performs an LSB sensing operation. Via the first sense amplification circuit 410, the first sensing bit line SBL1 and the complementary bit line BLB are reduced up to the ground voltage VSS, and the first complementary sensing bit line SBLB1 and the bit line BL are raised up to the power voltage VINTA. A level of the power voltage VINTA of the first complementary sensing bit line SBLB1 is sensed as logic 1 as LSB data of the memory cell MC, and the LSB data of logic 1 is stored in the bit line BL.

Figure 9I:
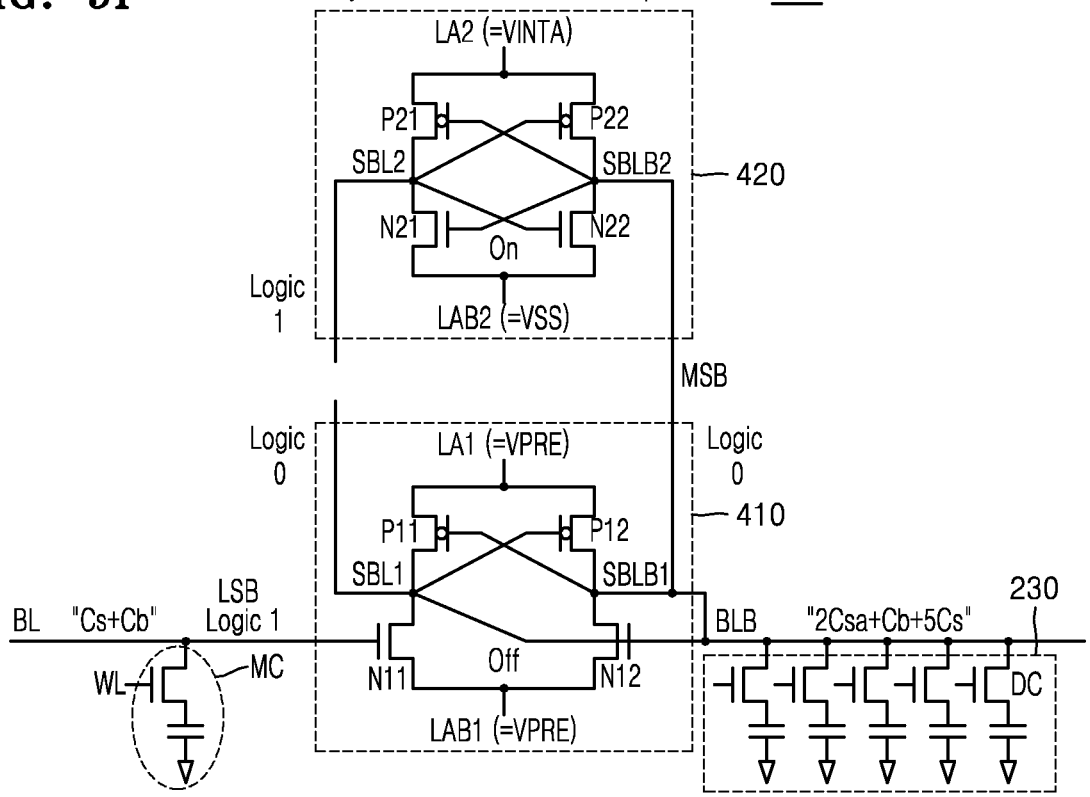

Referring to FIG. 9I, in a section from T8 to T9 of FIG. 10, when the dummy cells DCs of the dummy cell block 230 are connected to the complementary bit line BLB, the second sense amplification circuit 420 is turned on, the second, fourth, and sixth switches SW2, SW4, and SW6 are turned on, the first sense amplification circuit 410 is in an off state, and the first, third, fifth, seventh, and eighth switches SW1, SW3, SW5, SW7, and SW8 are turned off, the sense amplifier 160 performs dummy cell enable and MSB write operations. Via the second sense amplification circuit 420, MSB data of logic 0 latched in the second complementary sensing bit line SBLB2 is stored in the complementary bit line BLB as data of a level of the ground voltage VSS according to capacitance of the complementary bit line BLB.

Figure 9J:
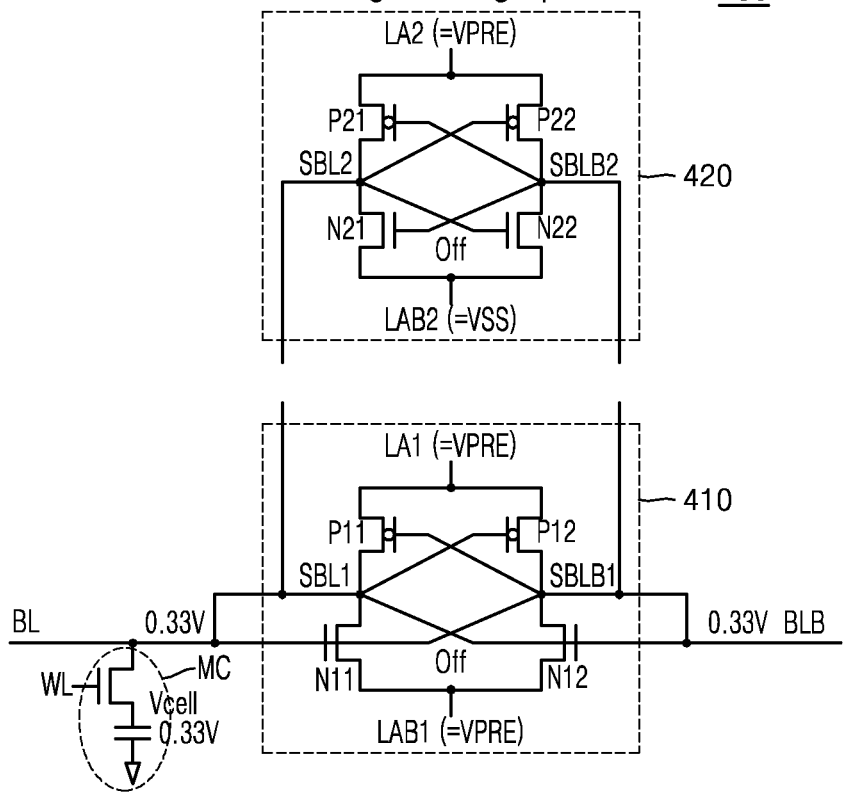

Referring to FIG. 9J, in a section from T9 to T10 of FIG. 10, when the first through fourth switches SW1 through SW4 are turned on, and the first and second sense amplification circuits 410 and 420 are turned off, and the fifth through eighth switches SW5 through SW8 are turned off, the sense amplifier 160 performs a third charge sharing operation. The third charge sharing is generated between a charge stored in the bit line BL storing LSB data of a level of the power voltage VINTA and a charge stored in the first complementary sensing bit line SBLB1, the complementary bit line BLB, and the first sensing bit line SBL1 storing MSB data of a level of the ground voltage VSS. According to the third charge sharing operation, the bit line BL is raised from the level of the ground voltage VSS to 0.33 V, and a voltage of the bit line BL of 0.33 V is restored in the memory cell MC as a cell voltage Vcell.

The sense amplifier 160 described above senses the cell voltage Vcell of 0.33 V stored in the memory cell MC as MSB and LSB bits "01", and restores the voltage of the bit line BL of 0.33 V corresponding to the sensed MSB and LSB bits "01" to the memory cell MS as a cell voltage Vcell.

FIGS. 11A through 11J and FIG. 12 are respectively circuit diagrams and a timing diagram illustrating an operation of the sense amplifier 160 sensing a bit combination "10" corresponding to a cell voltage Vcell of 0.67 V stored in the memory cell MC. Hereinafter, description will focus on differences from the embodiment of FIGS. 7A through 7J and FIG. 8.

Figure 11A:
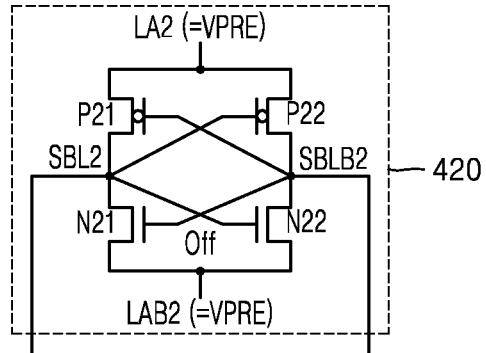
FIGS. 11A through 11J and FIG. 12 are respectively circuit diagrams and a timing diagram illustrating an operation of a sense amplifier sensing a bit combination "10" corresponding to a cell voltage of 0.67 V stored in a memory cell.
Figure 11A:
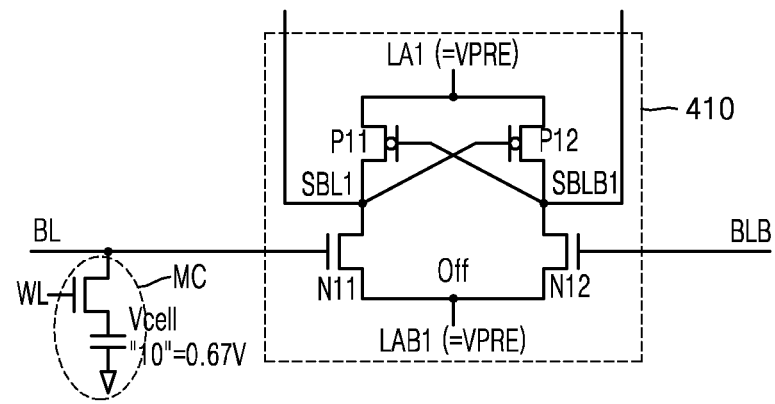
Figure 12:
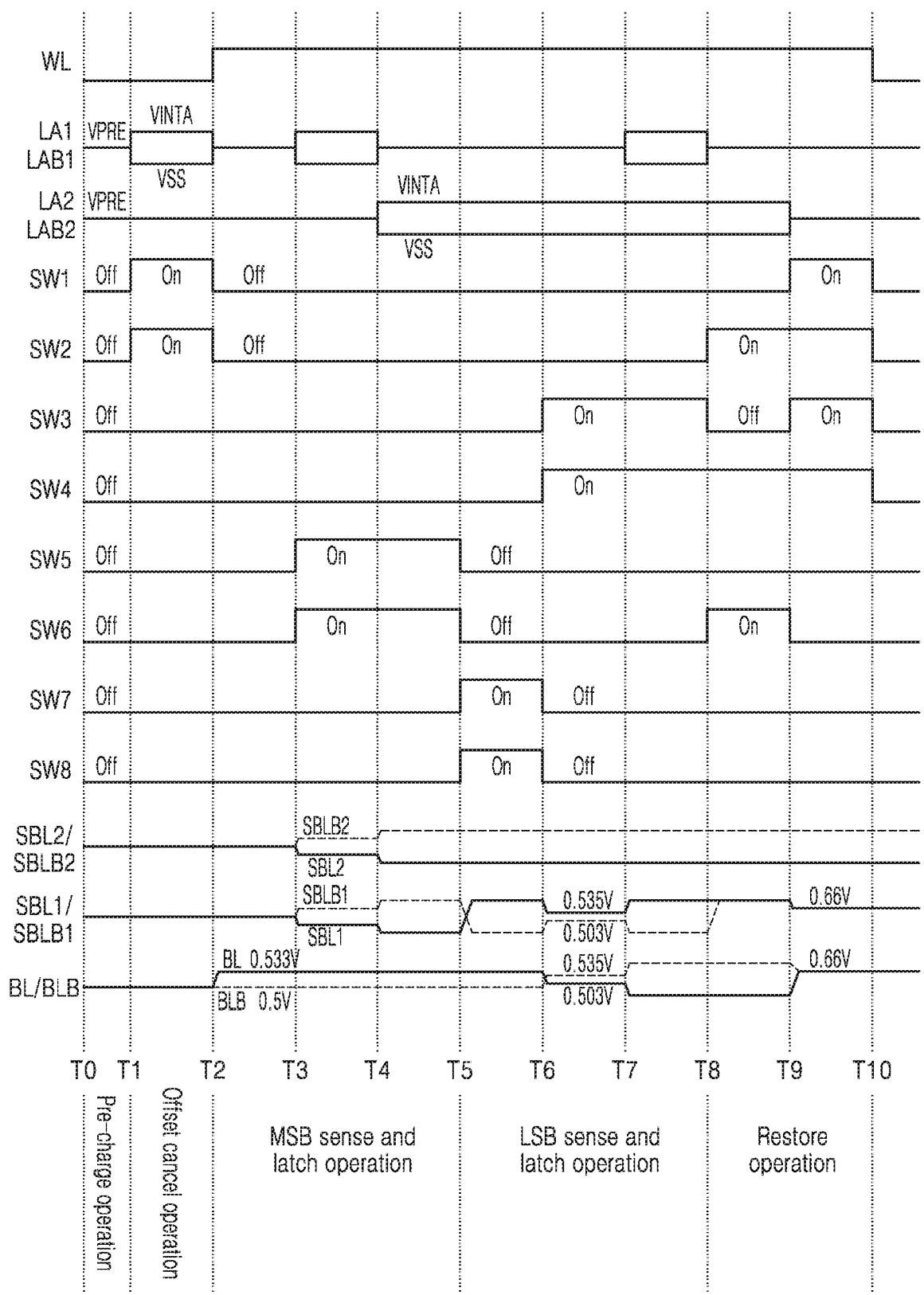

Referring to FIG. 11A, in a section from T0 to T1 of FIG. 12, when the first sense amplification circuit 410 and the second sense amplification circuit 420 are turned off, and the first through eighth switches SW1 through SW8 are turned off, the sense amplifier 160 precharges the bit line BL, the complementary bit line BLB, the first sensing bit line SBL1, the first complementary sensing bit line SBLB1, the second sensing bit line SBL2, the second complementary sensing bit line SBLB2, the first and second sensing driving signals LA1 and LAB1, and the third and fourth sensing driving signals LA2 and LAB2 to a precharge voltage VPRE.

Figure 11B:
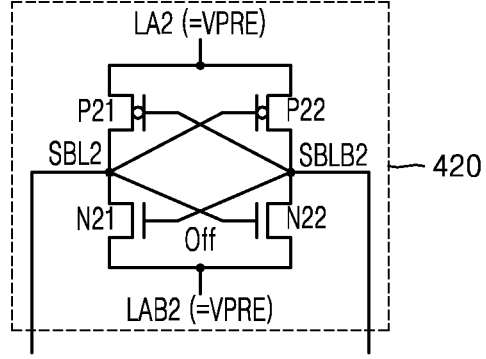
Figure 11B:
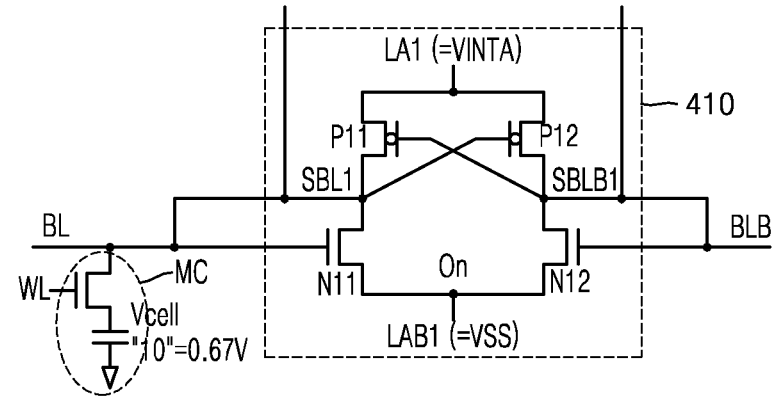

Referring to FIG. 11B, in a section from T1 to T2 of FIG. 12, when the first sense amplification circuit 410 is turned on, the first and second switches SW1 and SW2 are turned off, the second sense amplification circuit 420 is in an off state, and the third through eighth switches SW3 through SW8 are turned off, the sense amplifier 160 performs an offset cancelling operation.

Figure 11C:
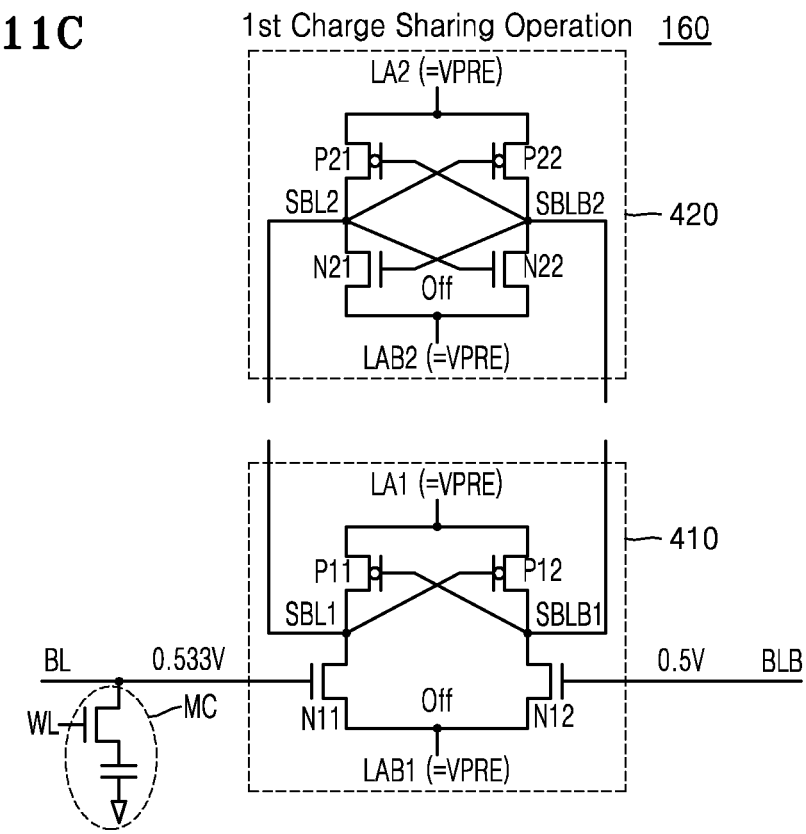

Referring to FIG. 11C, in a section from T2 to T3 of FIG. 12, when the word line WL connected to the memory cell MC is enabled, and the first and second sense amplification circuits 410 and 420 are turned off, and the first through eighth switches SW1 through SW8 are turned off, the sense amplifier 160 performs a first charge sharing operation. According to the first charge sharing operation, a voltage level of the bit line BL is raised from 0.5 V to about 0.533 V, and the complementary bit line BLB is maintained at a level of the precharge voltage VPRE, that is, 0.5 V.

Figure 11D:
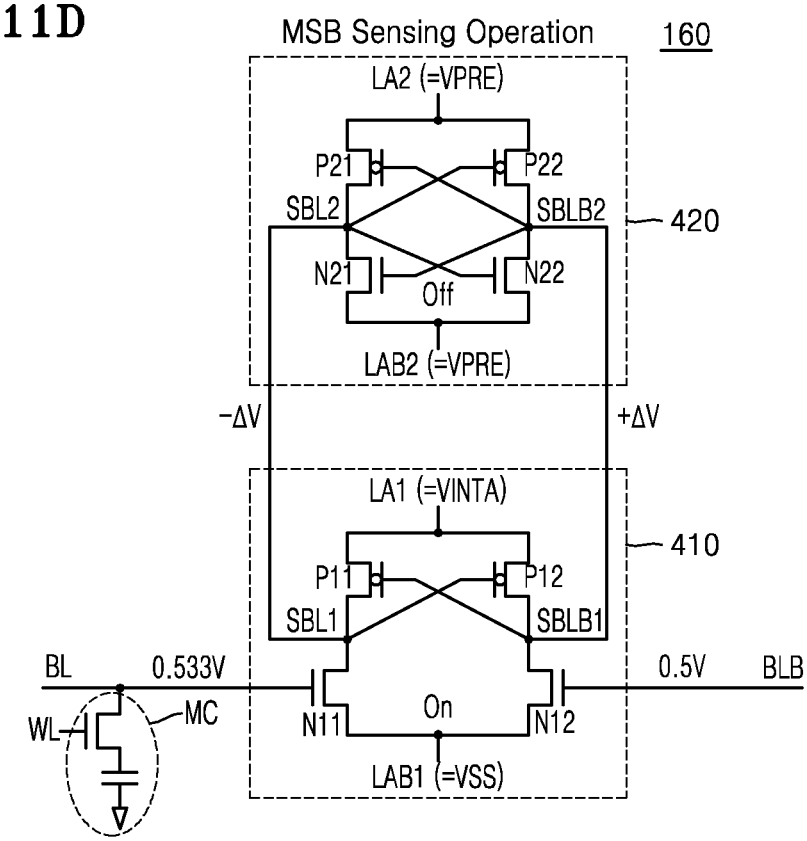

Referring to FIG. 11D, in a section from T3 to T4 of FIG. 12, when the first sense amplification circuit 410 is turned on, the fifth and sixth switches SW5 and SW6 are turned on, the second sense amplification circuit 420 is in an off state, and the first through fourth switches SW1 through SW4 and the seventh and eighth switches SW7 and SW8 are turned off, the sense amplifier 160 performs an MSB sensing operation. The first sense amplification circuit 410 senses a voltage difference between a voltage of the bit line BL of 0.533 V and a voltage of the complementary bit line BLB of 0.5 V that are respectively applied to gates of the first and second NMOS transistors N11 and N12 to reduce voltages of the first sensing bit line SBL1 and the second sensing bit line SBL2 to a predetermined level (−Δ), and raise voltages of the first complementary sensing bit line SBLB1 and the second complementary sensing bit line SBLB2 to a predetermined level (+Δ).

Figure 11E:
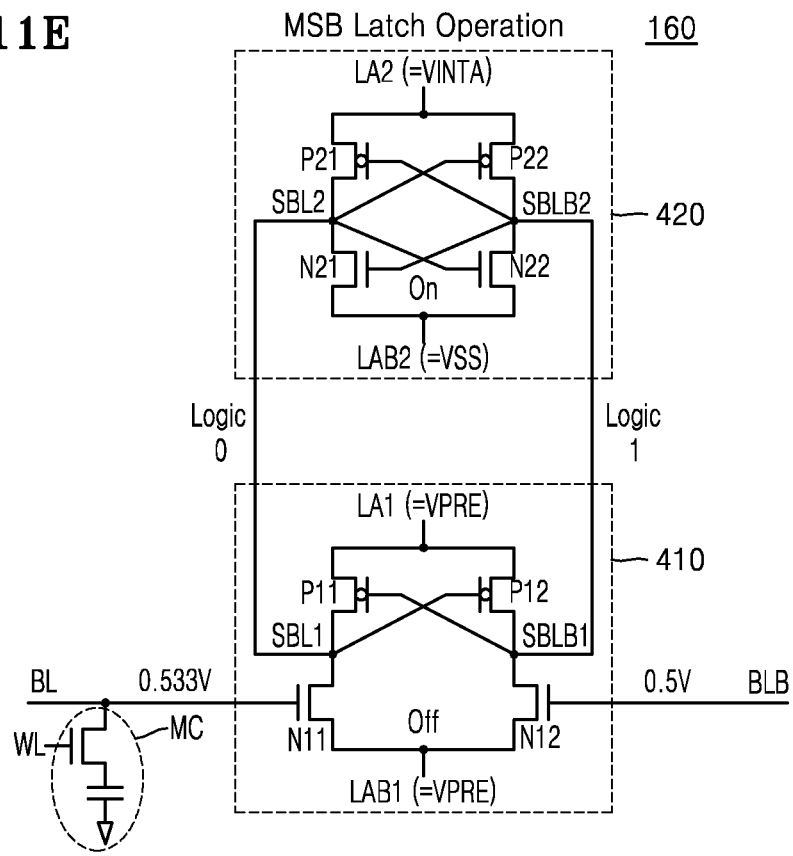

Referring to FIG. 11E, in a section from T3 to T4 of FIG. 12, when the second sense amplification circuit 420 is turned on, the fifth and sixth switches SW5 and SW6 are turned on, the first sense amplification circuit 410 is in an off state, and the first through fourth switches SW1 through SW4 and the seventh and eighth switches SW7 and SW8 are turned off, the sense amplifier 160 performs an MSB latching operation. Via the second sense amplification circuit 420, the second sensing bit line SBL2 and the first sensing bit line SBL1 are reduced up to the ground voltage VSS, and the second complementary sensing bit line SBLB2 and the first complementary sensing bit line SBLB1 are raised up to the power voltage VINTA. The power voltage VINTA of the second complementary sensing bit line SBLB2 is latched to logic 1 as MSB data of the memory cell MC.

Figure 11F:
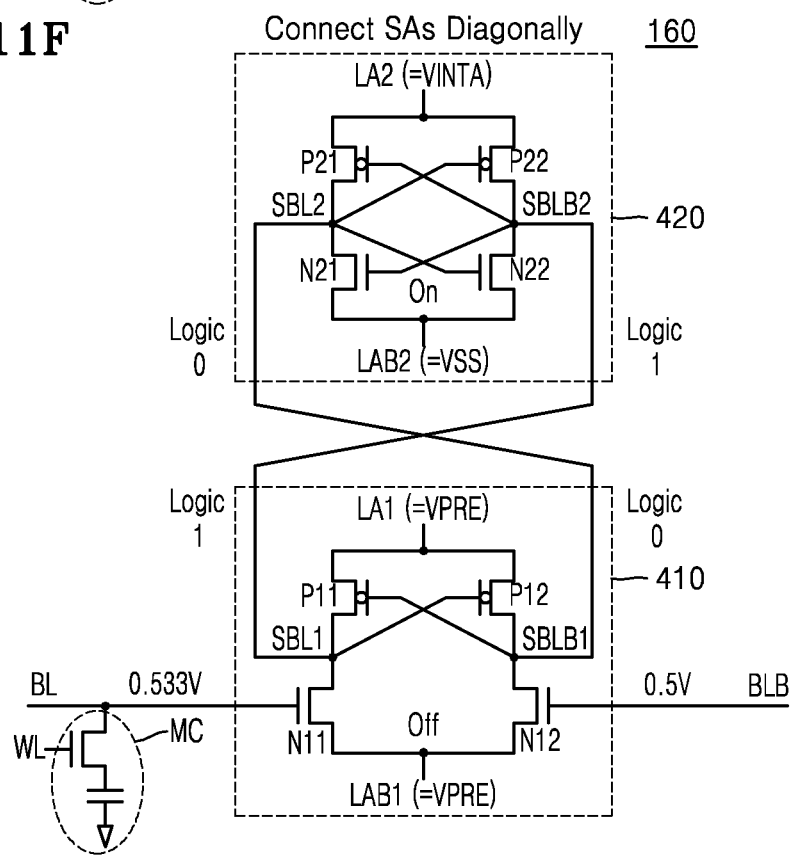

Referring to FIG. 11F, in a section from T5 to T6 of FIG. 12, when the second sense amplification circuit 420 is turned on, the seventh and eighth switches SW7 and SW8 are turned on, the first sense amplification circuit 410 is in an off state, and the first through sixth switches SW1 through SW6 are turned off, the sense amplifier 160 performs a symmetrical connection operation of symmetrically connecting the first and second sense amplification circuits 410 and 420. The bit lines of the first sensing bit line pair (SBL1, SBLB1) and the bit lines of the second sensing bit line pair (SBL2, SBLB2) are respectively symmetrically connected. Via the second sense amplification circuit 420, the second sensing bit line SBL2 and the first complementary sensing bit line SBLB1 are reduced up to the ground voltage VSS, and the second complementary sensing bit line SBLB2 and the first sensing bit line SBL1 are raised up to the power voltage VINTA.

Figure 11G:
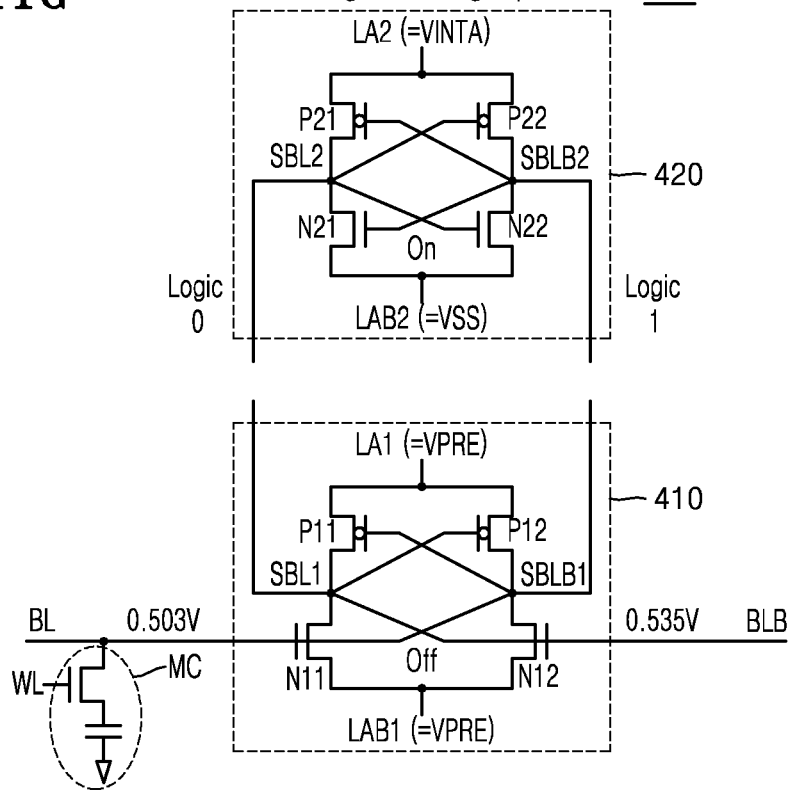

Referring to FIG. 11G, in a section from T6 to T7 of FIG. 12, when the second sense amplification circuit 420 is turned on, the third and fourth switches SW3 and SW4 are turned on, the first sense amplification circuit 410 is turned off, and the first and second switches SW1 and SW2 and the fifth through eighth switches SW5 through SW8 are turned off, the sense amplifier 160 performs a second charge sharing operation. According to the second charge sharing operation, voltage levels of the bit line BL and the first complementary sensing bit line SBLB1 are captured at about 0.503 V, and voltage levels of the complementary bit line BLB and the first sensing bit line SBL1 are captured at about 0.535 V.

Figure 11H:
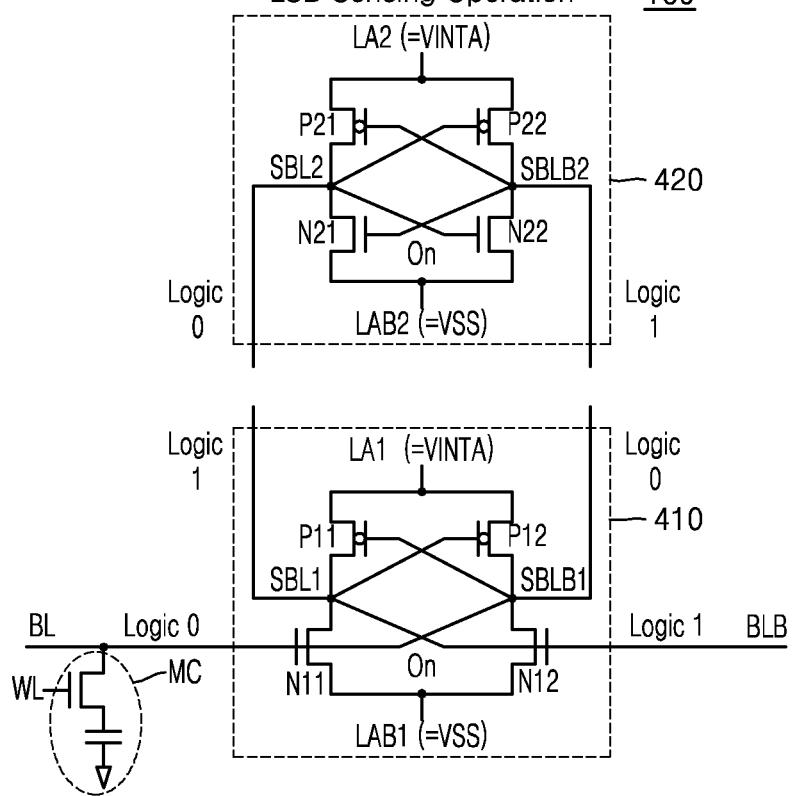

Referring to FIG. 11H, in a section from T7 to T8 of FIG. 12, when the first and second sense amplification circuits 410 and 420 are turned on, the third and fourth switches SW3 and SW4 are turned on, and the first and second switches SW1 and SW2 and the fifth through eighth switches SW5 through SW8 are turned off, the sense amplifier 160 performs an LSB sensing operation. Via the first sense amplification circuit 410, the first sensing bit line SBL1 and the complementary bit line BLB are raised up to the power voltage VINTA, and the first complementary sensing bit line SBLB1 and the bit line BL are reduced up to the ground voltage VSS. A level of the ground voltage VSS of the first complementary sensing bit line SBLB1 is sensed as logic 0 as LSB data of the memory cell MC, and the LSB data of logic 0 is stored in the bit line BL.

Figure 11I:
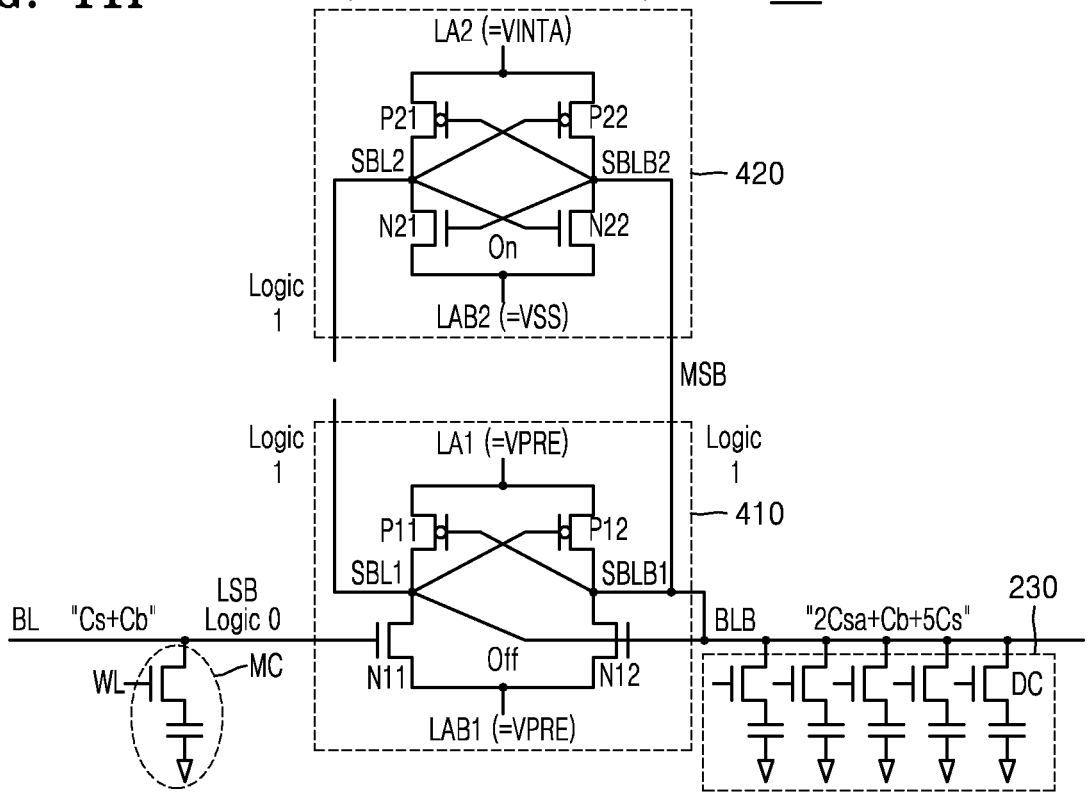

Referring to FIG. 11I, in a section from T8 to T9 of FIG. 12, when the dummy cells DCs of the dummy cell block 230 are connected to the complementary bit line BLB, the second sense amplification circuit 420 is turned on, the second, fourth, and sixth switches SW2, SW4, and SW6 are turned on, the first sense amplification circuit 410 is in an off state, and the first, third, fifth, seventh, and eighth switches SW1, SW3, SW5, SW7, and SW8 are turned off, the sense amplifier 160 performs dummy cell enable and MSB write operations. Via the second sense amplification circuit 420, the MSB data of logic 1 latched in the second complementary sensing bit line SBLB2 is stored in the complementary bit line BLB as data of a level of the power voltage VINTA according to capacitance of the complementary bit line BLB.

Figure 11J:
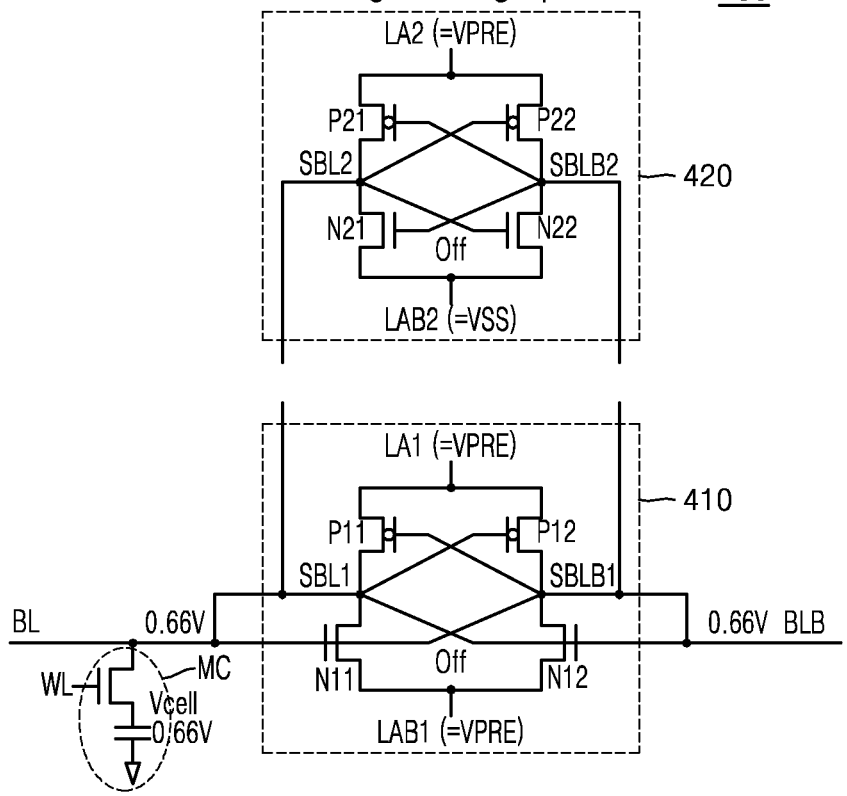

Referring to FIG. 11J, in a section from T9 to T10 of FIG. 12, when the first through fourth switches SW1 through SW4 are turned on, and the first and second sense amplification circuits 410 and 420 are turned off, and the fifth through eighth switches SW5 through SW8 are turned off, the sense amplifier 160 performs a third charge sharing operation. A third charge sharing operation is generated between a charge stored in the bit line BL storing LSB data of a level of the power voltage VINTA and a charge stored in the first complementary sensing bit line SBLB1, the complementary bit line BLB, and the first sensing bit line SBL1 storing MSB data of a level of the ground voltage VSS. According to the third charge sharing operation, the bit line BL is raised from the level of the ground voltage VSS to 0.66 V, and a voltage of the bit line BL of 0.66 V is restored in the memory cell MC as a cell voltage Vcell.

The sense amplifier 160 described above senses the cell voltage Vcell of 0.67 V stored in the memory cell MC as MSB and LSB bits "10", and restores the voltage of the bit line BL of 0.66 V corresponding to the sensed MSB and LSB bits "10" to the memory cell MC as the cell voltage Vcell.

FIGS. 13A through 13J and FIG. 14 are respectively circuit diagrams and a timing diagram illustrating an operation of the sense amplifier 160 sensing a bit combination "11" corresponding to a cell voltage Vcell of 1.0 V stored in the memory cell MC. Hereinafter, the description will focus on differences from the embodiment of FIGS. 7A through 7J and FIG. 8.

Figure 13A:
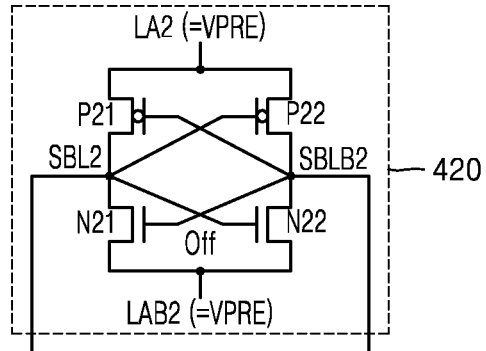
FIGS. 13A through 13J and FIG. 14 are respectively circuit diagrams and a timing diagram illustrating an operation of a sense amplifier sensing a bit combination "11" corresponding to a cell voltage of 1.0 V stored in a memory cell.
Figure 13A:
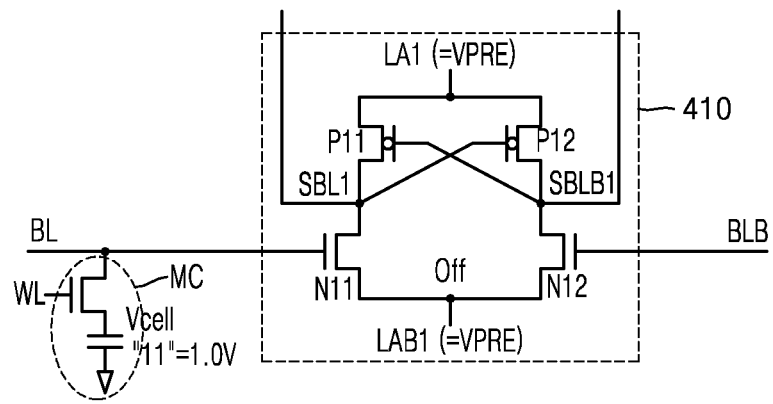
Figure 14:
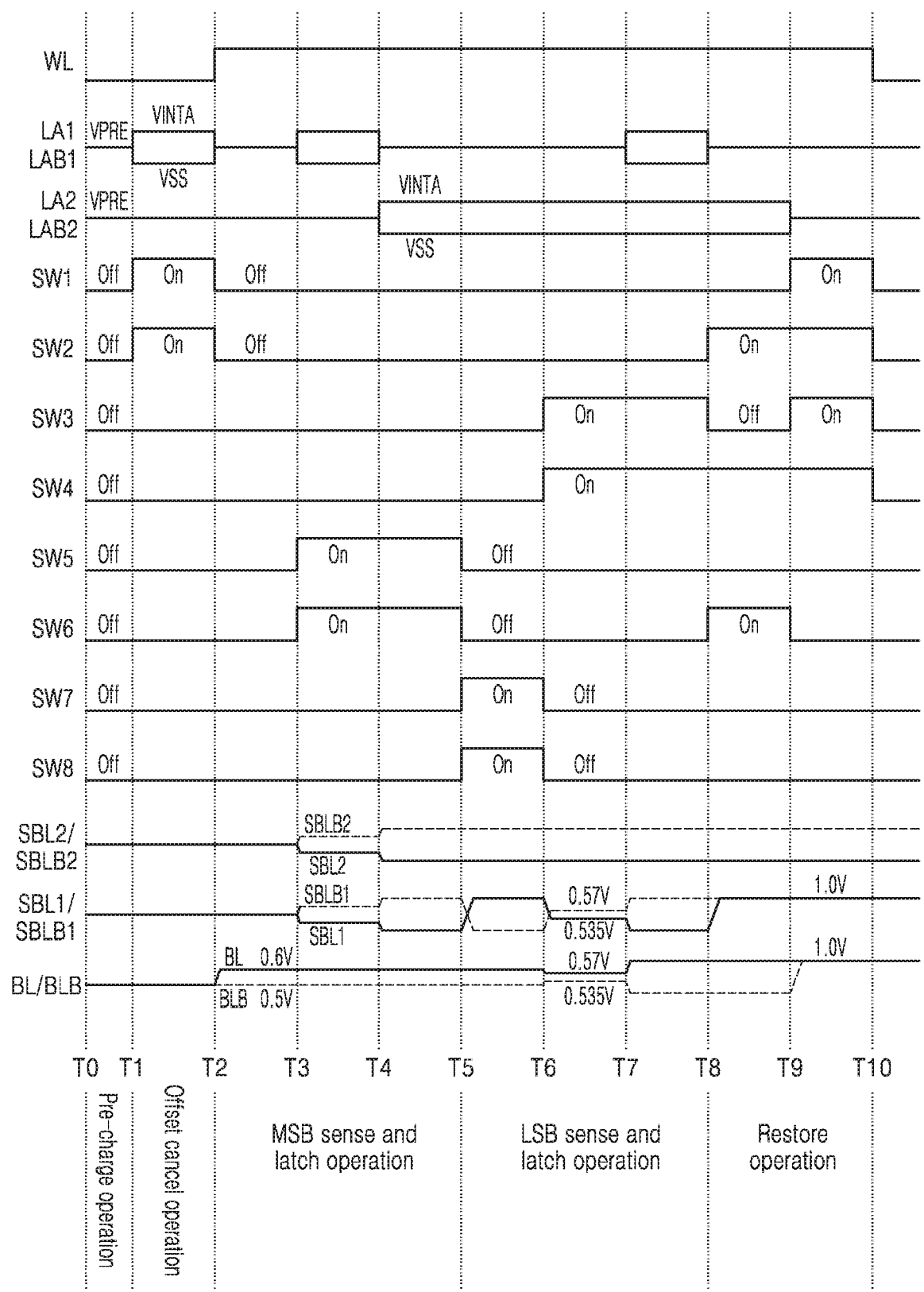

Referring to FIG. 13A, in a section from T0 to T1 of FIG. 14, when the first sense amplification circuit 410 and the second sense amplification circuit 420 are turned off and the first through eighth switches SW1 through SW8 are turned off, the sense amplifier 160 precharges the bit line BL, the complementary bit line BLB, the first sensing bit line SBL1, the first complementary sensing bit line SBLB1, the second sensing bit line SBL2, the second complementary sensing bit line SBLB2, the first and second sensing driving signals LA1 and LAB1, and the third and fourth sensing driving signals LA2 and LAB2 to a precharge voltage VPRE.

Figure 13B:
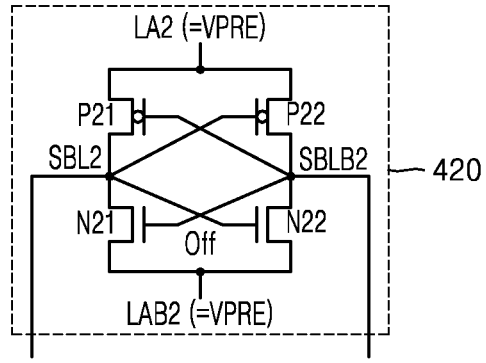
Figure 13B:
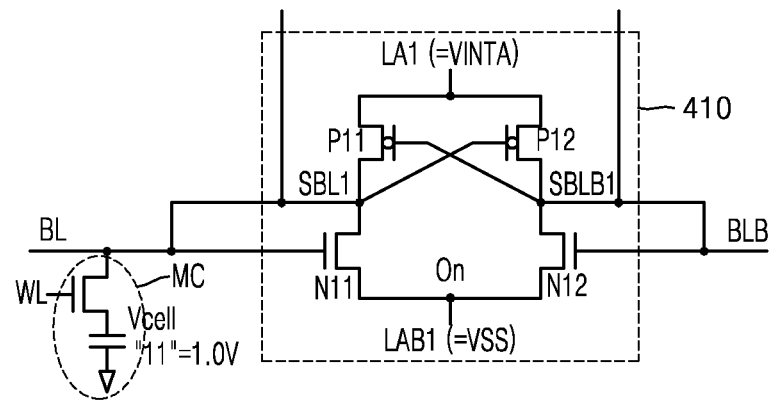

Referring to FIG. 13B, in a section from T1 to T2 of FIG. 4, when the first sense amplification circuit 410 is turned on, the first and second switches SW1 and SW2 are turned off, the second sense amplification circuit 420 is in an off state, and the third through eighth switches SW3 through SW8 are turned off, the sense amplifier 160 performs an offset cancelling operation.

Figure 13C:
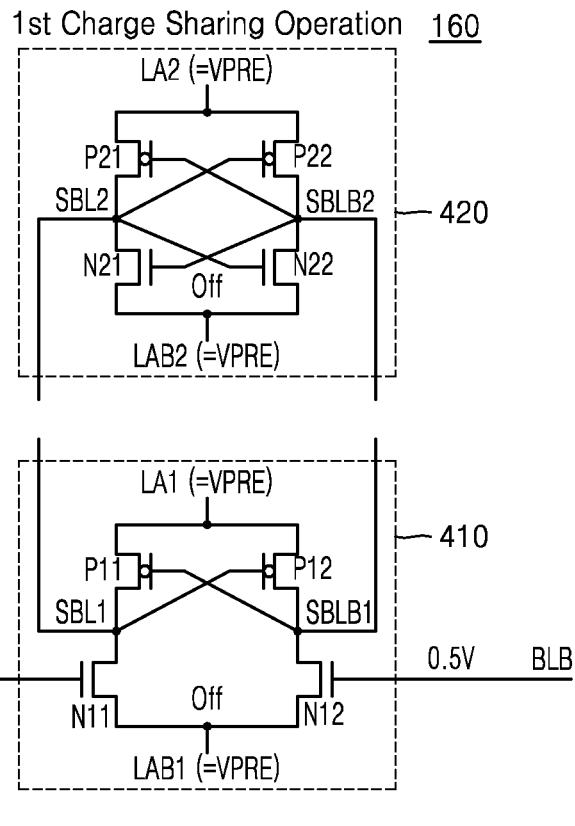

Referring to FIG. 13C, in a section from T2 to T3 of FIG. 14, when the word line WL connected to the memory cell MC is enabled, and the first and second sense amplification circuits 410 and 420 are turned off, and the first through eighth switches SW1 through SW8 are turned off, the sense amplifier 160 performs a first charge sharing operation. According to the first charge sharing operation, a voltage level of the bit line BL is raised from 0.5 V to about 0.6 V, and the complementary bit line BLB is maintained at a level of the precharge voltage VPRE, that is, 0.5 V.

Figure 13D:
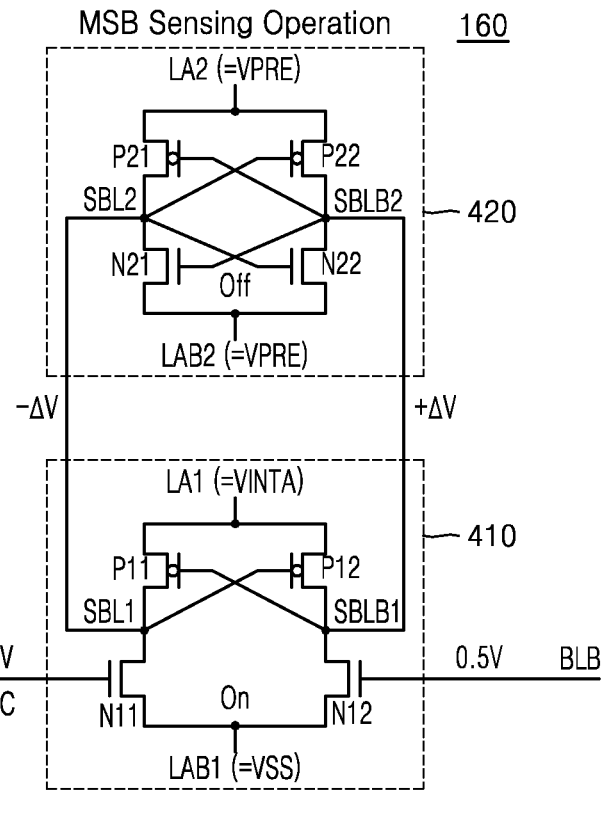

Referring to FIG. 13D, in a section from T3 to T4 of FIG. 14, when the first sense amplification circuit 410 is turned on, the fifth and sixth switches SW5 and SW6 are turned on, the second sense amplification circuit 420 is turned off, and the first through fourth switches SW1 through SW4 and the seventh and eighth switches SW7 and SW8 are turned off, the sense amplifier 160 performs an MSB sensing operation. The first sense amplification circuit 410 senses a voltage difference between a voltage of the bit line BL of 0.6 V and a voltage of the complementary bit line BLB of 0.5 V that are respectively applied to gates of the first and second NMOS transistors N11 and N12 to reduce voltages of the first sensing bit line SBL1 and the second sensing bit line SBL2 to a predetermined level (−Δ), and raise voltages of the first complementary sensing bit line SBLB1 and the second complementary sensing bit line SBLB2 to a predetermined level (+Δ).

Figure 13E:
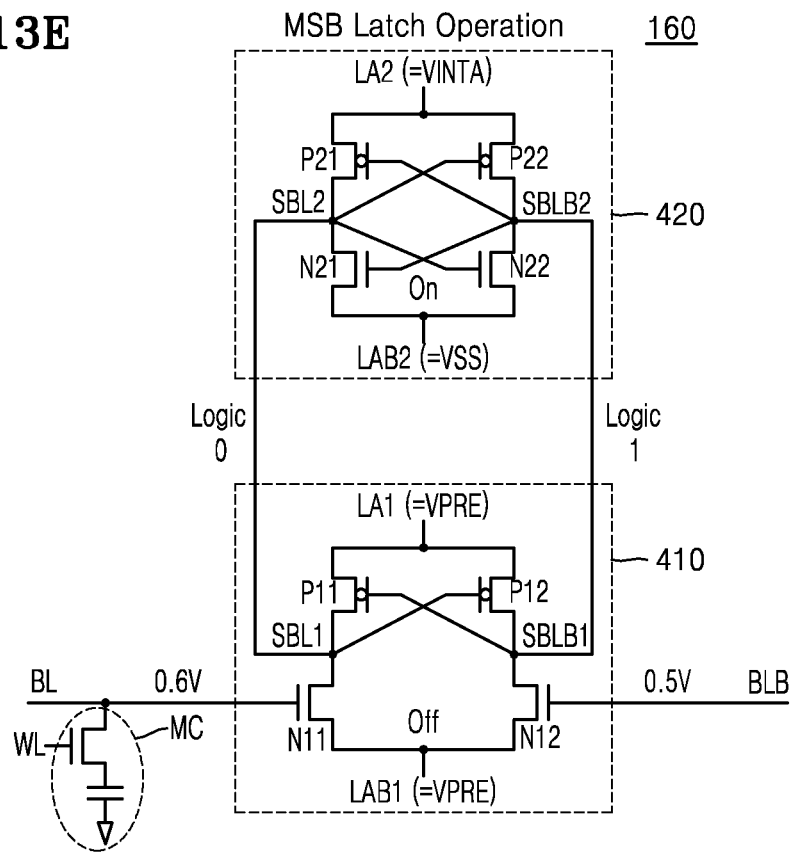

Referring to FIG. 13E, in a section T4 to T5 of FIG. 14, when the second sense amplification circuit 420 is turned on, the fifth and sixth switches SW5 and SW6 are turned on, the first sense amplification circuit 410 is in an off state, and the first through fourth switches SW1 through SW4 and the seventh and eighth switches SW7 and SW8 are turned off, the sense amplifier 160 performs an MSB latching operation. And, using the second sense amplification circuit 420, the second sensing bit line SBL2 and the first sensing bit line SBL1 are reduced up to the ground voltage VSS, and the second complementary sensing bit line SBLB2 and the first complementary sensing bit line SBLB1 are raised up to the power voltage VINTA. The power voltage VINTA of the second complementary sensing bit line SBLB2 is latched to logic 1 as MSB data of the memory cell MC.

Figure 13F:
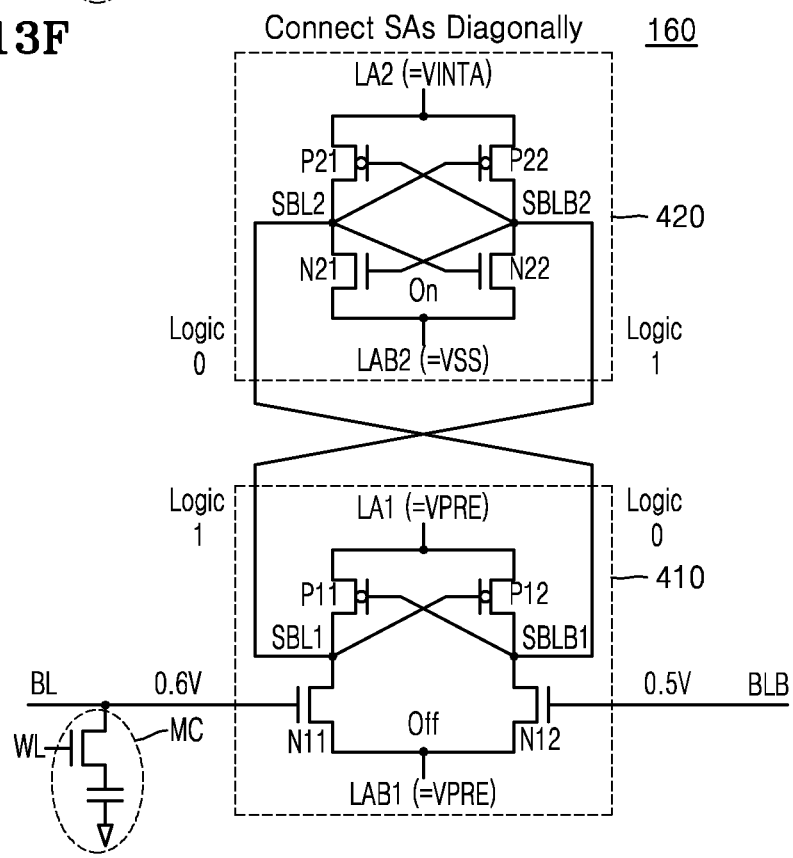

Referring now to FIG. 13F, in a section from T5 to T6 of FIG. 14, when the second sense amplification circuit 420 is turned on, the seventh and eighth switches SW7 and SW8 are turned on, the first sense amplification circuit 410 is in an off state, and the first through sixth switches SW1 through SW6 are turned off, the sense amplifier 160 performs a symmetrical connection operation of symmetrically connecting the first and second sense amplification circuits 410 and 420. The bit lines of the first sensing bit line pair (SBL1, SBLB1) and the bit lines of the second sensing bit line pair (SBL2, SBLB2) are respectively symmetrically connected. Via the second sense amplification circuit 420, the second sensing bit line SBL2 and the first complementary sensing bit line SBLB1 are reduced up to the ground voltage VSS, and the second complementary sensing bit line SBLB2 and the first sensing bit line SBL1 are raised up to the power voltage VINTA.

Figure 13G:
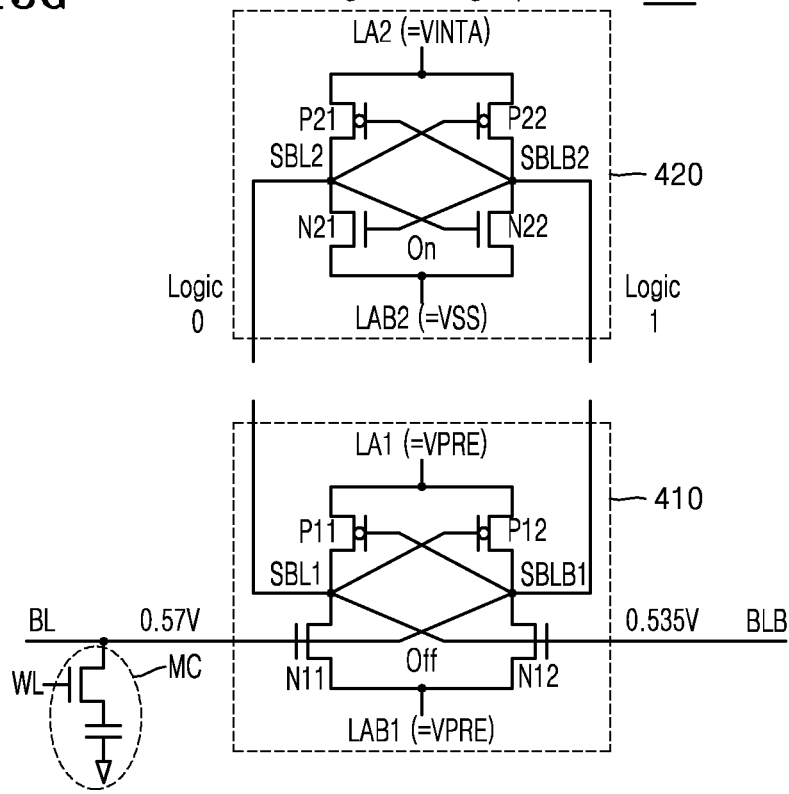

Referring to FIG. 13G, in a section from T6 to T7 of FIG. 14, when the second sense amplification circuit 420 is turned on, the third and fourth switches SW3 and SW4 are turned on, the first sense amplification circuit 410 is in an off state, and the first and second switches SW1 and SW2 and the fifth through eighth switches SW5 through SW8 are turned off, the sense amplifier 160 performs a second charge sharing operation. According to the second charge sharing operation, voltage levels of the bit line BL and the first complementary sensing bit line SBLB1 are captured at about 0.57 V, and voltage levels of the complementary bit line BLB and the first sensing bit line SBL1 are captured at about 0.535 V.

Figure 13H:
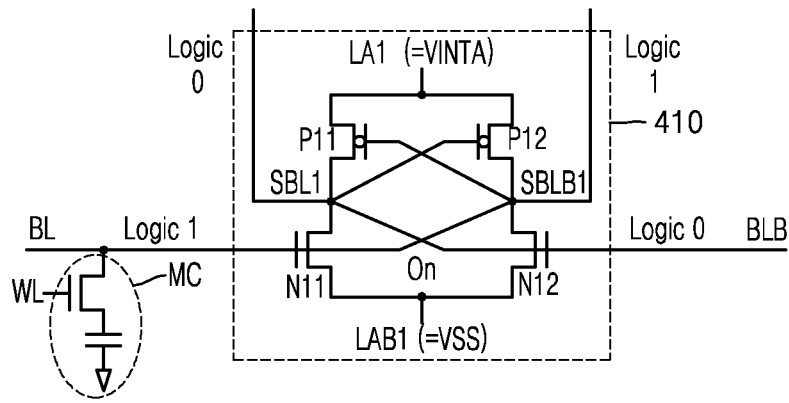

Referring to FIG. 13H, in a section from T7 to T8 of FIG. 14, when the first and second sense amplification circuits 410 and 420 are turned on, the third and fourth switches SW3 and SW4 are turned on, and the first and second switches SW1 and SW2 and the fifth through eighth switches SW5 through SW8 are turned off, the sense amplifier 160 performs an LSB sensing operation. Via the first sense amplification circuit 410, the first sensing bit line SBL1 and the complementary bit line BLB are reduced up to the ground voltage VSS, and the first complementary sensing bit line SBLB1 and the bit line BL are raised up to the power voltage VINTA. A level of the ground voltage VSS of the first complementary sensing bit line SBLB1 is sensed as logic 1 as LSB data of the memory cell MC, and the LSB data of logic 1 is stored in the bit line BL.

Figure 13I:
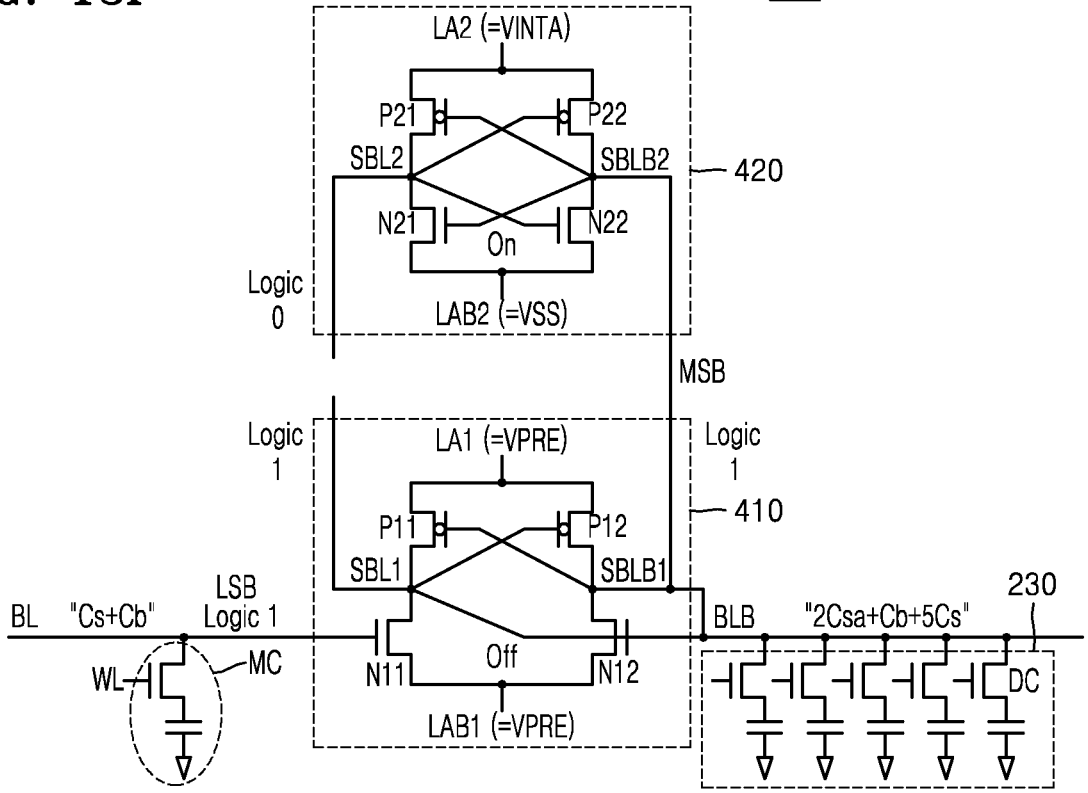

Referring to FIG. 13I, in a section between T8 and T9 of FIG. 14, when the dummy cells DCs of the dummy cell block 230 are connected to the complementary bit line BLB, the second sense amplification circuit 420 is turned on, the second, fourth, and sixth switches SW2, SW4, and SW6 are turned on, the first sense amplification circuit 410 is in an off state, and the first, third, fifth, seventh, and eighth switches SW1, SW3, SW5, SW7, and SW8 are turned off, the sense amplifier 160 performs dummy cell enable and MSB write operations. Via the second sense amplification circuit 420, MSB data of logic 1 latched in the second complementary sensing bit line SBLB2 is stored in the complementary bit line BLB as data of a level of the power voltage VINTA according to capacitance of the complementary bit line BLB.

Figure 13J:
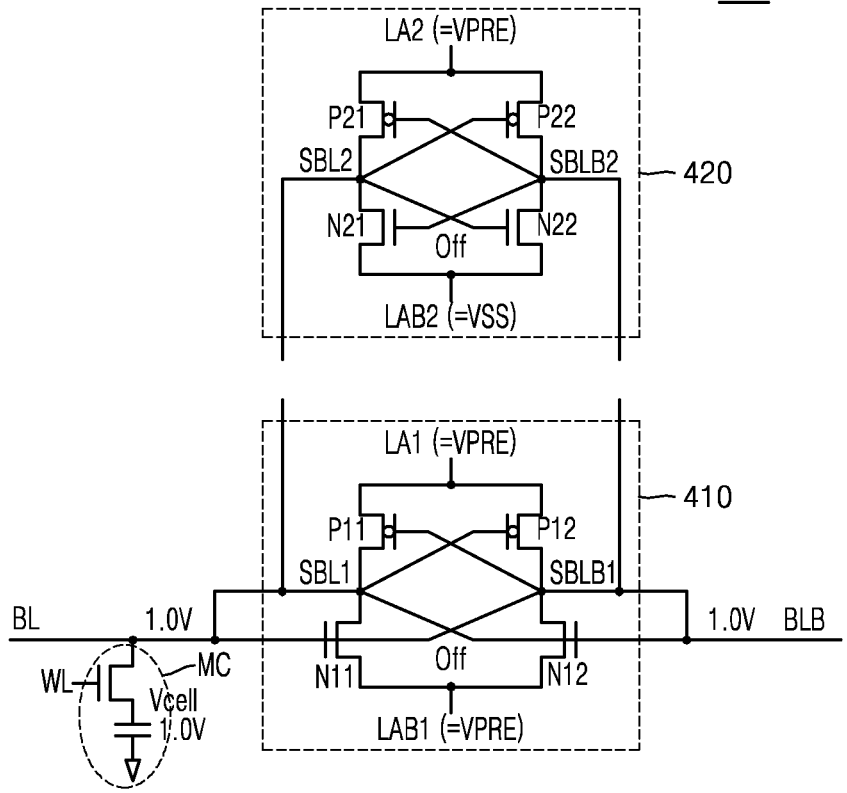

Referring to FIG. 13J, in a section from T9 to T10 of FIG. 14, when the first through fourth switches SW1 through SW4 are turned on, and the first and second sense amplification circuits 410 and 420 are in an off state, and the fifth through eighth switches SW5 through SW8 are turned off, the sense amplifier 160 performs a third charge sharing operation. A third charge sharing operation is generated between a charge stored in the bit line BL storing LSB data of a level of the power voltage VINTA and a charge stored in the first complementary sensing bit line SBLB1, the complementary bit line BLB, and the first sensing bit line SBL1 storing MSB data of a level of the power voltage VINTA. According to the third charge sharing operation, the bit line BL is maintained at the level of the power voltage VINTA, that is, at 1.0 V, and a voltage of the bit line BL of 1.0 V is restored to the memory cell MC as a cell voltage Vcell.

The sense amplifier 160 described above senses the cell voltage Vcell of 1.0 V stored in the memory cell MC as MSB and LSB bits "11", and restores the voltage of the bit line BL of 1.0 V corresponding to the sensed MSB and LSB bits "11" to the memory cell MC as a cell voltage Vcell.

Figure 15:
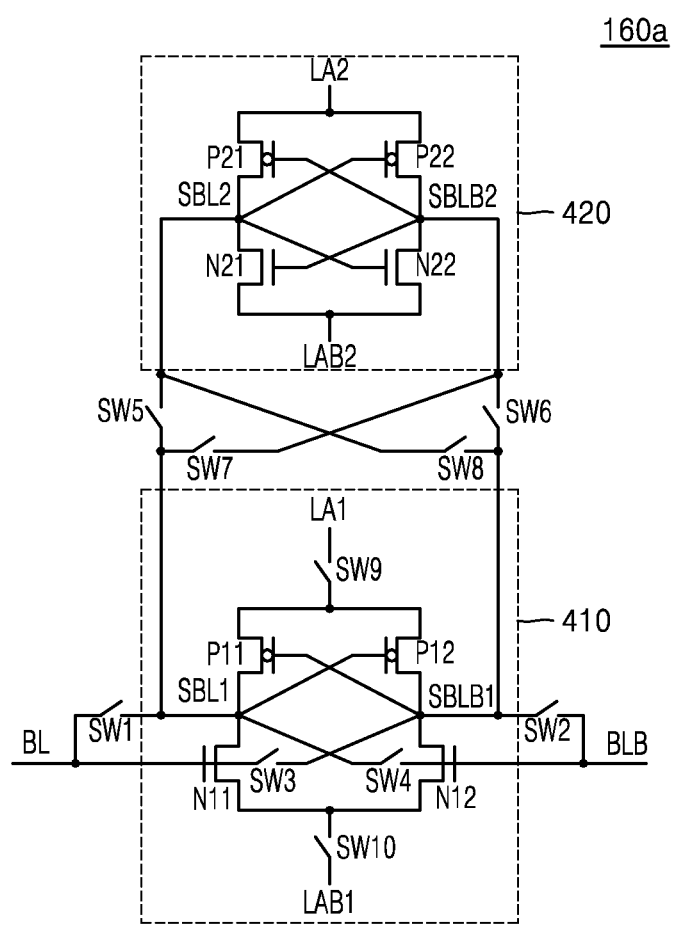
FIG. 15 is a circuit diagram illustrating a sense amplifier according to an embodiment of the inventive concept.

FIG. 15 is a circuit diagram illustrating a sense amplifier 160a according to an embodiment of the inventive concept. The sense amplifier 160a of FIG. 15 is different from the sense amplifier 160 illustrated in FIG. 4 except that the sense amplifier 160a further includes ninth and tenth switches SW9 and SW10, and other elements are similar. Hereinafter, description will focus on differences from FIG. 4.

Referring to FIG. 15, the sense amplifier 160a includes the ninth and tenth switches SW9 and SW10 in the first sense amplification circuit 410. The ninth switch SW9 is connected between the first sensing driving signal LA1 and connection nodes of the first and second PMOS transistors P11 and P12, and the tenth switch SW10 is connected between the second sensing driving signal LAB1 and connection nodes of the first and second NMOS transistors N11 and N12.

The ninth and tenth switches SW9 and SW10 may selectively block connection between the first sense amplification circuit 410 and the first and second sensing driving signals LA1 and LAB1. For example, when the first and second sense amplification circuits 410 and 420 are symmetrically connected, the ninth and tenth switches SW9 and SW10 may be turned off to block a leakage current path that disturbs operation of the second sense amplification circuit 420 in an on state.

Figure 16:
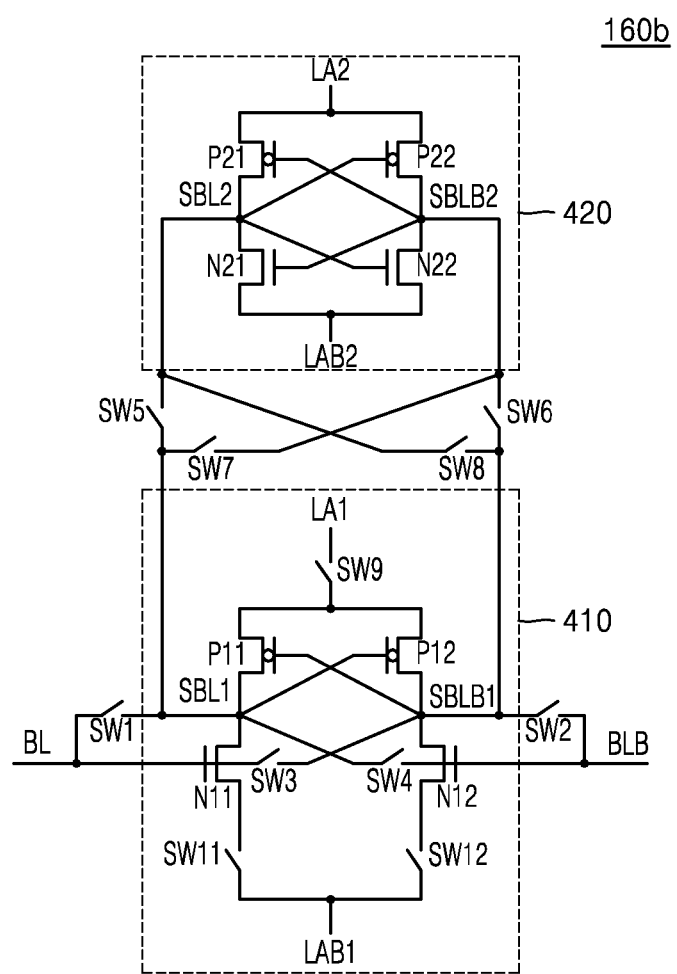
FIG. 16 is a circuit diagram illustrating a sense amplifier according to an embodiment of the inventive concept.

FIG. 16 is a circuit diagram illustrating a sense amplifier 160b according to an embodiment of the inventive concept. Compared to the sense amplifier 160 illustrated in FIG. 4, the sense amplifier 160b of FIG. 16 is different in that the sense amplifier 160b further includes ninth, eleventh, and twelfth switches SW9, SW11, and SW12, and other elements are similar. Hereinafter, description will focus on differences from FIG. 4.

Referring to FIG. 16, the sense amplifier 160b includes the ninth, eleventh, and twelfth switches SW9, SW11, and SW12 in the first sense amplification circuit 410. The ninth switch SW9 is connected between the first sensing driving signal LA1 and connection nodes of the first and second PMOS transistors P11 and P12; the eleventh switch SW11 is connected between the second sensing driving signal LAB1 and the first NMOS transistor N11; and the twelfth switch SW12 is connected between the second sensing driving signal LAB1 and the second NMOS transistor N12.

The ninth, eleventh, and twelfth switches SW9, SW11, and SW12 may selectively block connection between the first sense amplification circuit 410 and the first and second sensing driving signals LA1 and LAB1. For example, when the first and second sense amplification circuits 410 and 420 are symmetrically connected, the ninth, eleventh, and twelfth switches SW9, SW11, and SW12 may be turned off to block a leakage current path that disturbs operation of the second sense amplification circuit 420 in an on state.

Figure 17:
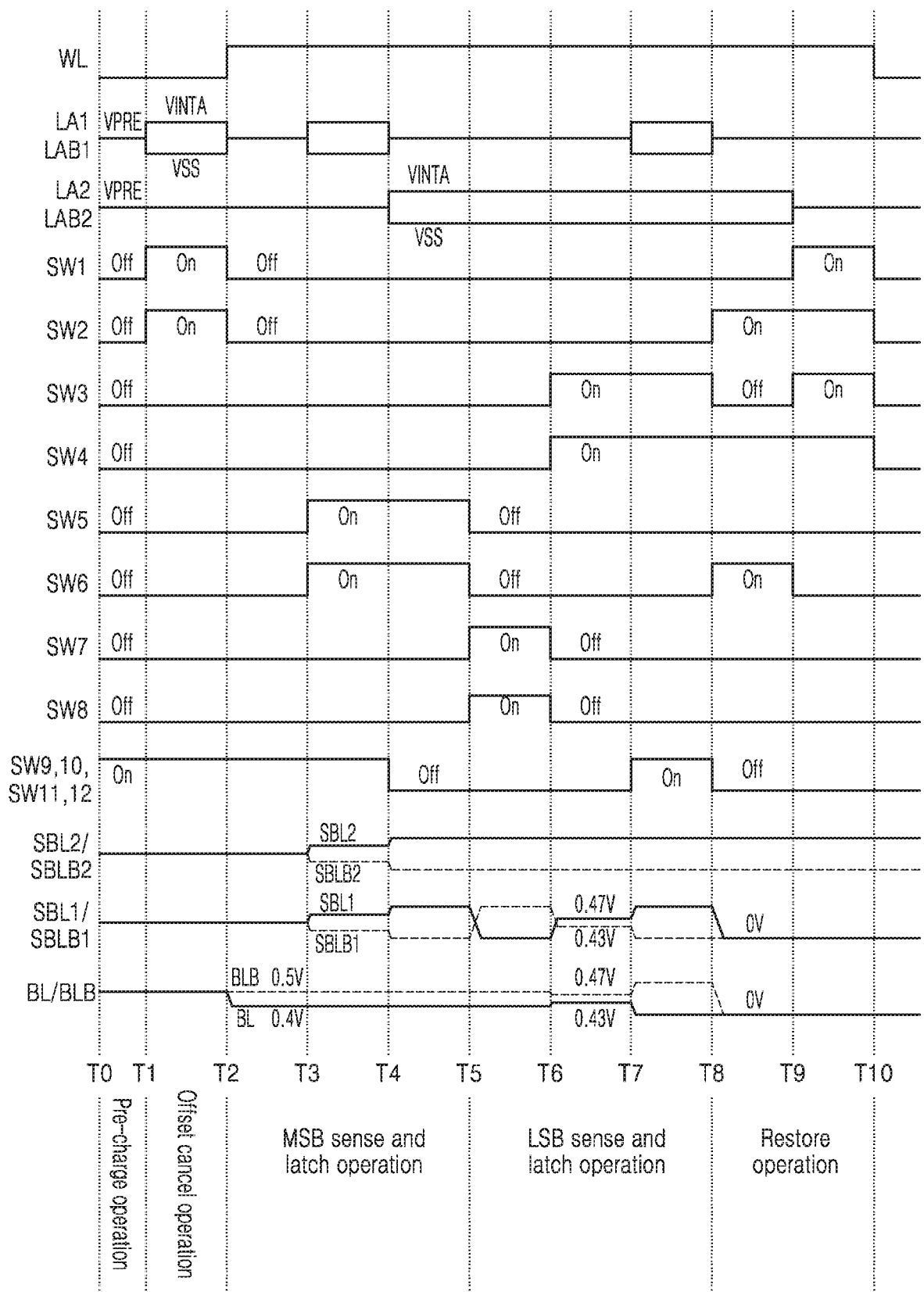
FIG. 17 is a timing diagram illustrating an operation of the sense amplifiers illustrated in FIGS. 15 and 16.

FIG. 17 is a timing diagram illustrating an operation of the sense amplifiers 160a and 160b illustrated in FIGS. 15 and 16. The timing diagram of FIG. 17 is different from that of FIG. 8 in that turned-on or turned-off states of the ninth through twelfth switches SW9 through SW12 are added, and other elements are similar. Hereinafter, description will focus on differences from FIG. 8.

In a section from T4 to T7, the ninth through twelfth switches SW9 through SW12 of the sense amplifiers 160a and 160b are turned off. In other sections, the ninth through twelfth switches SW9 through SW12 are turned on.

In the section from T4 to T7, the sense amplifiers 160a and 160b may perform an MSB latching operation, a symmetrical connection operation of symmetrically connecting the first and second sense amplification circuits 410 and 420, and a second charge sharing operation. Here, the first sense amplification circuit 410 is in an off state, and the second sense amplification circuit 420 is in an on state. That is, the MSB latching operation, the symmetrical connection operation, and the second charge sharing operation are performed completely based an operation of the second sense amplification circuit 420. In particular, an operation of the second sense amplification circuit 420 is dominant in the symmetrical connection operation. Accordingly, before and after the symmetrical connection operation, elements that hinder the operation of the second sense amplification circuit 420 need to be removed. For example, a leakage current path of the second sense amplification circuit 420 is to be blocked. The first sense amplification circuit 410 connected to the second sense amplification circuit 420 may create a leakage current path.

In the section between T4 to T7, the sense amplifier 160*a* of FIG. 15 may block a leakage current path that disturbs operation of the second sense amplification circuit 420 in an on state by turning off the ninth and tenth switches SW9 and SW10 and blocking connection between the first sense amplification circuit 410 and the first and second sensing driving signals LA1 and LAB1. In addition, in the section between T4 and T7, the sense amplifier 160*b* of FIG. 16 may block a leakage current path that disturbs operation of the second sense amplification circuit 420 in an on state by turning off the ninth, eleventh, and twelfth switches SW9, SW11, and SW12 and blocking connection between the first sense amplification circuit 410 and the first and second sensing driving signals LA1 and LAB1.

Figure 18A:
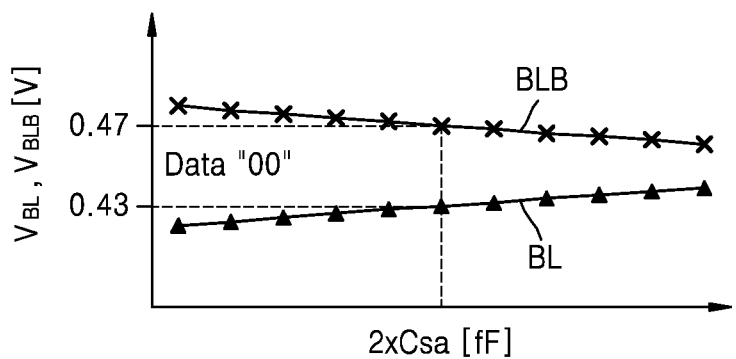
FIGS. 18A through 18D illustrate a voltage level of a bit line pair in an operation of a sense amplifier according to embodiments of the inventive concept.
Figure 18B:
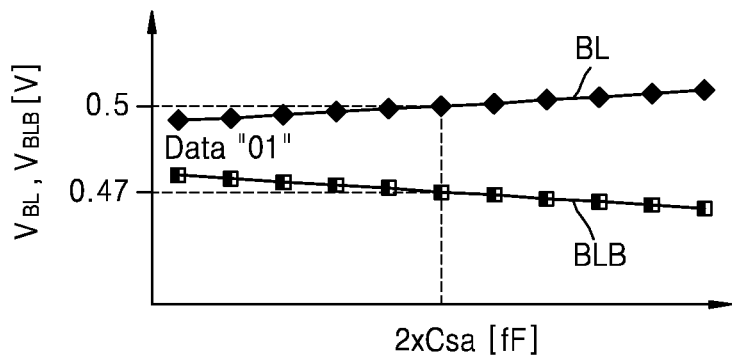
Figure 18C:
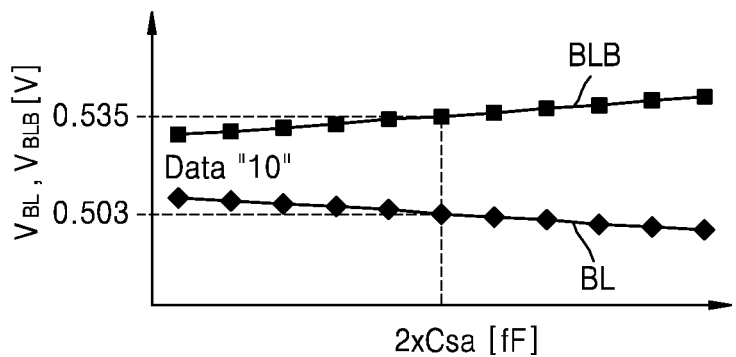
Figure 18D:
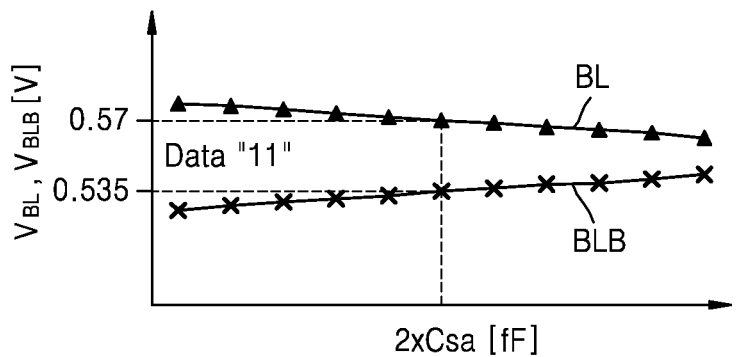

FIGS. 18 through 18D illustrate a voltage level of a bit line pair (BL, BLB) in an operation of the sense amplifier 160 according to the embodiments of the inventive concept. FIGS. 18A through 18D illustrate levels of bit line voltages VBL and VBLB of the bit line pair (BL, BLB) when the sense amplifier 160 senses a least significant bit (LSB) of a 2-bit combination representing a cell voltage Vcell stored in the memory cell MC.

FIG. 18A illustrates a voltage of the bit line BL and a voltage of the complementary bit line BLB according to double the bit line capacitance (2×Csa) of each bit line of the first sensing bit line pair (SBL1, SBLB1) of the sense amplifier 160 in an LSB sensing operation of sensing a bit combination "00" corresponding to a cell voltage Vcell of 0 V. FIG. 18B illustrates an LSB sensing operation of sensing a bit combination "01" corresponding to a cell voltage Vcell of 0.33 V, and FIG. 18C illustrates an LSB sensing operation of sensing a bit combination "10" corresponding to a cell voltage Vcell of 0.66 V, and FIG. 18D illustrates an LSB sensing operation of sensing a bit combination "11" corresponding to a cell voltage Vcell of 1.0 V.

The sense amplifier 160 may sense LSB data by using a voltage difference between the bit line voltages VBL and VBLB of the bit line pair (BL, BLB) illustrated in FIGS. 18A through 18D. For optimal sensing of LSB data of each of the bit combinations "00", "01", "10", and "11", a voltage difference between the bit line BL and the complementary bit line BLB is to be uniform. Double the bit line capacitance (2×Csa) of each bit line of the first sensing bit line pair (SBL1, SBLB1) of the sense amplifier 160 may be designed to have predetermined capacitance. For example, double the bit line capacitance (2×Csa) may be designed to be about 5 fF.

Figure 19:
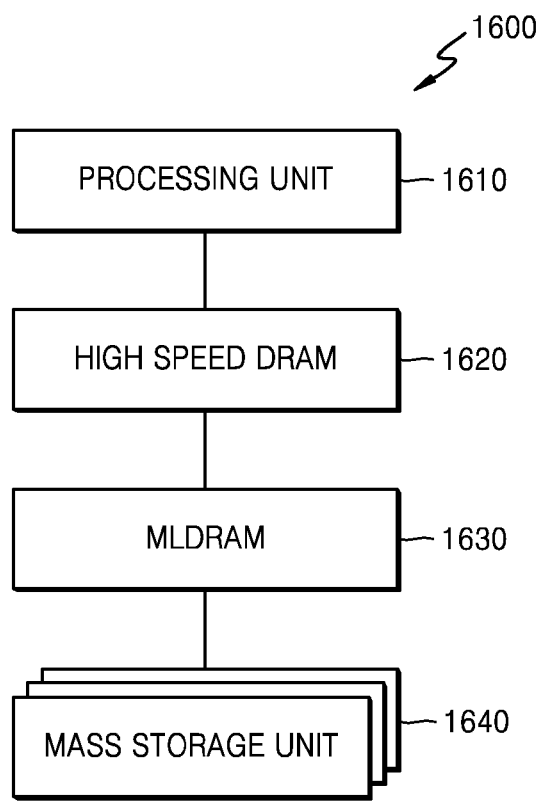
FIG. 19 is a block diagram illustrating an example of a system to which a memory device including a sense amplifier according to embodiments of the inventive concept is applied.

FIG. 19 is a block diagram of an example of a system 1600 to which a memory device including a sense amplifier according to embodiments of the inventive concept is applied. Referring to FIG. 19, the system 1600 may include a processing unit 1610, a high-speed DRAM 1620, a multi-level DRAM 1630, and a mass storage unit 1640. The system 1600 may be a general-use or special-purpose computer system such as a mobile device, a personal computer, a server computer, and a programmable household appliance, or a mainframe computer.

A functional unit described with reference to the present embodiment may be classified as a module in respect of implementation independence. For example, a module may be implemented by using a hardware circuit including a ready-made semiconductor such as a custom VLSI circuit or a gate array, a logic chip, a transistor, or other discrete components. A module may be implemented by using a programmable hardware device such as a programmable gate array, a programmable gate logic, or a programmable gate device. In addition, one or more modules may be implemented by software consisting of executable codes, objects, procedures, or functions.

The processing unit 1610 may execute an operating system and a plurality of software systems and conduct particular computation or tasks. The processing unit 1610 may be a microprocessor or a central processing unit (CPU).

The high-speed DRAM 1620 is an operation memory or a cache memory of the system 1600 and may store data for a short period or temporarily. For example, the high-speed DRAM 1620 may be applied to a memory device such as a synchronous DRAM (SDRAM), a double data rate SDRAM (DDR SDRAM), a low power double data rate SDRAM (LPDDR SDRAM), a graphics double data rate SDRAM (GDDR SDRAM), a DDR2 SDRAM, a DDR3 SDRAM, or a DDR4 SDRAM.

The multi-level DRAM 1630 may be used to function as a cache of the mass storage unit 1640. The multi-level DRAM 1630 may be identical or similar to the memory device 100 described hereinabove with respect to FIG. 1. The multi-level DRAM 1630 includes a memory cell storing a cell voltage represented as multi-bit data in a 2-bit combination, and a sense amplifier connected between a bit line, to which the memory cell is connected, and a complementary bit line, wherein the sense amplifier senses a cell voltage as MSB and LSB data in a 2-bit combination. The sense amplifier may sense a least significant bit (LSB) in a 2-bit combination and latch the LSB data in a first sensing bit line pair, and may sense a most significant bit (MSB) in a 2-bit combination and latch the MSB data in a second sensing bit line pair, and rewrite a bit line voltage generated according to the sensed MSB and LSB data to a memory cell as a cell voltage.

The mass storage unit 1640 may be implemented as a solid state drive (SDD), a peripheral component interconnect express (PCIe) memory module, a non-volatile memory express (NVMe) or the like. Optionally, one more tiers of the mass storage unit 1640 may be implemented as one or more network-accessible devices and/or services such as various NVMe-over Fabrics (NVMe-of)-accessed and/or Remote Direct Memory Access (RDMA)-accessed clients, various servers, server farm(s), server cluster(s), application server (s), or message server(s). The mass storage unit 1640 refers to a storage medium used by the system 1600 to store user data for a long term. The mass storage unit 1640 may store application program, program data or the like.

While the inventive concept has been particularly shown and described with reference to embodiments thereof, it will be understood that various changes in form and details may be made therein without departing from the spirit and scope of the following claims.

What is claimed is:

1. A sense amplifier, comprising:
   a first sense amplification circuit electrically connected between a bit line, to which a memory cell is also connected, and a complementary bit line, said first sense amplification circuit configured to sense a least significant bit (LSB) of 2-bit data in the memory cell and latch the LSB of the 2-bit data in a first sensing bit line pair;

a second sense amplification circuit configured to sense a most significant bit (MSB) of the 2-bit data and latch the MSB of the 2-bit data in a second sensing bit line pair; and a switching circuit configured to selectively connect between bit lines of the first sensing bit line pair and bit lines of the second sensing bit line pair.

2. The sense amplifier of claim 1, wherein the sense amplifier performs a first charge sharing operation between a charge stored in the memory cell and a charge stored in the bit line when the MSB of the 2-bit data is sensed by said second sense amplification circuit.

3. The sense amplifier of claim 2, wherein the sense amplifier performs a second charge sharing operation when sensing the LSB of the 2-bit data; wherein the second charge sharing operation comprises charge sharing between a charge stored in the bit line and a charge stored in a first complementary sensing bit line and charge sharing between a charge stored in the complementary bit line and a charge stored in a first sensing bit line.

4. The sense amplifier of claim 3, wherein responsive to the first charge sharing operation a voltage level of the bit line having an MSB voltage level corresponding to the MSB of the 2-bit data has a predefined voltage difference with respect to a voltage level of the complementary bit line; and wherein responsive to the second charge sharing operation a voltage level of the bit line having an LSB voltage level corresponding to the LSB of the 2-bit data has a predefined voltage difference with respect to a voltage level of the complementary bit line.

5. The sense amplifier of claim 1, wherein the sense amplifier performs a restoring operation of rewriting a cell voltage corresponding to the sensed MSB of the 2-bit data and LSB of the 2-bit data to the memory cell.

6. The sense amplifier of claim 5, wherein when the sense amplifier performs the restoring operation, dummy cells of a dummy cell block are connected to the complementary bit line to thereby increase an effective capacitance of the complementary bit line.

7. The sense amplifier of claim 6, wherein the sense amplifier performs a third charge sharing operation when performing the restoring operation; wherein the third charge sharing operation occurs between a charge stored in the bit line, a charge stored in a first sensing bit line, a charge stored in the complementary bit line, and a charge stored in a first complementary sensing bit line; and wherein a voltage level of the bit line according to the third charge sharing operation is stored again in the memory cell as the cell voltage.

8. The sense amplifier of claim 2, wherein the switching circuit comprises:

a first switch switching between the bit line and a first sensing bit line;

a second switch switching between the complementary bit line and a first complementary sensing bit line;

a third switch switching between the bit line and the first complementary sensing bit line;

a fourth switch switching between the complementary bit line and the first complementary sensing bit line;

a fifth switch switching between the first sensing bit line and a second sensing bit line;

a sixth switch switching between the first complementary sensing bit line and the second complementary sensing bit line;

a seventh switch switching between the first sensing bit line and the second complementary sensing bit line; and an eighth switch switching between the first complementary sensing bit line and the second sensing bit line.

9. The sense amplifier of claim 8, wherein the first sense amplification circuit comprises:

a first PMOS transistor connected between a line of a first sensing driving signal and the first sensing bit line, the first PMOS transistor having a gate connected to the first complementary sensing bit line;

a second PMOS transistor connected between the line of the first sensing driving signal and the first complementary sensing bit line, the second PMOS transistor having a gate connected to the first sensing bit line;

a first NMOS transistor connected between a line of a second sensing driving signal and the first sensing bit line, the first NMOS transistor having a gate connected to the bit line; and a second NMOS transistor connected between the line of the second sensing driving signal and the first complementary sensing bit line, the second NMOS transistor having a gate connected to the complementary bit line, wherein the first sense amplification circuit is turned on when a power voltage is applied to the first sensing driving signal and a ground voltage is applied to the second sensing driving signal, and the first sense amplification circuit is turned off when a precharge voltage corresponding to a half of a level of the power voltage is applied to the first and second sensing driving signals.

10. The sense amplifier of claim 9, wherein the second sense amplification circuit comprises:

a third PMOS transistor connected between a line of a third sensing driving signal and the second sensing bit line, the third PMOS transistor having a gate connected to the second complementary sensing bit line;

a fourth PMOS transistor connected between the line of the third sensing driving signal and the second complementary sensing bit line, the fourth PMOS transistor having a gate connected to the second sensing bit line;

a third NMOS transistor connected between a line of a fourth sensing driving signal and the second sensing bit line, the third NMOS transistor having a gate connected to the second complementary sensing bit line;

a fourth NMOS transistor connected between the line of the fourth sensing driving signal and the second complementary sensing bit line, the fourth NMOS transistor having a gate connected to the second sensing bit line, wherein the second sense amplification circuit is turned on when the power voltage is applied to the third sensing driving signal and the ground voltage is applied to the fourth sensing driving signal, and the second sense amplification circuit is turned off when the precharge voltage is applied to the third and fourth sensing driving signals.

11. The sense amplifier of claim 10, wherein the sense amplifier respectively symmetrically connects the bit lines of the first sensing bit line pair and the bit lines of the second sensing bit line pair when the second sense amplification circuit is turned on, the seventh and eighth switches are turned on, the first sense amplification circuit is in an off state, and the first through sixth switches are turned off.

12. The sense amplifier of claim 11, wherein the switching circuit further comprises:
- a ninth switch switching between the first sensing driving signal and connection nodes of the first and second PMOS transistors; and
- a tenth switch switching the second sensing driving signal and connection nodes of the first and second NMOS transistors,
- wherein when the bit lines of the first sensing bit line pair and the bit lines of the second sensing bit line pair are respectively symmetrically connected to each other, the ninth and tenth switches are turned off.

13. The sense amplifier of claim 11, wherein the switching circuit further comprises:
- a ninth switch switching between the first sensing driving signal and connection nodes of the first and second PMOS transistors;
- a tenth switch switching between the second sensing driving signal and a first end of the first NMOS transistor; and
- an eleventh switch switching between the second sensing driving signal and a first end of the second NMOS transistor,
- wherein when the bit lines of the first sensing bit line pair and the bit lines of the second sensing bit line pair are respectively symmetrically connected to each other, the ninth through eleventh switches are turned off.

14. A method of sensing multi-bit memory cell data, comprising:
- sensing a most significant bit (MSB) of 2-bit data and latching the MSB of the 2-bit data into a first sensing bit line pair, using a first charge sharing operation occurring between a charge stored in a memory cell and charge stored on a bit line; and
- sensing a least significant bit (LSB) of the 2-bit data and latching the LSB of the 2-bit data into a second sensing bit line pair, using a second charge sharing operation, which comprises sharing charge between a charge stored in the bit line and a charge stored in the first complementary sensing bit line, and sharing charge between a charge stored in a complementary bit line and a charge stored in a first sensing bit line.

15. The method of claim 14, wherein a voltage of the bit line is increased or reduced by an offset between the bit line and the complementary bit line.

16. The method of claim 14, wherein a voltage level of the bit line having an MSB voltage level corresponding to the MSB of the 2-bit data is generated by a predefined voltage difference with respect to a voltage level of the complementary bit line.

17. The method of claim 14, wherein a voltage level of the bit line having an LSB voltage level corresponding to the LSB of the 2-bit data is generated by a predefined voltage difference with respect to a voltage level of the complementary bit line.

18. A memory device comprising:
- a memory cell storing a cell voltage represented as multi-bit data in a 2-bit combination; and
- a sense amplifier connected between a bit line, to which the memory cell is connected, and a complementary bit line, and configured to sense the cell voltage as most significant bit (MSB) data and least significant bit (LSB) data in the 2-bit combination,
- wherein the sense amplifier comprises:
- a first sense amplification circuit configured to sense the LSB data to latch the LSB data in a first sensing bit line pair;
- a second sense amplification circuit configured to sense MSB data in the 2-bit combination to latch the MSB data in a second sensing bit line pair; and
- a switching circuit configured to selectively connect between bit lines of the first sensing bit line pair and between bit lines of the second sensing bit line pair.

19. The memory device of claim 18, wherein the sense amplifier is further configured to rewrite a voltage level of the bit line generated due to the sensed MSB and LSB data to the memory cell as the cell voltage.

20. The memory device of claim 18, wherein the switching circuit is configured to further selectively connect between each bit line of the first sensing bit line pair and the bit line and the complementary bit line.

* * * * *